United States Patent
Bae et al.

(10) Patent No.: US 12,453,175 B2
(45) Date of Patent: *Oct. 21, 2025

(54) INTEGRATED CIRCUIT DEVICES AND METHODS OF MANUFACTURING THE SAME

(71) Applicant: Samsung Electronics Co., Ltd., Suwon-si (KR)

(72) Inventors: Deokhan Bae, Suwon-si (KR); Sungmin Kim, Hwaseong-si (KR); Juhun Park, Seoul (KR); Yuri Lee, Yongin-si (KR); Yoonyoung Jung, Suwon-si (KR); Sooyeon Hong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 691 days.

This patent is subject to a terminal disclaimer.

(21) Appl. No.: 17/851,155

(22) Filed: Jun. 28, 2022

(65) Prior Publication Data

US 2022/0328485 A1 Oct. 13, 2022

Related U.S. Application Data

(63) Continuation-in-part of application No. 17/700,590, filed on Mar. 22, 2022, now Pat. No. 11,646,316, which is a continuation of application No. 17/179,469, filed on Feb. 19, 2021, now Pat. No. 11,315,926.

(30) Foreign Application Priority Data

Jun. 9, 2020 (KR) .................. 10-2020-0069845

(51) Int. Cl.
H01L 27/092 (2006.01)
H01L 29/66 (2006.01)
(Continued)

(52) U.S. Cl.
CPC ....... *H10D 84/853* (2025.01); *H10D 30/6211* (2025.01); *H10D 64/021* (2025.01)

(58) Field of Classification Search
CPC .. H10D 30/024; H10D 30/62; H10D 30/6211; H10D 30/6212; H10D 30/6213;
(Continued)

(56) References Cited

U.S. PATENT DOCUMENTS 5,364,817 A 11/1994 Lur et al.
5,892,285 A 4/1999 Gonzalez et al.
(Continued)

FOREIGN PATENT DOCUMENTS

JP 2001291766 A 10/2001
JP 4231055 B2 2/2009
(Continued)

*Primary Examiner* — David C Spalla
(74) *Attorney, Agent, or Firm* — Wolf, Greenfield & Sacks, P.C.

(57) ABSTRACT

Integrated circuit devices may include a fin-type active region, a gate line extending on the fin-type active region, a source/drain region on the fin-type active region and adjacent to the gate line, an interlayer insulating film covering the source/drain region, a source/drain contact hole penetrating the interlayer insulating film toward the source/drain region, a metal plug in the source/drain contact hole, and a conductive barrier film covering a sidewall of the metal plug in the source/drain contact hole. The metal plug includes a lateral expansion portion and a through portion vertically extending from the lateral expansion portion toward the source/drain region. A width of the lateral expansion is greater than a width of the through portion, and a topmost surface of the conductive barrier film is closer than a topmost surface of the metal plug to the substrate.

23 Claims, 78 Drawing Sheets

(51) Int. Cl.
*H01L 29/78* (2006.01)
*H10D 30/62* (2025.01)
*H10D 64/01* (2025.01)
*H10D 84/85* (2025.01)

(58) Field of Classification Search
CPC .. H10D 64/015; H10D 64/018; H10D 64/021; H10D 84/0158; H10D 84/0193; H10D 84/834; H10D 84/853
See application file for complete search history.

(56) References Cited

U.S. PATENT DOCUMENTS

| | | | |
|---|---|---|---|
| 7,553,757 B2 | 6/2009 | Matsumori | |
| 8,575,022 B2 | 11/2013 | Chrisman et al. | |
| 8,729,703 B2 | 5/2014 | Yu et al. | |
| 10,157,963 B1 | 12/2018 | Lee et al. | |
| 10,361,120 B2 | 7/2019 | Wang et al. | |
| 10,366,955 B2 | 7/2019 | Kim et al. | |
| 10,580,693 B2 | 3/2020 | Chang et al. | |
| 10,923,475 B2 | 2/2021 | Shin et al. | |
| 11,315,926 B2 * | 4/2022 | Bae | H01L 21/76843 |
| 2018/0151560 A1 | 5/2018 | Hsu et al. | |
| 2019/0393318 A1 | 12/2019 | Chung et al. | |
| 2020/0020578 A1 * | 1/2020 | Chang | H01L 21/76895 |
| 2021/0358817 A1 | 11/2021 | Lin et al. | |

FOREIGN PATENT DOCUMENTS

| | | |
|---|---|---|
| KR | 20180087661 A | 8/2018 |
| KR | 20190064375 A | 6/2019 |
| KR | 20200006947 A | 1/2020 |
| KR | 20200026404 A | 3/2020 |

* cited by examiner

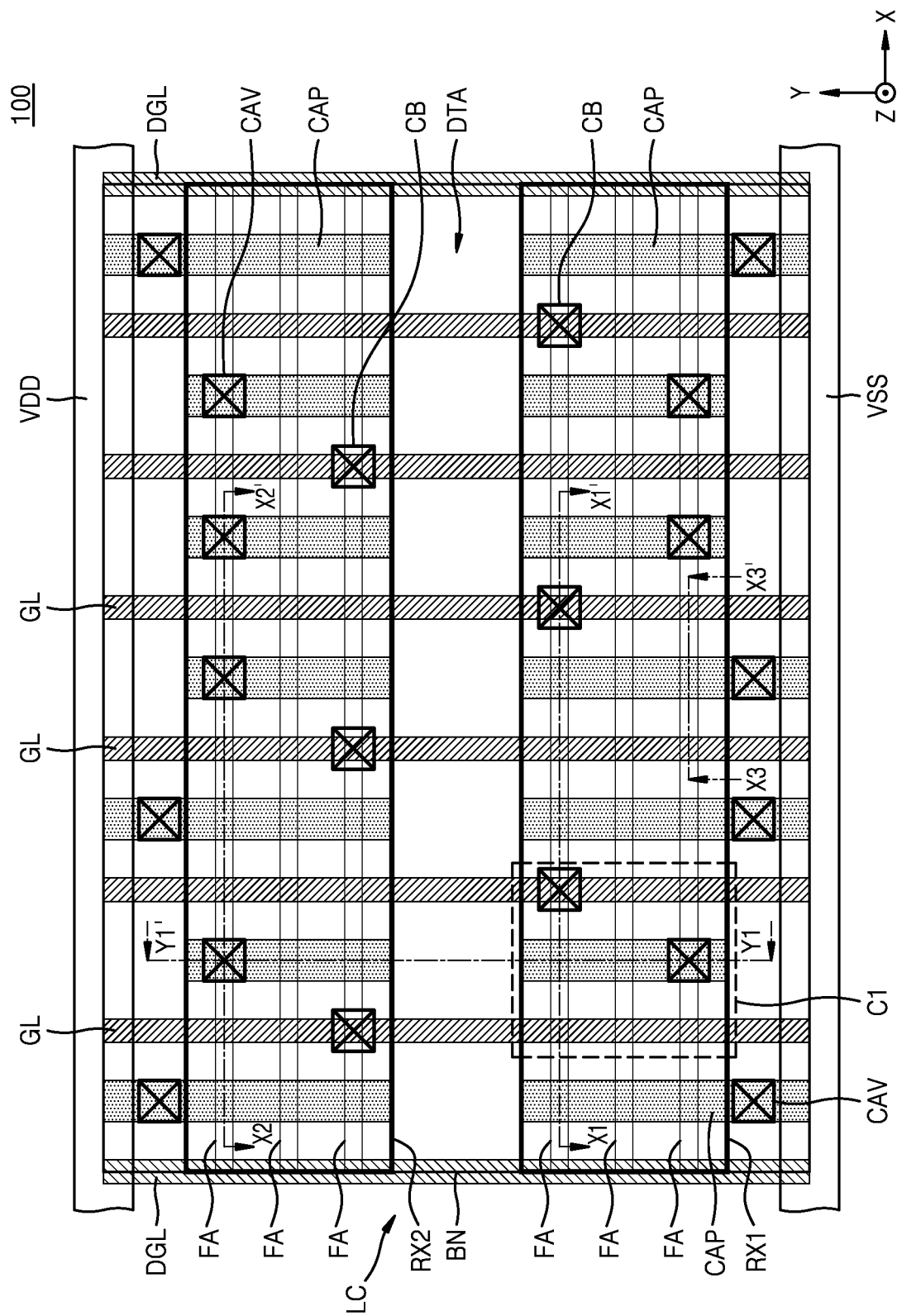

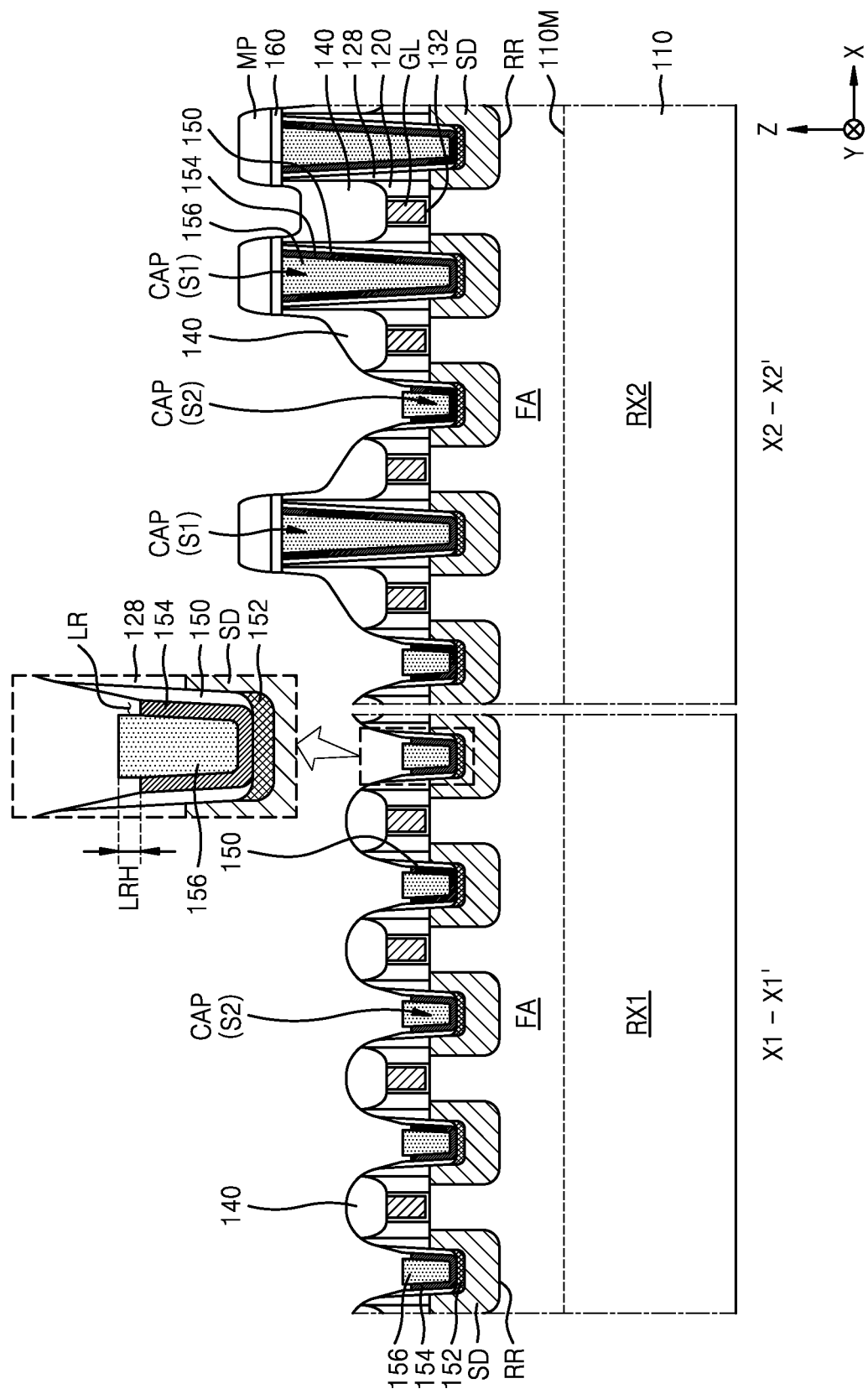

INTEGRATED CIRCUIT DEVICES AND METHODS OF MANUFACTURING THE SAME

CROSS-REFERENCE TO RELATED APPLICATION

This U.S. nonprovisional application is a continuation-in-part application of U.S. patent application Ser. No. 17/700,590, filed on Mar. 22, 2022 which is a continuation of U.S. patent application Ser. No. 17/179,469, filed on Feb. 19, 2021, which claims priority under 35 U.S.C. § 119 to Korean Patent Application No. 10-2020-0069845, filed on Jun. 9, 2020, in the Korean Intellectual Property Office, the disclosure of which is incorporated by reference herein in its entirety.

BACKGROUND

The present inventive concept relates to an integrated circuit device and a method of manufacturing the same, and more particularly, to an integrated circuit device including a fin field-effect transistor and a method of manufacturing the integrated circuit device.

With down-scaling of integrated circuit devices, the accuracy of the operations of integrated circuit devices as well as the fast operating speed thereof became an important consideration. Accordingly, techniques for reducing an area occupied by wirings and contacts, reliably securing a distance between wirings and contacts for electrical isolation, and increasing reliability have been developed.

SUMMARY

Embodiments of present inventive concept provide integrated circuit devices including a structure increasing the reliability of the integrated circuit devices having a device region reduced by down-scaling.

Embodiments of present inventive concept also provide methods of manufacturing an integrated circuit device including a structure increasing the reliability of the integrated circuit devices having a device region reduced by down-scaling.

According to some embodiments of the present inventive concept, provided are integrated circuit devices including a fin-type active region extending on a substrate in a first horizontal direction; a gate line extending on the fin-type active region in a second horizontal direction crossing the first horizontal direction; a source/drain region on the fin-type active region and adjacent to the gate line; an interlayer insulating film covering the source/drain region; a source/drain contact hole penetrating the interlayer insulating film toward the source/drain region; a metal plug in the source/drain contact hole and electrically connected to the source/drain region; and a conductive barrier film covering a sidewall of the metal plug in the source/drain contact hole, wherein the metal plug includes a lateral expansion portion in an upper portion of the source/drain contact hole and a through portion vertically extending from the lateral expansion portion toward the source/drain region, wherein a width of the lateral expansion portion in the first horizontal direction is greater than a width of the through portion in the first horizontal direction, and wherein a topmost surface of the conductive barrier film is closer than a topmost surface of the metal plug to the substrate.

According to some embodiments of the present inventive concept, provided are integrated circuit devices including a fin-type active region extending on a substrate in a first horizontal direction; a plurality of channel regions on the fin-type active region, the plurality of channel regions being spaced apart from each other in a vertical direction; a gate line extending on the fin-type active region in a second horizontal direction crossing the first horizontal direction; a gate insulating film between the gate line and the plurality of channel regions; a source/drain region on the fin-type active region and adjacent to the gate line, the source/drain region being in contact with the plurality of channel regions; an interlayer insulating film covering the source/drain region; a source/drain contact hole penetrating the interlayer insulating film toward the source/drain region; a metal plug vertically extending in the source/drain contact hole, the metal plug being electrically connected to the source/drain region and comprising a first topmost surface; and a conductive barrier film covering a sidewall of the metal plug in the source/drain contact hole, the conductive barrier film comprising a second topmost surface closer than the first topmost surface to the substrate.

According to some embodiments of the present inventive concept, provided are integrated circuit devices including a fin-type active region extending on a substrate in a first horizontal direction; a gate line extending on the fin-type active region in a second horizontal direction crossing the first horizontal direction; a source/drain region on the fin-type active region and adjacent to the gate line; an interlayer insulating film covering the source/drain region; and a source/drain contact pattern penetrating the interlayer insulating film and being electrically connected to the source/drain region, wherein the source/drain contact pattern includes: a metal plug vertically extending on the source/drain region and comprising a first topmost surface, the metal plug including a lateral expansion portion having a first width in the first horizontal direction and a through portion having a second width smaller than the first width in the first horizontal direction, the through portion integrally connected to the lateral expansion portion and vertically extending between the lateral expansion portion and the source/drain region; and a conductive barrier film extending on (e.g., surrounding) a sidewall of the metal plug and comprising a second topmost surface closer than the first topmost surface to the substrate.

BRIEF DESCRIPTION OF DRAWINGS

Example embodiments of the present inventive concept will be more clearly understood from the following detailed description taken in conjunction with the accompanying drawings in which:

FIG. 1 is a layout of an integrated circuit device according to some embodiments of the present inventive concept;

FIGS. 2C and 2D are enlarged cross-sectional views of a portion corresponding to region C1 in FIG. 1, wherein FIG. 2C is an enlarged cross-sectional view of region C2A in FIG. 2A, and FIG. 2D is an enlarged cross-sectional view of region C2B in FIG. 2B;

FIGS. 11A through 22B are cross-sectional views illustrating a method of manufacturing an integrated circuit device, according to some embodiments of the present inventive concept, wherein FIGS. 11A, 12A, 13A, 14A, 15A, 16A, 17A, 18A, 19A, 20A, 21A, and 22A show portions respectively corresponding to the cross-sections respectively taken along the lines X1-X1' and X2-X2' in FIG. 1, and FIGS. 11B, 12B, 13B, 14B, 15B, 16B, 17B, 18B, 19B, 20B, 21B, and 22B show a portion corresponding to the cross-section taken along the line Y1-Y1' in FIG. 1;

DETAILED DESCRIPTION

Figure 2A:
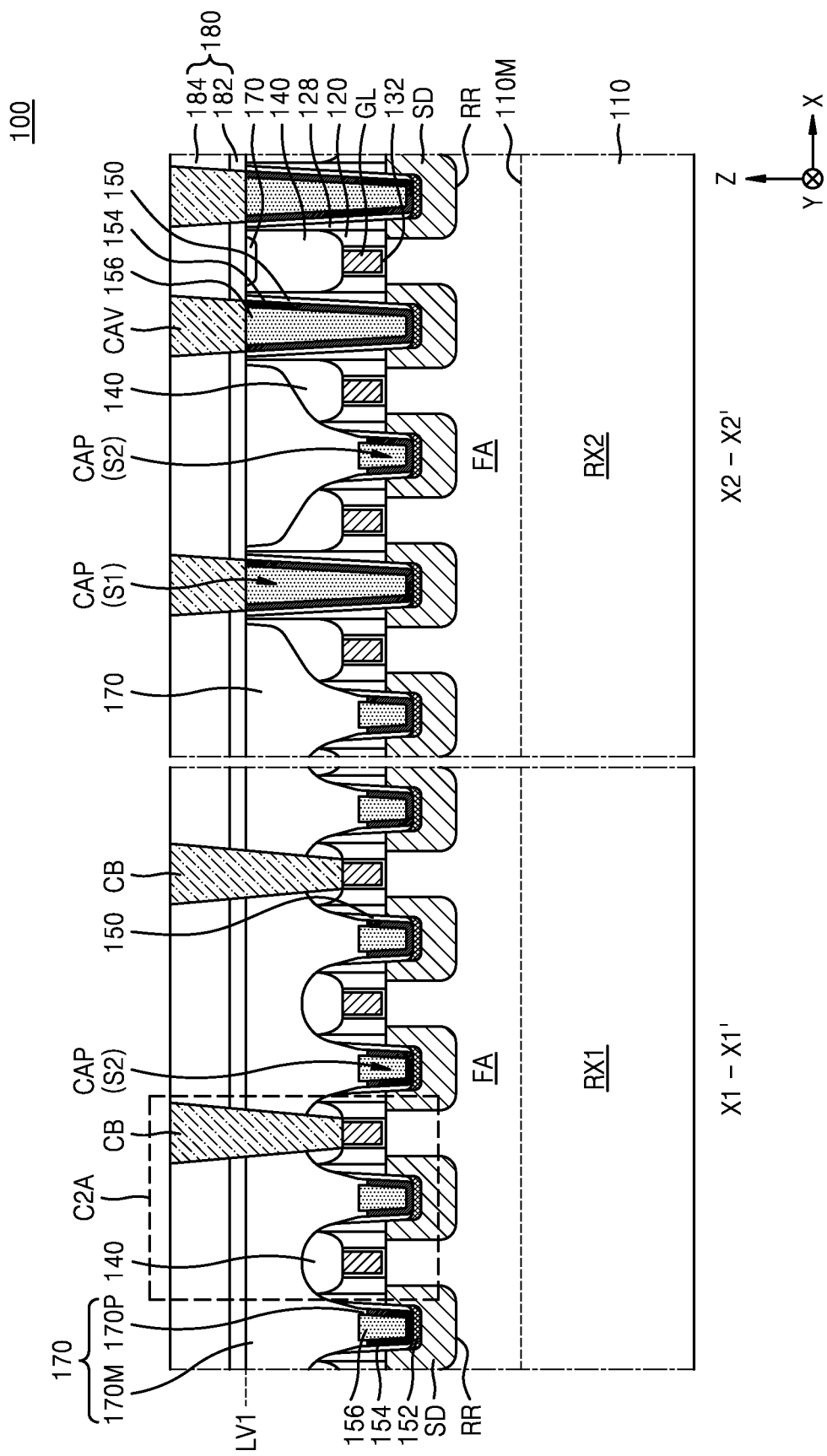
FIG. 2A shows cross-sectional views taken along lines X1-X1' and X2-X2' in FIG. 1.

Hereinafter, example embodiments of the present inventive concept will be described in detail with reference to the accompanying drawings. In the drawings, like reference numbers and characters refer to like elements, and redundant descriptions thereof may be omitted.

Figure 2B:
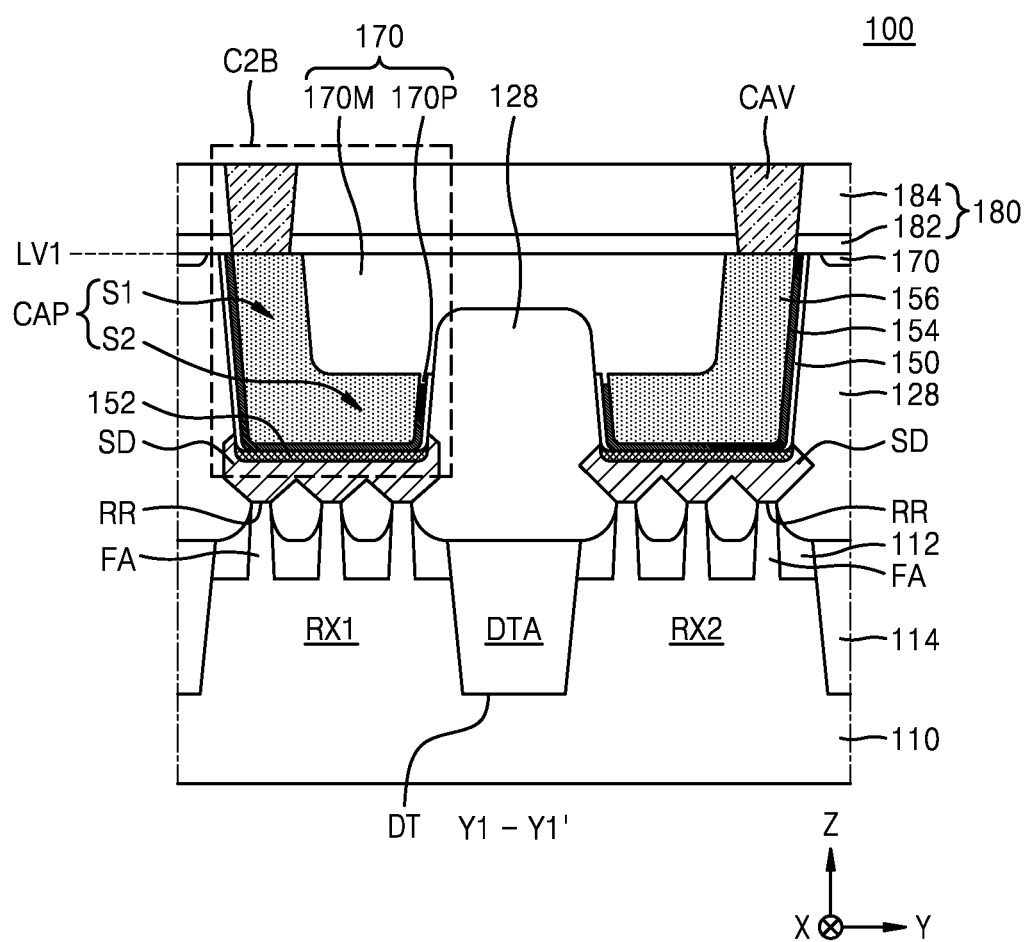
FIG. 2B is a cross-sectional view taken along line Y1-Y1' in FIG. 1.
Figure 2C:
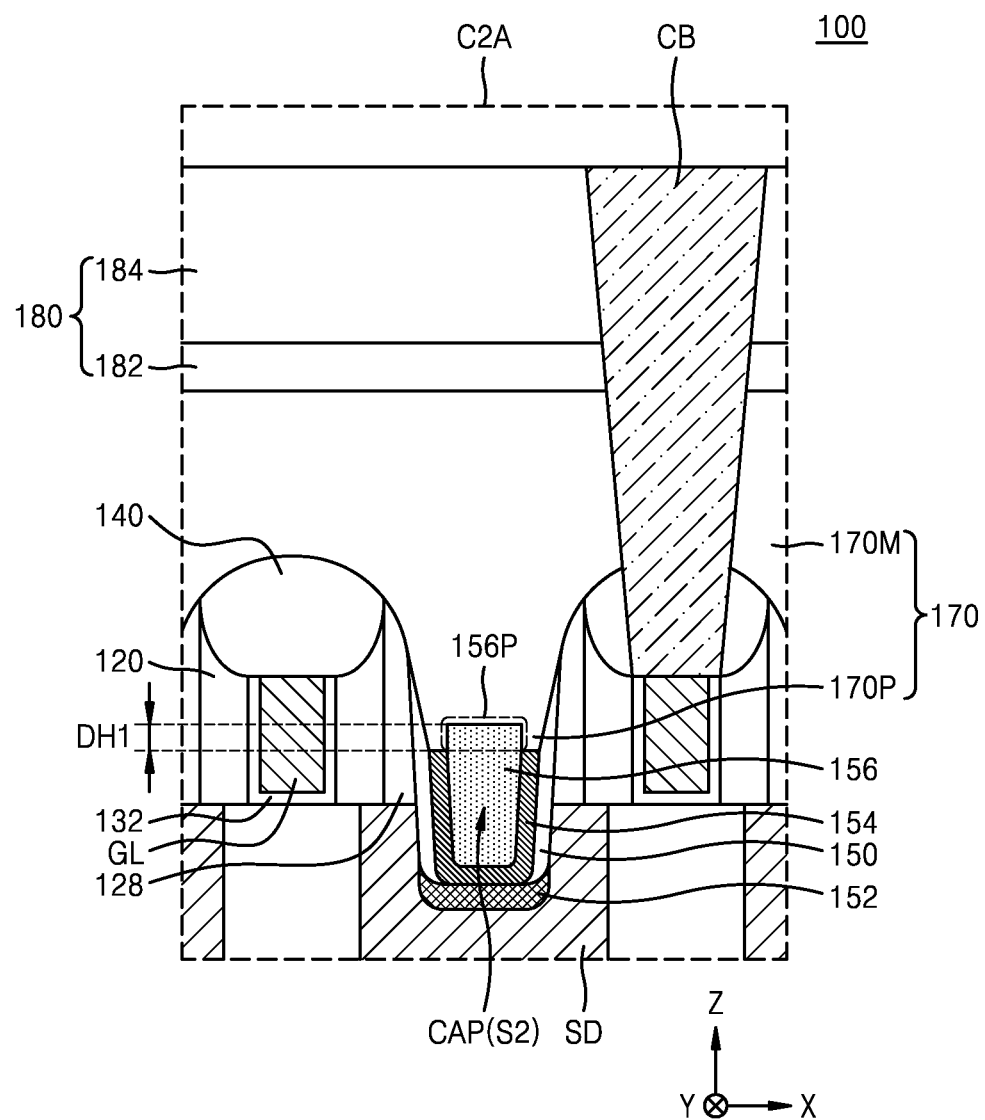
Figure 2D:
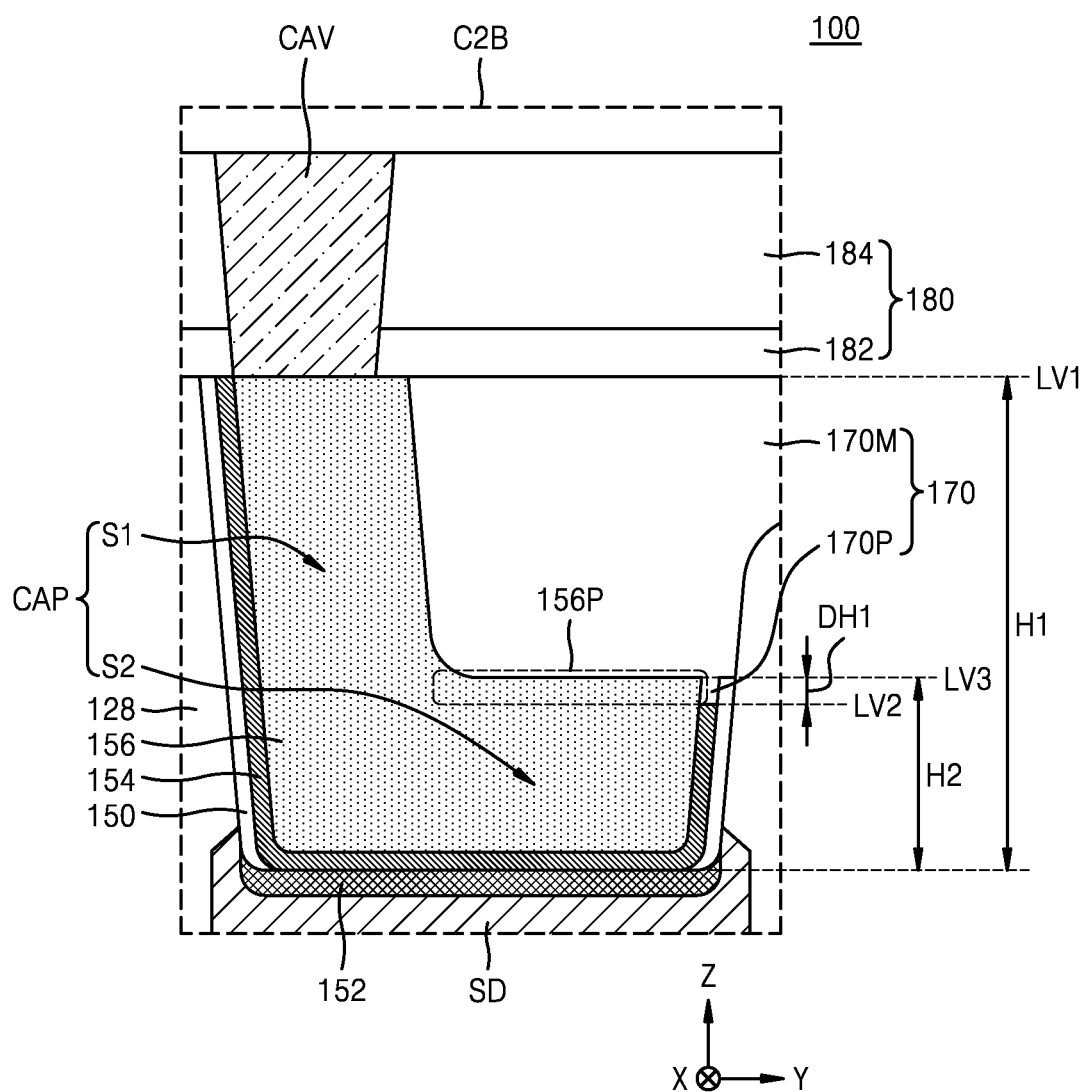

FIG. 1 is a layout of an integrated circuit device 100 according to some embodiments of the present inventive concept. FIG. 2A show cross-sectional views taken along lines X1-X1' and X2-X2' in FIG. 1, and FIG. 2B is a cross-sectional view taken along line Y1-Y1' in FIG. 1. FIGS. 2C and 2D are enlarged cross-sectional views of a portion corresponding to region C1 in FIG. 1, wherein FIG. 2C is an enlarged cross-sectional view of region C2A in FIG. 2A, and FIG. 2D is an enlarged cross-sectional view of region C2B in FIG. 2B.

Referring to FIGS. 1 through 2D, the integrated circuit device 100 includes a logic cell LC formed in a region defined by a cell boundary BN on a substrate 110. The logic cell LC may include a fin field-effect transistor (FinFET).

The substrate 110 has a main surface 110M extending in a horizontal direction (e.g., an XY-plane direction). The substrate 110 may include a semiconductor material such as Si or Ge or a compound semiconductor material such as SiGe, SiC, GaAs, InAs, or InP. The substrate 110 may include a conductive region, e.g., an impurity-doped well or an impurity-doped structure.

The logic cell LC includes a first device region RX1 and a second device region RX2. A plurality of fin-type active regions FA protruding from the substrate 110 may be formed in each of the first device region RX1 and the second device region RX2. A device isolation region DTA may be between the first device region RX1 and the second device region RX2.

The fin-type active regions FA may extend in a width direction of the logic cell LC, i.e., a first horizontal direction (e.g., an X direction), to be parallel to each other. As shown in FIG. 2B, an isolation film 112 may be formed in the substrate 110 among the fin-type active regions FA, and an isolation insulating film 114 may be formed in the substrate 110 in the device isolation region DTA. Each of the isolation film 112 and the isolation insulating film 114 may include, for example, an oxide film. The fin-type active regions FA may protrude from the isolation film 112 to have a fin shape in the first device region RX1 and the second device region RX2.

A plurality of gate insulating films 132 and a plurality of gate lines GL are formed on the substrate 110 to extend in a height direction of the logic cell LC, i.e., a second horizontal direction (e.g., a Y direction), crossing the fin-type active regions FA. The gate insulating films 132 and the gate lines GL may cover the top surface and both sidewalls of each of the fin-type active regions FA, the top surface of the isolation film 112, and the top surface of the isolation insulating film 114. "An element A covers a surface of an element B" (or similar language) as used herein may mean that the element A is on and overlaps the surface of the element B and does not necessarily mean that the element A covers the surface of the element B entirely.

A plurality of metal-oxide semiconductor (MOS) transistors may be formed along the gate lines GL in the first device region RX1 and the second device region RX2. Each of the MOS transistors may have a three-dimensional (3D) structure, in which a channel is formed on the top surface and both sidewalls of each of the fin-type active regions FA.

A dummy gate line DGL may extend along the cell boundary BN in the second horizontal direction (the Y direction). The dummy gate line DGL may include the same material as the gate lines GL but may function as an electrical isolation region between the logic cell LC and another neighboring logic cell by maintaining an electrical floating state during the operation of the integrated circuit device 100. The gate lines GL and a plurality of dummy gate lines DGL may have the same width in the first horizontal direction (the X direction) and may be arranged at a certain pitch in the first horizontal direction (the X direction).

The gate insulating films 132 may include, for example, a silicon oxide film, a high-k dielectric film, or a combination thereof. The high-k dielectric film may include a material having a higher dielectric constant than a silicon oxide film. The high-k dielectric film may include, for example, metal oxide or metal oxynitride. An interface film (not shown) may be between a fin-type active region FA and a gate insulating film 132. The interface film may include, for example, an oxide film, a nitride film, or an oxynitride film.

The gate lines GL and the dummy gate lines DGL may have a structure, in which a metal nitride layer, a metal layer, a conductive capping layer, and a gap-fill metal film are sequentially stacked. The metal nitride layer and the metal layer may include at least one metal selected from Ti, Ta, W, Ru, Nb, Mo, and Hf. The gap-fill metal film may include a W film or an Al film. The gate lines GL and the dummy gate lines DGL may include a work function metal layer. The work function metal layer may include at least one metal selected from Ti, W, Ru, Nb, Mo, Hf, Ni, Co, Pt, Yb, Tb, Dy, Er, and Pd. In some embodiments, the gate lines GL and the dummy gate lines DGL may include a stack structure of TiAlC/TiN/W, TiN/TaN/TiAlC/TiN/W, or TiN/TaN/TiN/TiAlC/TiN/W but are not limited thereto.

A plurality of insulating spacers 120 may cover both sidewalls of the gate lines GL and both sidewalls of the dummy gate lines DGL. Each of the insulating spacers 120 may have a line shape extending in a length direction (the Y direction) of the logic cell LC. The insulating spacers 120 may include, for example, a silicon nitride film, a SiOCN film, a SiCN film, or a combination thereof but are not limited thereto.

The top surface of each of the gate lines GL, the gate insulating films 132, the insulating spacers 120, and the dummy gate lines DGL may be covered with an insulating capping line 140. A plurality of insulating capping lines 140 may include, for example, a silicon nitride film.

A plurality of recess regions RR may be formed in top surfaces of the fin-type active regions FA at sides of each of the gate lines GL, respectively, and a plurality of source/drain regions SD may be formed in the recess regions RR, respectively. Each of the source/drain regions SD may be between adjacent gate lines GL. A gate line GL may be separated from a source/drain region SD with a gate insulating film 132 and an insulating spacer 120 between the gate line GL and the source/drain region SD. A plurality of source/drain regions SD may include, for example, a semiconductor epitaxial layer epitaxially grown on a plurality of recess regions RR in a fin-type active region FA or a combination of semiconductor epitaxial layers. The source/drain regions SD may include, for example, an epitaxially grown Si layer, an epitaxially grown SiC layer, or an epitaxially grown SiGe layer. An intergate insulating film 128 may include, for example, a silicon oxide film. In example embodiments, the source/drain regions SD may be covered with an insulating liner (not shown). The insulating liner may conformally cover the surface of each of the source/drain regions SD. The insulating liner may include, for example, SiN, SiCN, SiBN, SiON, SiOCN, SiBCN, SiOC, SiO$_2$, or a combination thereof.

In example embodiments, the first device region RX1 may correspond to an N-channel MOS (NMOS) transistor region, and the second device region RX2 may correspond to a P-channel MOS (PMOS) transistor region. In this case, a plurality of source/drain regions SD in the first device region RX1 may include an epitaxially grown Si layer or an epitaxially grown SiC layer, and a plurality of source/drain regions SD in the second device region RX2 may include a plurality of epitaxially grown SiGe layers. As shown in FIG. 2B, the source/drain regions SD in the first device region RX1 may have a different shape and size than the source/drain regions SD in the second device region RX2. However, embodiments are not limited thereto, and a plurality of source/drain regions SD may have various shapes and sizes in the first device region RX1 and the second device region RX2.

A plurality of source/drain contact patterns CAP may be formed on the source/drain regions SD. The source/drain regions SD may be connected to a conductive line (not shown) thereabove through the source/drain contact patterns CAP. The source/drain contact patterns CAP may include a conductive barrier film 154 and a metal plug 156. The conductive barrier film 154 may cover the sidewall and bottom surface of the metal plug 156. A metal silicide film 152 may be formed between a source/drain region SD and a source/drain contact pattern CAP. "An element A is connected to an element B" (or similar language) as used herein may mean that the element A is electrically connected to the element B or the element A physically contacts the element B.

In example embodiments, the metal silicide film 152 may include, for example, Ti, W, Ru, Nb, Mo, Hf, Ni, Co, Pt, Yb, Tb, Dy, Er, or Pd. For example, the metal silicide film 152 may include titanium silicide. The conductive barrier film 154 may include, for example, Ti, Ta, TiN, TaN, or a combination thereof, and the metal plug 156 may include, for example, W, Co, Cu, Ru, Mn, or a combination thereof.

The sidewall of each of the source/drain contact patterns CAP may be covered with a contact insulating spacer 150. In example embodiments, the contact insulating spacer 150 may include, for example, SiCN, SiCON, silicon nitride (SiN), or a combination thereof but is not limited thereto.

The source/drain contact patterns CAP may have different heights according to the positions thereof. Each of the source/drain contact patterns CAP may include a first segment S1 and a second segment S2, which respectively have different heights in a vertical direction (a Z direction) and are integrally connected to each other. As used herein, the term "segment" may be interchangeable with the term "portion."

As shown in FIG. 2D, the first segment S1 of a source/drain contact pattern CAP above a fin-type active region FA may have a first height H1 in the vertical direction (the Z direction), and the second segment S2 of the source/drain contact pattern CAP may have a second height H2 in the vertical direction (the Z direction), the second height H2 being less than the first height H1.

In each source/drain contact pattern CAP, the conductive barrier film 154 and the metal plug 156 may extend across the first segment S1 and the second segment S2 to be included in the first segment S1 and the second segment S2.

In the first segment S1 of each source/drain contact pattern CAP, a top surface of the conductive barrier film 154 may be coplanar with a top surface of the metal plug 156 at a vertical level LV1. In the specification, the term "level" refers to a distance from the main surface 110M of the substrate 110 in the vertical direction (the Z direction).

In the second segment S2 of each source/drain contact pattern CAP, a vertical level LV2 of a topmost surface of the conductive barrier film 154 is lower than a vertical level LV3 of a topmost surface of the metal plug 156. A height difference DH1 between the vertical level LV3 of the topmost surface of the metal plug 156 and the vertical level LV2 of the topmost surface of the conductive barrier film 154 in the second segment S2 may be about 1 nm to about 5 nm, for example, about 2 nm to about 3 nm. As used herein, "a vertical level X of a surface A is lower than a vertical level Y of a surface B" (or similar language) may mean that the surface A is lower than the surface B in a vertical direction relative to a substrate, and the substrate is thus closer to the surface A than the surface B in the vertical direction.

The vertical level LV1 of a topmost surface of the first segment S1 may be higher than a vertical level of a topmost surface of the gate line GL in the vertical direction (the Z direction), and the vertical level LV2 of the topmost surface of the conductive barrier film 154 in the second segment S2 and the vertical level LV3 of the topmost surface of the metal plug 156 in the second segment S2 may be lower than the vertical level of the topmost surface of the gate line GL. In other words, a distance from the main surface 110M of the substrate 110 to the topmost surface of the first segment S1 may be greater than a distance from the main surface 110M of the substrate 110 to the topmost surface of each of the gate lines GL in the vertical direction (the Z direction), and a distance from the main surface 110M of the substrate 110 to the topmost surface of the second segment S2 may be less than a distance from the main surface 110M of the substrate 110 to the topmost surface of each of the gate lines GL in the vertical direction (the Z direction). However, embodiments are not limited thereto. For example, the topmost surface of each of the first and second segments S1 and S2 may be higher than the topmost surface of each of the gate lines GL.

As used herein, "a vertical level X of a surface A is higher than a vertical level Y of a surface B" (or similar language) may mean that the surface A is higher than the surface B in a vertical direction relative to a substrate, and the substrate is thus closer to the surface B than the surface A in the vertical direction.

In the second segment S2 of each source/drain contact pattern CAP, the metal plug 156 may include a protruding top portion 156P at a level higher than the vertical level LV2 of the topmost surface of the conductive barrier film 154 in the second segment S2. In the second segment S2 of each source/drain contact pattern CAP, a sidewall of the protruding top portion 156P of the metal plug 156 may not be covered with the conductive barrier film 154. The protruding top portion 156P may protrude beyond the topmost surface of the conductive barrier film 154 in the second segment S2 as illustrated in FIGS. 2C and 2D.

The protruding top portion 156P may have a flat top surface (e.g., a substantially planar top surface). In example embodiments, a topmost surface of the protruding top portion 156P may extend substantially evenly in a direction parallel to the main surface 110M of the substrate 110. However, embodiments are not limited thereto, and the shape of the protruding top portion 156P may be variously changed. Specific examples of various shapes of the protruding top portion 156P will be described with reference to FIGS. 5A through 7B below.

The insulating capping lines 140 may have different thicknesses at different positions. For example, as shown in FIG. 2A, a portion of the insulating capping lines 140, which is between two adjacent first segments S1, may be relatively thick, and a portion of the insulating capping lines 140, which is between two adjacent second segments S2, may be relatively thin. A portion of an insulating capping line 140 between the first segment S1 of one source/drain contact pattern CAP and the second segment S2 of another source/drain contact pattern CAP may have a thickness, which may be variable and decrease from the first segment S1 toward the second segment S2 in the first horizontal direction (the X direction).

The integrated circuit device 100 may include a buried insulating film 170, which covers the second segment S2 of each of a plurality of source/drain contact patterns CAP, the gate lines GL, and a plurality of insulating capping lines 140, and an insulating structure 180 covering a top surface of the buried insulating film 170.

The buried insulating film 170 may be in contact with the top surface of each of a plurality of second segments S2 and the top surface of each of the insulating capping lines 140. The buried insulating film 170 may include a main buried portion 170M and a buried protrusion 170P. The main buried portion 170M covers the top surface of the metal plug 156 included in each of the second segments S2, portions of a plurality of contact insulating spacers 150 adjacent to the second segments S2, and the insulating capping lines 140. The buried protrusion 170P protrudes from the main buried portion 170M toward the substrate 110. The buried protrusion 170P may be on the second segment S2 of each of the source/drain contact patterns CAP to be in contact with the top surface of the conductive barrier film 154. The buried protrusion 170P may also be in contact with the sidewall of the protruding top portion 156P of the metal plug 156 and a sidewall of the contact insulating spacer 150. The buried protrusion 170P may fill a space (e.g., an inner space of a lower recess LR illustrated in FIGS. 19A and 19B), which is defined by the topmost surface of the conductive barrier film 154, the sidewall of the protruding top portion 156P of the metal plug 156, and the sidewall of the contact insulating spacer 150.

The buried insulating film 170 may have a planarized top surface. The buried insulating film 170 may include a portion filling a space above the second segment S2 of each of the source/drain contact patterns CAP among the gate lines GL. The top surface of the buried insulating film 170 may be coplanar with the topmost surfaces of the conductive barrier film 154 and the metal plug 156, which are included in the first segment S1 of each of the source/drain contact patterns CAP, and may be substantially at the vertical level LV1. The buried insulating film 170 may include, for example, a silicon oxide film, SiOC, SiOCN, SiON, SiCN, SiN, or a combination thereof but is not limited thereto.

The insulating structure 180 may include an etch stop film 182 and an interlayer insulating film 184, which are sequentially stacked on the buried insulating film 170. The bottom surface of the etch stop film 182 may be in contact with the topmost surface of the buried insulating film 170. The etch stop film 182 may include, for example, silicon carbide (SiC), SiN, nitrogen-doped silicon carbide (SiC:N), SiOC, AlN, AlON, AlO, AlDC, or a combination thereof. The interlayer insulating film 184 may include, for example, an oxide film, a nitride film, an ultra low-k (ULK) film having an ultra low dielectric constant K of about 2.2 to about 2.4, or a combination thereof. For example, the interlayer insulating film 184 may include a tetraethylorthosilicate (TEOS) film, a high density plasma (HDP) film, a boro-phosphosilicate glass (BPSG) film, a flowable chemical vapor deposition (FCVD) oxide film, a SiON film, a SiN film, a SiOC film, a SiCOH film, or a combination thereof.

A plurality of via contacts CAV may be respectively formed on the source/drain contact patterns CAP. Each of the via contacts CAV may pass through the insulating structure 180 and be in contact with the top surface of the first segment S1 of a source/drain contact pattern CAP.

A plurality of gate contacts CB may be respectively formed on the gate lines GL. Each of the gate contacts CB may pass through the insulating structure 180, the buried insulating film 170, and an insulating capping line 140 and may be connected to a gate line GL. Each gate contact CB may pass through a relatively thin portion of the insulating capping line 140 and be in contact with the top surface of the gate line GL.

Each of some gate contacts CB may be in contact with the gate line GL in a location adjacent to the second segment S2 of the source/drain contact pattern CAP. In this case, as shown in FIGS. 2A and 2C, the buried protrusion 170P of the buried insulating film 170 may be between the gate line GL and the second segment S2 of the source/drain contact pattern CAP, which are adjacent to each other in the first horizontal direction (the X direction). In other words, a gate contact CB and the second segment S2 of the source/drain contact pattern CAP may be separated from each other in the first horizontal direction (the X direction) with the buried protrusion 170P of the buried insulating film 170 therebetween. Accordingly, a separation distance from the conductive barrier film 154 and the metal plug 156, which form the second segment S2, to the gate line GL may be secured at least by the buried protrusion 170P. Therefore, even when the gate contact CB and the second segment S2 of the source/drain contact pattern CAP are formed to be adjacent to each other, an insulation margin between the gate contact CB and the source/drain contact pattern CAP may be secured, thereby reducing or preventing an undesirable short-circuit between the gate contact CB and the source/drain contact pattern CAP.

Each of the via contacts CAV and the gate contacts CB may include a buried metal film and a conductive barrier film surrounding the buried metal film. The buried metal film may include, for example, Co, Cu, W, Ru, Mn, or a combination thereof, and the conductive barrier film may include, for example, Ti, Ta, TiN, TaN, or a combination thereof. Sidewalls of each of the via contacts CAV and the gate contacts CB may be covered with an insulating liner (not shown). The insulating liner may include, for example, a silicon nitride film but is not limited thereto. "An element A surrounds an element B" (or similar language) as used herein may mean that the element A is on and partially surrounds the element B and does not necessarily mean that the element A completely surrounds the surface of the element B entirely.

In the logic cell LC, a ground line VSS may be connected to fin-type active regions FA in the first device region RX1 through some of the source/drain contact patterns CAP, and a power supply line VDD may be connected to fin-type active regions FA in the second device region RX2 through others of the source/drain contact patterns CAP. The ground line VSS and the power supply line VDD may be formed at a level higher than the top surface of each of the source/drain contact patterns CAP and the gate contacts CB. Each of the ground line VSS and the power supply line VDD may include a conductive barrier film and a wiring conductive layer. The conductive barrier film may include, for example, Ti, Ta, TiN, TaN, or a combination thereof. The wiring conductive layer may include, for example, Co, Cu, W, an alloy thereof, or a combination thereof.

Figure 3A:
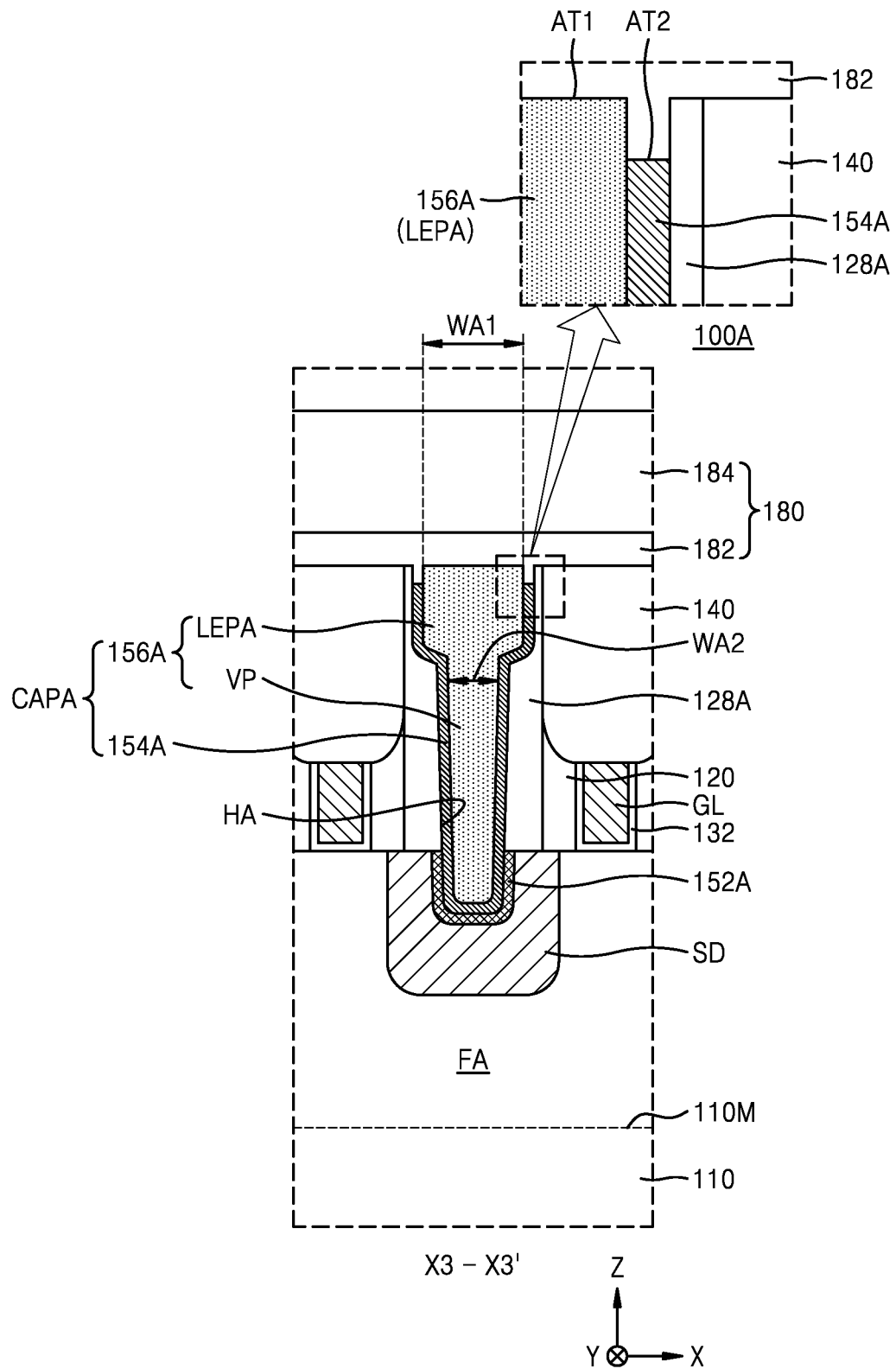
FIG. 3A is an enlarged cross-sectional view of an integrated circuit device according to some embodiments of the present inventive concept.

FIG. 3A is a cross-sectional view of an integrated circuit device 100A according to some embodiments of the present inventive concept. In detail, FIG. 3A is an enlarged cross-sectional view corresponding to a cross-sectional view of a portion taken along the line X3-X3' in FIG. 1.

Referring to FIG. 3A, the integrated circuit device 100A may be substantially the same as or similar to the integrated circuit device 100 described with reference to FIGS. 1 through 2D. However, the integrated circuit device 100A includes a lower interlayer insulating film 128A covering a source/drain region SD, and a source/drain contact pattern CAPA penetrating the lower interlayer insulating film 128A. As used herein, the term "lower interlayer insulating film" may also be referred as an "interlayer insulating film." The detailed configuration of the lower interlayer insulating film 128A may be substantially the same as or similar to that of the intergate insulating film 128, which has been described with reference to FIGS. 2A and 2B. The source/drain contact pattern CAPA may vertically extend toward the source/drain region SD in the source/drain contact hole HA defined in the lower interlayer insulating film 128A. The source/drain contact pattern CAPA may include a conductive barrier film 154A and a metal plug 156A.

A metal silicide film 152A may be formed between the source/drain region SD and the source/drain contact pattern CAPA. The metal plug 156A and the conductive barrier film 154A may be electrically connected to the source/drain region SD through the metal silicide film 152A. The metal silicide film 152A may be substantially the same as or similar to the metal silicide film 152 described with reference to FIGS. 2A and 2B. The metal silicide film 152A may be omitted.

The metal plug 156A may include a lateral expansion portion LEPA in an upper portion of the source/drain contact hole HA, and a through portion VP integrally connected to the lateral expansion portion LEPA and vertically extending between the lateral expansion portion LEPA and the source/drain region SD. The through portion VP may extend from the lateral expansion portion LEPA toward the source/drain region SD. A width WA1 (e.g., a widest width) of the lateral expansion portion LEPA in the first horizontal direction (the X direction) may be greater than a width WA2 (e.g., a widest width) of the through portion VP in the first horizontal direction (the X direction).

An inner sidewall of the source/drain contact hole HA may have a stepped shape at a portion adjacent to a transition portion between the lateral expansion portion LEPA and the through portion VP, and thereby an upper portion of the source/drain contact hole HA is wider than a lower portion of the source/drain contact hole HA in first horizontal direction (the X direction).

The conductive barrier film 154A may cover each of a sidewall of the lateral expansion portion LEPA and a sidewall of the through portion VP of metal plug 156A in the source/drain contact hole HA. Each of the lateral expansion portion LEPA and the through portion VP of the metal plug 156A may be spaced apart from the lower interlayer insulating film 128A with the conductive barrier film 154A therebetween.

A topmost surface AT2 of the conductive barrier film 154A may be closer than a topmost surface AT1 of the metal plug 156A to the substrate 110. The detailed configuration of each of the conductive barrier film 154A and the metal plug 156A is substantially the same as or similar to that of the metal plug 156 and the conductive barrier film 154 of the integrated circuit device 100 described with reference to FIGS. 1 through 2D.

An insulating structure 180 may be disposed on the source/drain contact pattern CAPA and on the lower interlayer insulating film 128A. The insulating structure 180 may include the etch stop film 182 and the interlayer insulating film 184, which are sequentially formed on each of the source/drain contact pattern CAPA and the lower interlayer insulating film 128A. The etch stop film 182 may be disposed on each of the topmost surface AT1 of the metal plug 156A and the topmost surface AT2 of the conductive barrier film 154A.

Figure 3B:
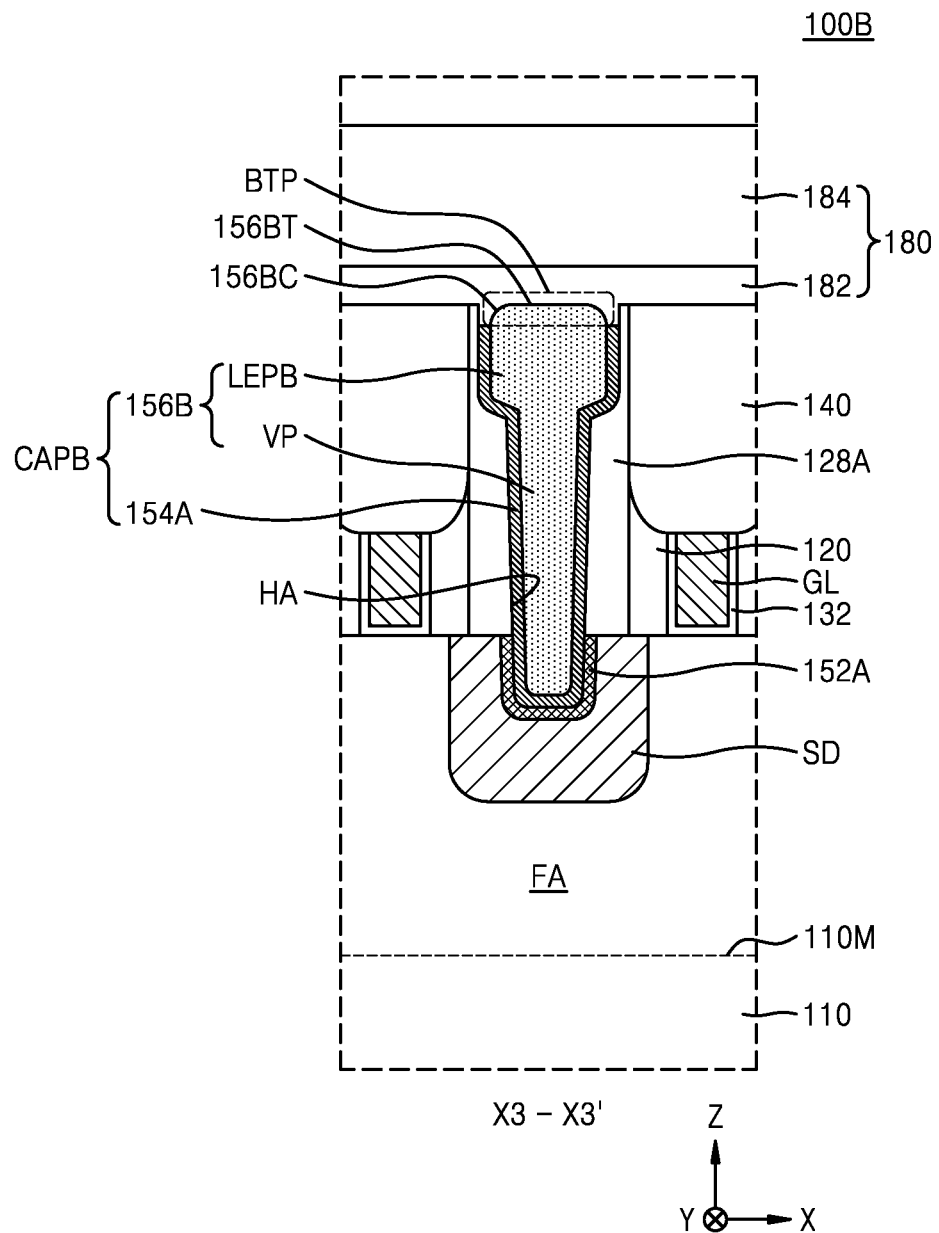
FIG. 3B is an enlarged cross-sectional view of an integrated circuit device according to some embodiments of the present inventive concept.

FIG. 3B is a cross-sectional view of an integrated circuit device 100B according to some embodiments of the present inventive concept. In detail, FIG. 3B is an enlarged cross-sectional view corresponding to a cross-sectional view of the portion taken along the line X3-X3' in FIG. 1.

Referring to FIG. 3B, the integrated circuit device 100B may be substantially the same as or similar to the integrated circuit device 100A described with reference to FIG. 3A. However, the integrated circuit device 100B includes a source/drain contact pattern CAPB in the source/drain contact hole HA penetrating the lower interlayer insulating film 128A toward the source/drain region SD. The source/drain contact pattern CAPB may include the conductive barrier film 154A and a metal plug 156B.

The metal plug 156B may include a lateral expansion portion LEPB in an upper portion of the source/drain contact hole HA, and a through portion VP integrally connected to the lateral expansion portion LEPB and vertically extending between the lateral expansion portion LEPB and the source/drain region SD.

The lateral expansion portion LEPB of the metal plug 156B may include a protruding top portion BTP at a higher level than the conductive barrier film 154A of the source/drain contact pattern CAPB. The protruding top portion BTP may have a rounded corner 156BC in an outer edge thereof, and a top surface portion 156BT substantially in the middle of the protruding top portion BTP in the first horizontal direction (the X direction). In example embodiments, the top surface portion 156BT may extend substantially evenly in a direction parallel to the main surface 110M of the substrate 110. In example embodiments, the top surface portion 156BT of the protruding top portion BTP may extend not evenly but in a curved shape in the first horizontal direction (the X direction). The detailed configuration of the metal plug 156B is substantially the same as or similar to that of the metal plug 156A of the integrated circuit device 100A described with reference to FIG. 3A.

Figure 3C:
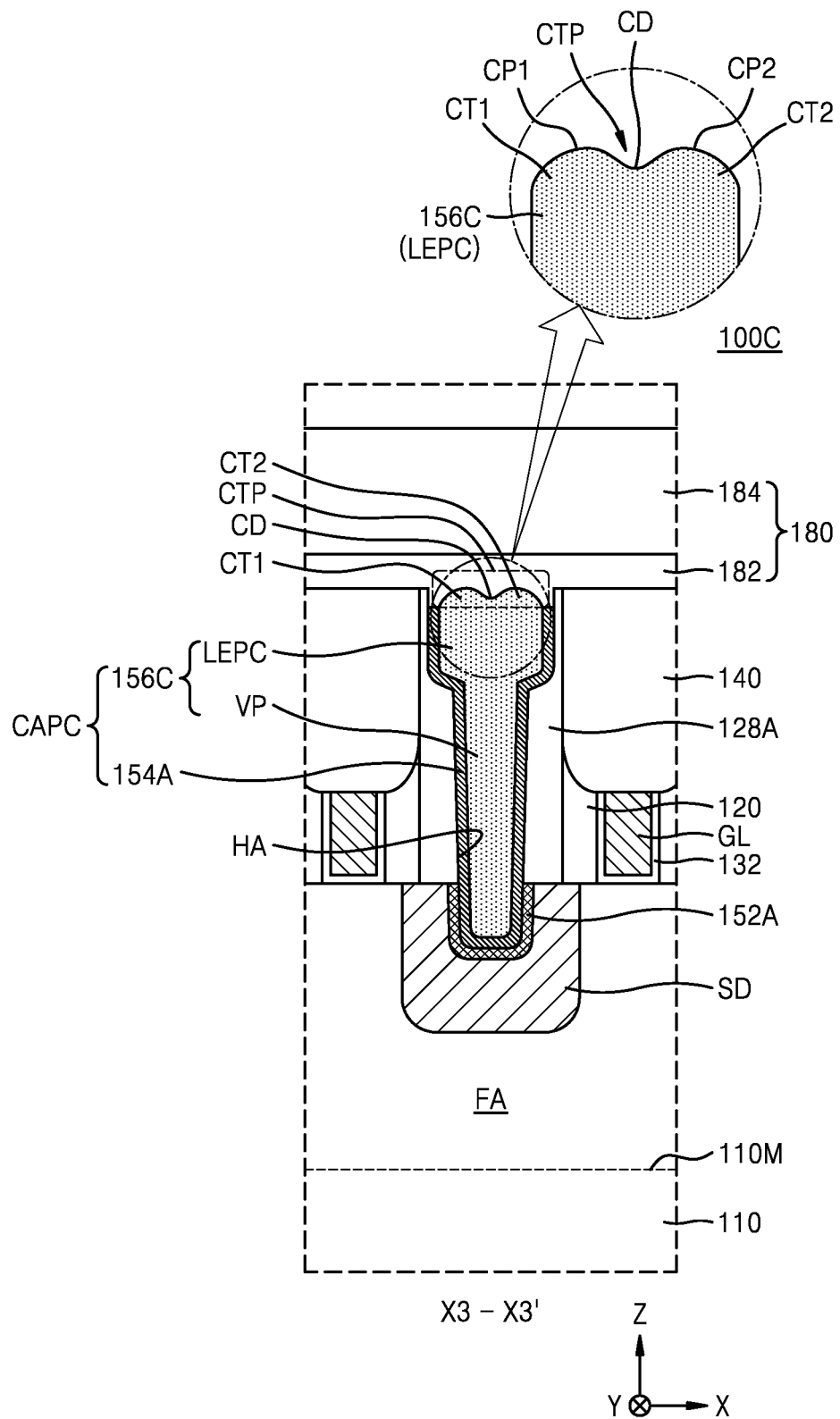
FIG. 3C is an enlarged cross-sectional view of an integrated circuit device according to some embodiments of the present inventive concept.

FIG. 3C is a cross-sectional view of an integrated circuit device 100C according to some embodiments of the present inventive concept. In detail, FIG. 3C is an enlarged cross-sectional view corresponding to a cross-sectional view of the portion taken along the line X3-X3' in FIG. 1.

Referring to FIG. 3C, the integrated circuit device 100C may be substantially the same as or similar to the integrated circuit device 100A described with reference to FIG. 3A. However, the integrated circuit device 100C includes a source/drain contact pattern CAPC in the source/drain contact hole HA penetrating the lower interlayer insulating film 128A toward the source/drain region SD. The source/drain contact pattern CAPC may include the conductive barrier film 154A and a metal plug 156C.

The metal plug 156C may include a lateral expansion portion LEPC in an upper portion of the source/drain contact hole HA, and a through portion VP integrally connected to the lateral expansion portion LEPC and vertically extending between the lateral expansion portion LEPC and the source/drain region SD.

The lateral expansion portion LEPC of the metal plug 156C may include a protruding top portion CTP at a higher level than the conductive barrier film 154A of the source/drain contact pattern CAPC. The protruding top portion CTP may have a double-humped protrusion, which bulges in a direction away from the substrate 110. In detail, the protruding top portion CTP may include a double-humped protrusion, which includes a first hump CT1 and a second hump CT2, which bulge in the direction away from the substrate 110. An indentation CD may be between the first hump CT1 and the second hump CT2. A surface of the first hump CT1 of the protruding top portion CTP may be symmetric or asymmetric with respect to a first peak CP1. A surface of the second hump CT2 may be symmetric or asymmetric with respect to a second peak CP2. A level of the first peak CP1 may be equal or similar to a level of the second peak CP2 in the vertical direction (the Z direction). In some embodiments, the first peak CP1 and the second peak CP2 may be equidistant from the substrate 110. The detailed configuration of the metal plug 156C is substantially the same as or similar to that of the metal plug 156A of the integrated circuit device 100A described with reference to FIG. 3A.

Figure 3D:
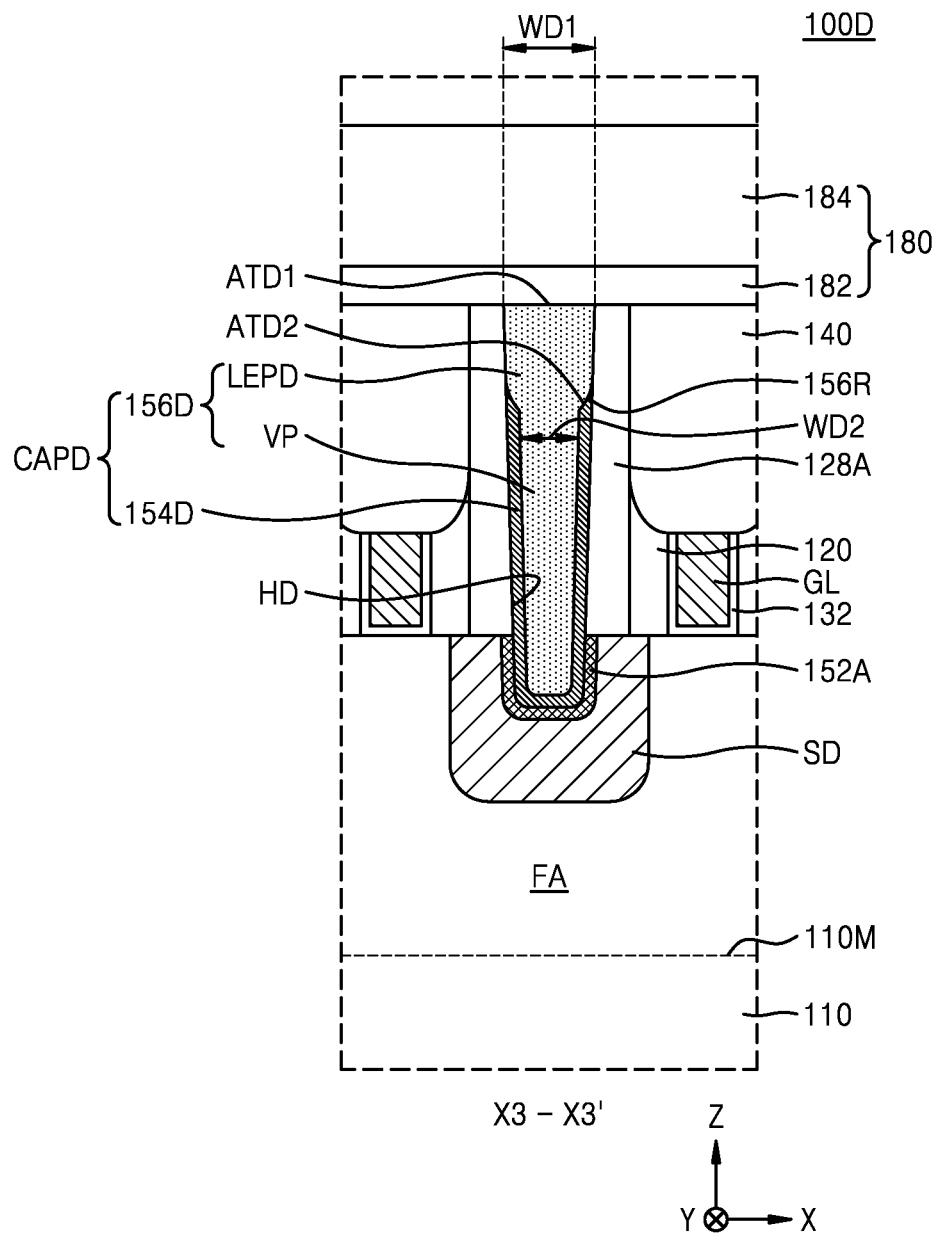
FIG. 3D is an enlarged cross-sectional view of an integrated circuit device according to some embodiments of the present inventive concept.

FIG. 3D is a cross-sectional view of an integrated circuit device 100D according to some embodiments of the present inventive concept. In detail, FIG. 3D is an enlarged cross-sectional view corresponding to a cross-sectional view of the portion taken along the line X3-X3' in FIG. 1.

Referring to FIG. 3D, the integrated circuit device 100D may be substantially the same as or similar to the integrated circuit device 100A described with reference to FIG. 3A. However, the integrated circuit device 100D includes a source/drain contact pattern CAPD in the source/drain contact hole HD penetrating the lower interlayer insulating film 128A toward the source/drain region SD. The source/drain contact pattern CAPD may include the conductive barrier film 154D and a metal plug 156D.

The metal plug 156D may include a lateral expansion portion LEPD in an upper portion of the source/drain contact hole HD, and a through portion VP integrally connected to the lateral expansion portion LEPD and vertically extending between the lateral expansion portion LEPD and the source/drain region SD. The through portion VP may vertically extend from the lateral expansion portion LEPD toward the source/drain region SD. A width WD1 (e.g., a widest width) of the lateral expansion portion LEPD in the first horizontal direction (the X direction) may be greater than a width WD2 (e.g., a widest width) of the through portion VP in the first horizontal direction (the X direction).

An inner sidewall of the source/drain contact hole HD may have a stepped shape at a portion adjacent to a transition portion between the lateral expansion portion LEPD and the through portion VP, and thereby an upper portion of the source/drain contact hole HD is wider than a lower portion of the source/drain contact hole HD in first horizontal direction (the X direction). A side edge of the lateral expansion portion LEPD, which is adjacent to the through portion VP, may include a rounded corner 156R. A lowermost portion of a side surface of the lateral expansion portion LEPD may include the rounded corner 156R, as illustrated in FIG. 3D.

The conductive barrier film 154D may cover a sidewall of the through portion VP of metal plug 156D in the source/drain contact hole HD. The conductive barrier film 154D may not cover a sidewall (e.g., an upper portion of the sidewall) of the lateral expansion portion LEPD. The sidewall of the lateral expansion portion LEPD may contact the interlayer insulating film 128A. The through portion VP may be spaced apart from the interlayer insulating film 128A with the conductive barrier film 154D between the through portion VP and the interlayer insulating film 128A.

A topmost surface ATD2 of the conductive barrier film 154D may be closer than a topmost surface ATD1 of the metal plug 156D to the substrate 110. The topmost surface ATD2 of the conductive barrier film 154D may be disposed under the lateral expansion portion LEPD of the metal plug 156D. The rounded corner 156R of the lateral expansion portion LEPD may be in contact with the topmost surface ATD2 of the conductive barrier film 154D. The detailed configuration of each of the conductive barrier film 154D and the metal plug 156D is substantially the same as or similar to that of the conductive barrier film 154A and the metal plug 156A of the integrated circuit device 100A described with reference to FIG. 3A.

Figure 3E:
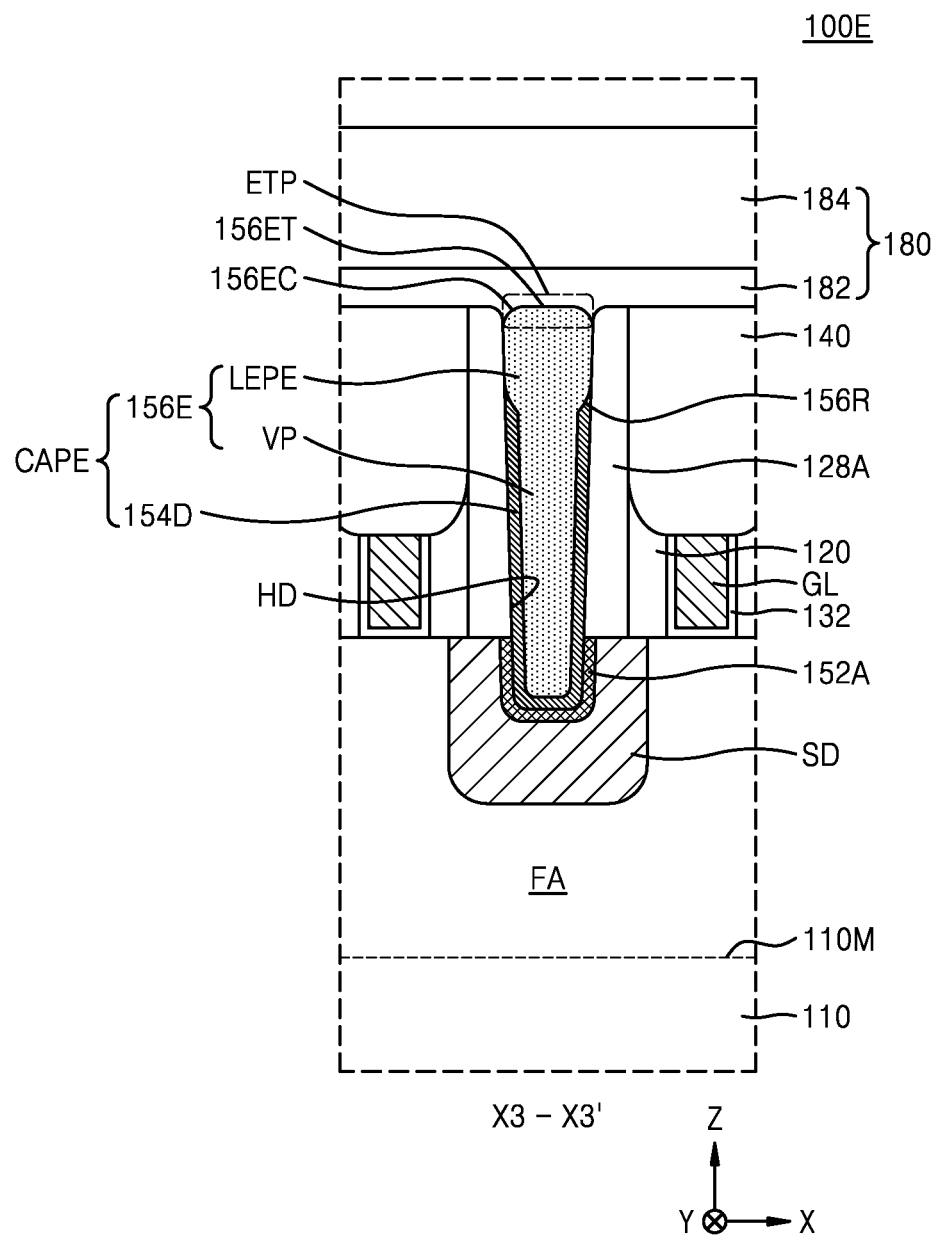
FIG. 3E is an enlarged cross-sectional view of an integrated circuit device according to some embodiments of the present inventive concept.

FIG. 3E is a cross-sectional view of an integrated circuit device 100E according to some embodiments of the present inventive concept. In detail, FIG. 3E is an enlarged cross-sectional view corresponding to a cross-sectional view of the portion taken along the line X3-X3' in FIG. 1.

Referring to FIG. 3E, the integrated circuit device 100E may be substantially the same as or similar to the integrated circuit device 100D described with reference to FIG. 3D. However, the integrated circuit device 100E includes a source/drain contact pattern CAPE in the source/drain contact hole HD penetrating a lower interlayer insulating film 128A toward the source/drain region SD. The source/drain contact pattern CAPE may include the conductive barrier film 154D and a metal plug 156E.

The metal plug 156E may include a lateral expansion portion LEPE in an upper portion of the source/drain contact hole HD, and a through portion VP integrally connected to the lateral expansion portion LEPE and vertically extending between the lateral expansion portion LEPE and the source/drain region SD.

The lateral expansion portion LEPE of the metal plug 156E may include a protruding top portion ETP at a higher level than the conductive barrier film 154D of the source/drain contact pattern CAPE. The protruding top portion ETP may have a rounded corner 156EC in an outer edge thereof, and a top surface portion 156ET substantially in the middle of the protruding top portion ETP in the first horizontal direction (the X direction). In example embodiments, the top surface portion 156ET may extend substantially evenly in a direction parallel to the main surface 110M of the substrate 110. In example embodiments, the top surface portion 156ET of the protruding top portion ETP may extend not evenly but in a curved shape in the first horizontal direction (the X direction). The detailed configuration of the metal plug 156E is substantially the same as or similar to that of the metal plug 156D of the integrated circuit device 100D described with reference to FIG. 3D.

Figure 3F:
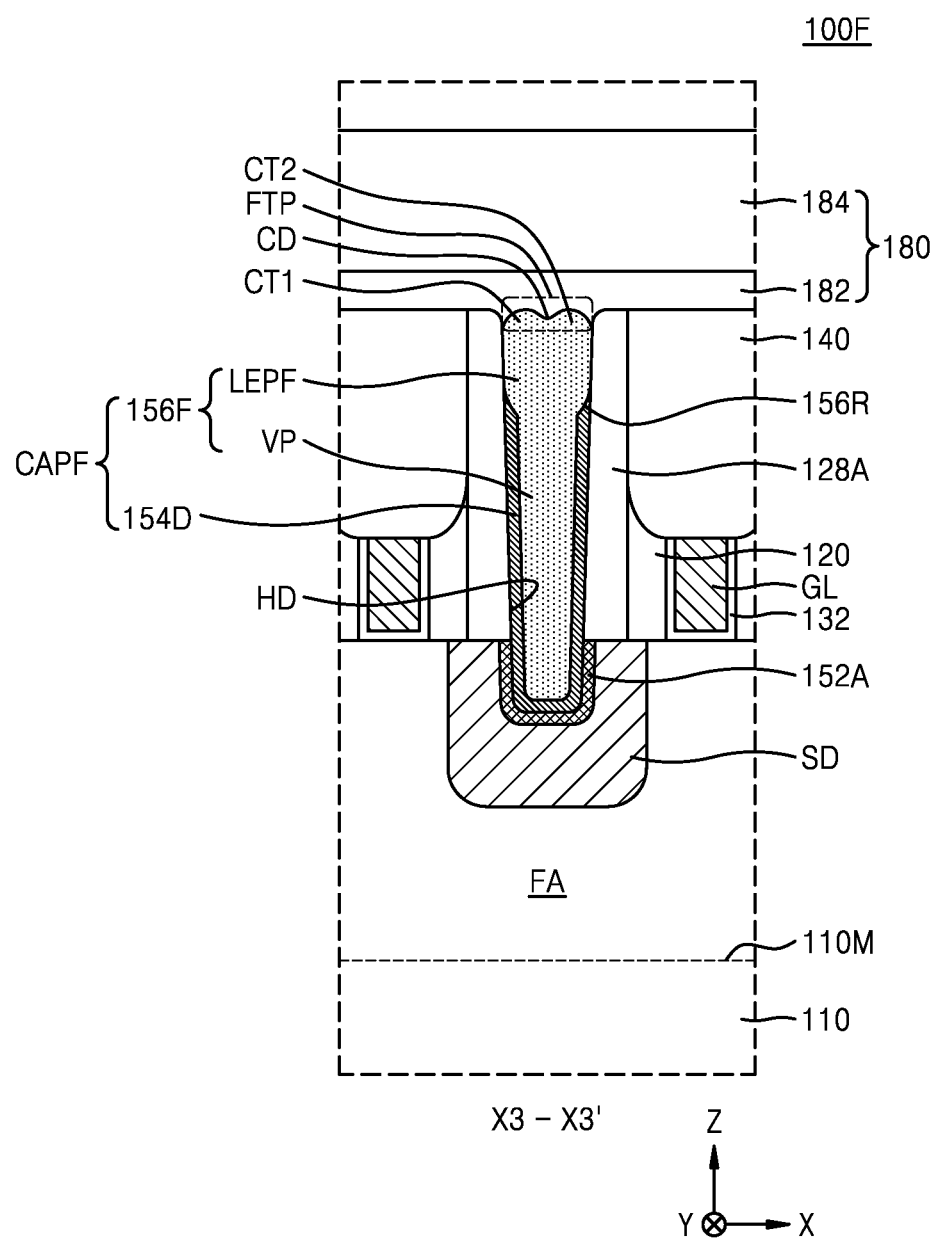
FIG. 3F is an enlarged cross-sectional view of an integrated circuit device according to some embodiments of the present inventive concept.

FIG. 3F is a cross-sectional view of an integrated circuit device 100F according to some embodiments of the present inventive concept. In detail, FIG. 3F is an enlarged cross-sectional view corresponding to a cross-sectional view of the portion taken along the line X3-X3' in FIG. 1.

Referring to FIG. 3F, the integrated circuit device 100F may be substantially the same as or similar to the integrated circuit device 100D described with reference to FIG. 3D. However, the integrated circuit device 100F includes a source/drain contact pattern CAPF in the source/drain contact hole HD penetrating a lower interlayer insulating film 128A toward the source/drain region SD. The source/drain contact pattern CAPF may include the conductive barrier film 154D and a metal plug 156F.

The metal plug 156F may include a lateral expansion portion LEPF in an upper portion of the source/drain contact hole HD, and a through portion VP integrally connected to the lateral expansion portion LEPF and vertically extending between the lateral expansion portion LEPF and the source/drain region SD.

The lateral expansion portion LEPF of the metal plug 156F may include a protruding top portion FTP at a higher level than the conductive barrier film 154D of the source/drain contact pattern CAPF. The protruding top portion FTP may have a double-humped protrusion, which bulges in a direction away from the substrate 110. In detail, the protruding top portion FTP may include a double-humped protrusion, which includes a first hump CT1 and a second hump CT2, which bulge in the direction away from the substrate 110. An indentation CD may be between the first hump CT1 and the second hump CT2. The detailed configuration of the metal plug 156F is substantially the same as or similar to that of the metal plug 156C of the integrated circuit device 100C described with reference to FIG. 3C.

Figure 3G:
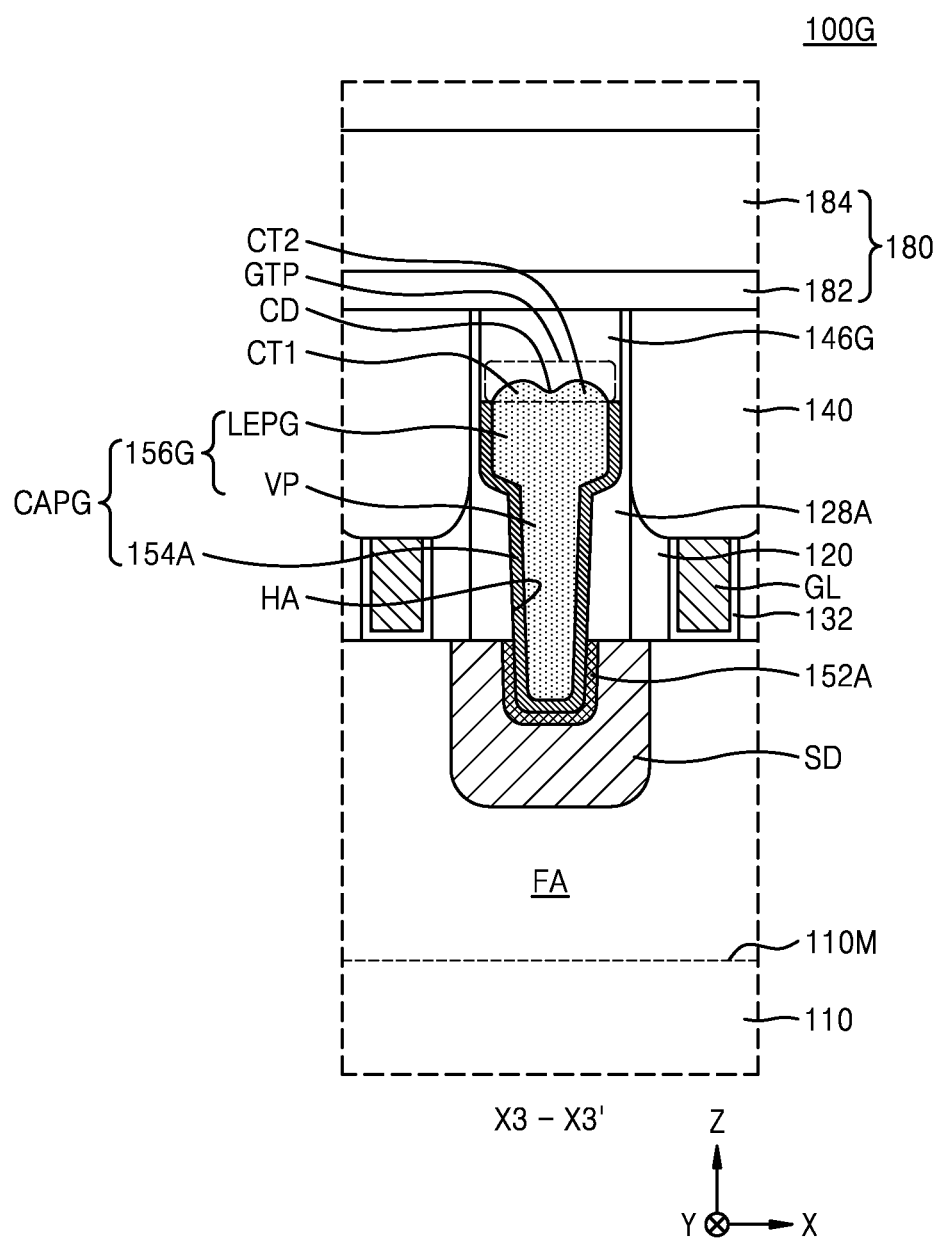
FIG. 3G is an enlarged cross-sectional view of an integrated circuit device according to some embodiments of the present inventive concept.

FIG. 3G is a cross-sectional view of an integrated circuit device 100G according to some embodiments of the present inventive concept. In detail, FIG. 3G is an enlarged cross-sectional view corresponding to a cross-sectional view of the portion taken along the line X3-X3' in FIG. 1.

Referring to FIG. 3G, the integrated circuit device 100G may be substantially the same as or similar to the integrated circuit device 100C described with reference to FIG. 3C. However, the integrated circuit device 100G includes a source/drain contact pattern CAPG in the source/drain contact hole HA penetrating a lower interlayer insulating film 128A toward the source/drain region SD. A top surface of the source/drain contact pattern CAPG may be covered with a capping layer 146G in the source/drain contact hole HA.

The source/drain contact pattern CAPG may include the conductive barrier film 154A and a metal plug 156G. The metal plug 156G may include a lateral expansion portion LEPG in the source/drain contact hole HA, and a through portion VP integrally connected to the lateral expansion portion LEPG and vertically extending between the lateral expansion portion LEPG and the source/drain region SD. The lateral expansion portion LEPG of the metal plug 156G may include a protruding top portion GTP at a higher level than the conductive barrier film 154A of the source/drain contact pattern CAPG. The protruding top portion GTP may have a double-humped protrusion, which bulges in a direction away from the substrate 110. The detailed configuration of the metal plug 156G is substantially the same as or similar to that of the metal plug 156C of the integrated circuit device 100C described with reference to FIG. 3C.

The capping layer 146G and the lower interlayer insulating film 128A may be covered with the etch stop film 182 of the insulating structure 180. The capping layer 146G may be interposed between a topmost surface of the metal plug 156G and the etch stop film 182. Sidewalls of the capping layer 146G may be covered with the lower interlayer insulating film 128A defining the source/drain contact hole HA. The capping layer 146G may include, for example, a silicon carbide film, a silicon nitride film, a silicon oxide film, or a combination thereof.

Figure 3H:
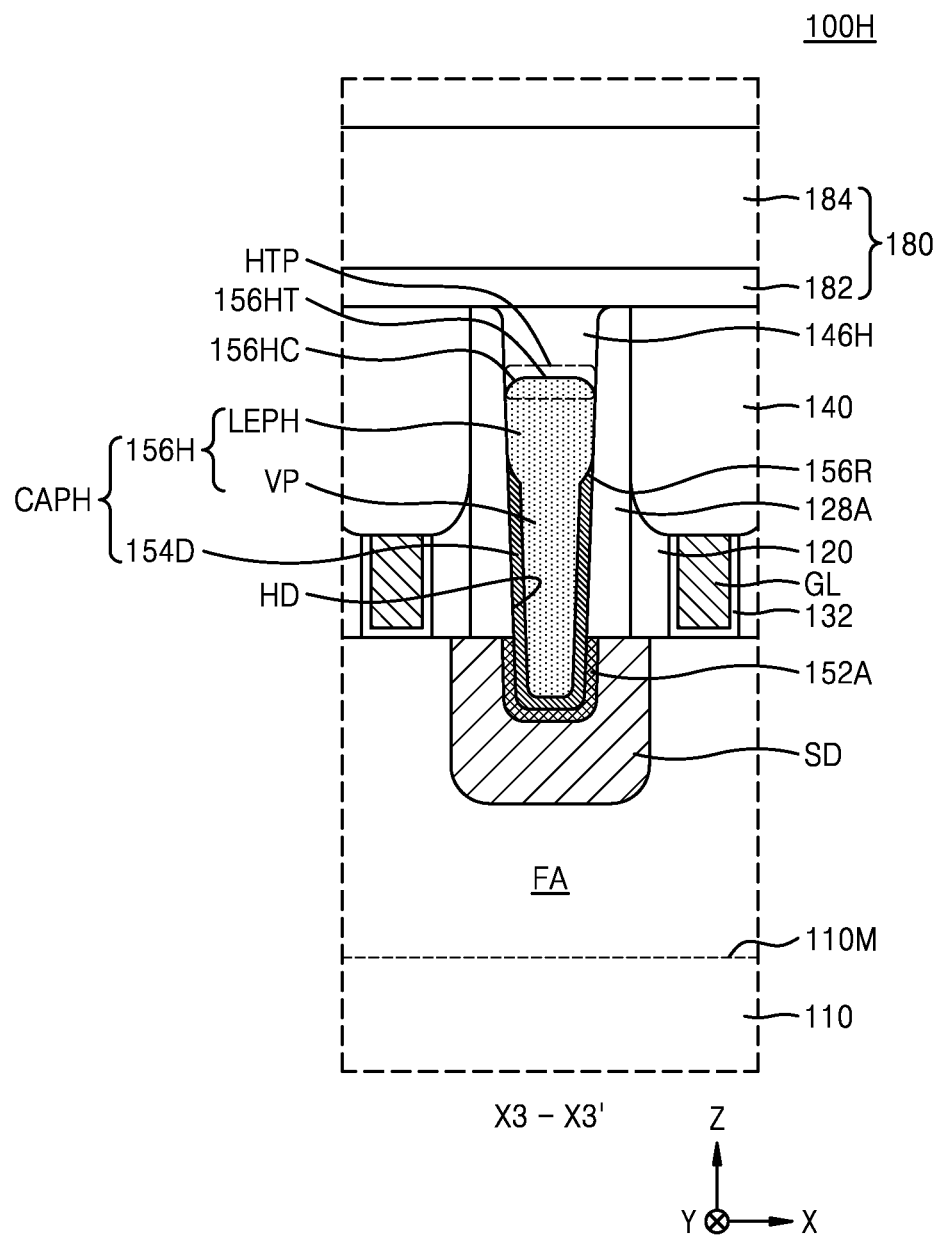
FIG. 3H is an enlarged cross-sectional view of an integrated circuit device according to some embodiments of the present inventive concept.

FIG. 3H is a cross-sectional view of an integrated circuit device 100H according to some embodiments of the present inventive concept. In detail, FIG. 3H is an enlarged cross-sectional view corresponding to a cross-sectional view of the portion taken along the line X3-X3' in FIG. 1.

Referring to FIG. 3H, the integrated circuit device 100H may be substantially the same as or similar to the integrated circuit device 100E described with reference to FIG. 3E. However, the integrated circuit device 100H includes a source/drain contact pattern CAPH in the source/drain contact hole HD penetrating a lower interlayer insulating film 128A toward the source/drain region SD. A top surface of the source/drain contact pattern CAPH may be covered with a capping layer 146H in the source/drain contact hole HD.

The source/drain contact pattern CAPH may include the conductive barrier film 154D and a metal plug 156H. The metal plug 156H may include a lateral expansion portion LEPH in the source/drain contact hole HD, and a through portion VP integrally connected to the lateral expansion portion LEPH and vertically extending between the lateral expansion portion LEPH and the source/drain region SD. The lateral expansion portion LEPH of the metal plug 156H may include a protruding top portion HTP at a higher level than the conductive barrier film 154D of the source/drain contact pattern CAPH. The protruding top portion HTP may have a rounded corner 156HC in an outer edge thereof, and a top surface portion 156HT substantially in the middle of the protruding top portion HTP in the first horizontal direction (the X direction). In example embodiments, the top surface portion 156HT may extend substantially evenly in a direction parallel to the main surface 110M of the substrate 110. In example embodiments, the top surface portion 156HT of the protruding top portion HTP may extend not evenly but in a curved shape in the first horizontal direction (the X direction). The detailed configuration of the metal plug 156H is substantially the same as or similar to that of the metal plug 156E of the integrated circuit device 100E described with reference to FIG. 3E.

The capping layer 146H and the lower interlayer insulating film 128A may be covered with the etch stop film 182 of the insulating structure 180. The capping layer 146H may be interposed between a topmost surface of the metal plug 156H and the etch stop film 182. Sidewalls of the capping layer 146H may be covered with the lower interlayer insulating film 128A defining the source/drain contact hole HD. The capping layer 146H may include, for example, a silicon carbide film, a silicon nitride film, a silicon oxide film, or a combination thereof.

Figure 4A:
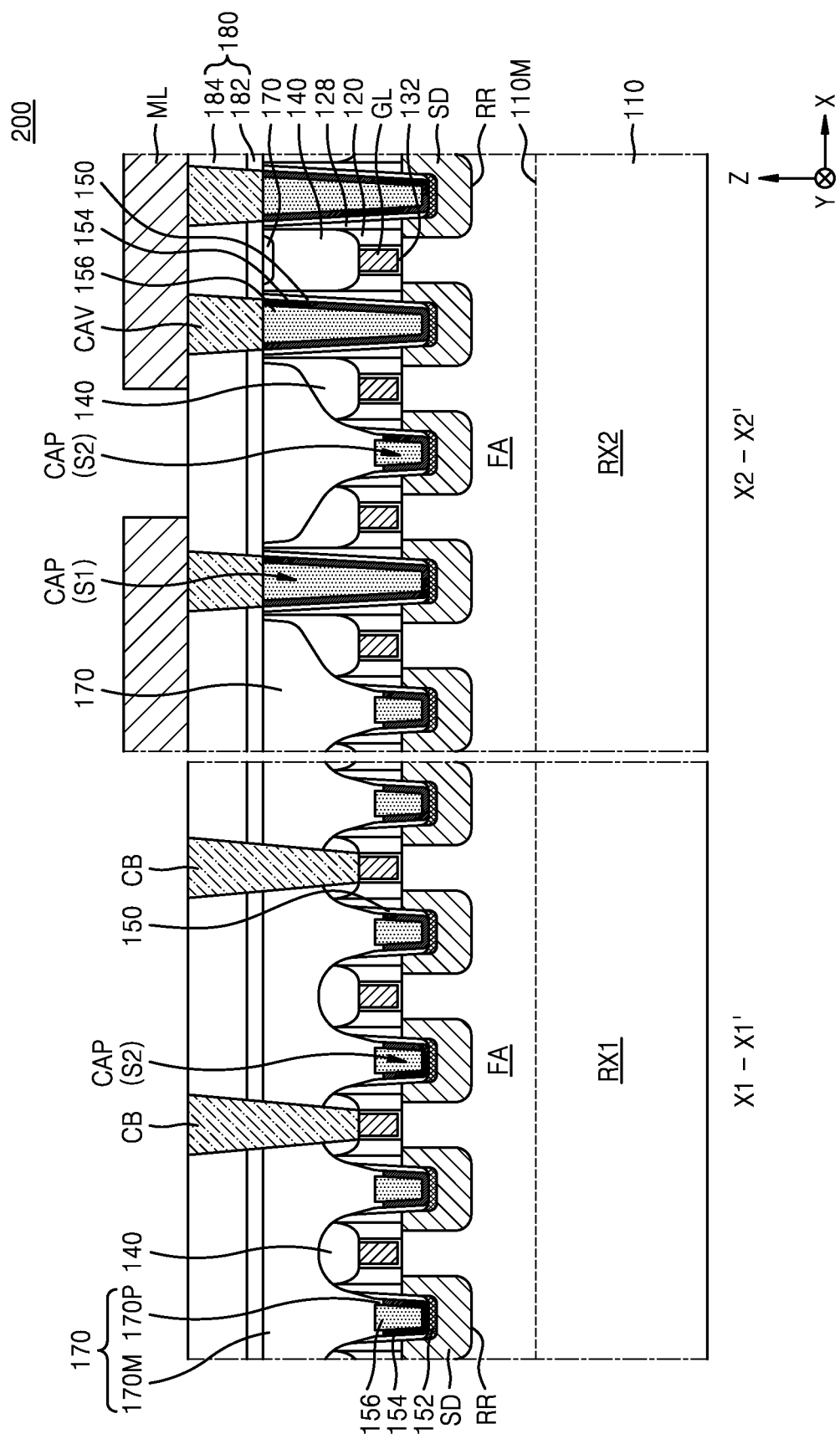
FIGS. 4A and 4B are cross-sectional views of an integrated circuit device according to some embodiments of the present inventive concept.
Figure 4B:
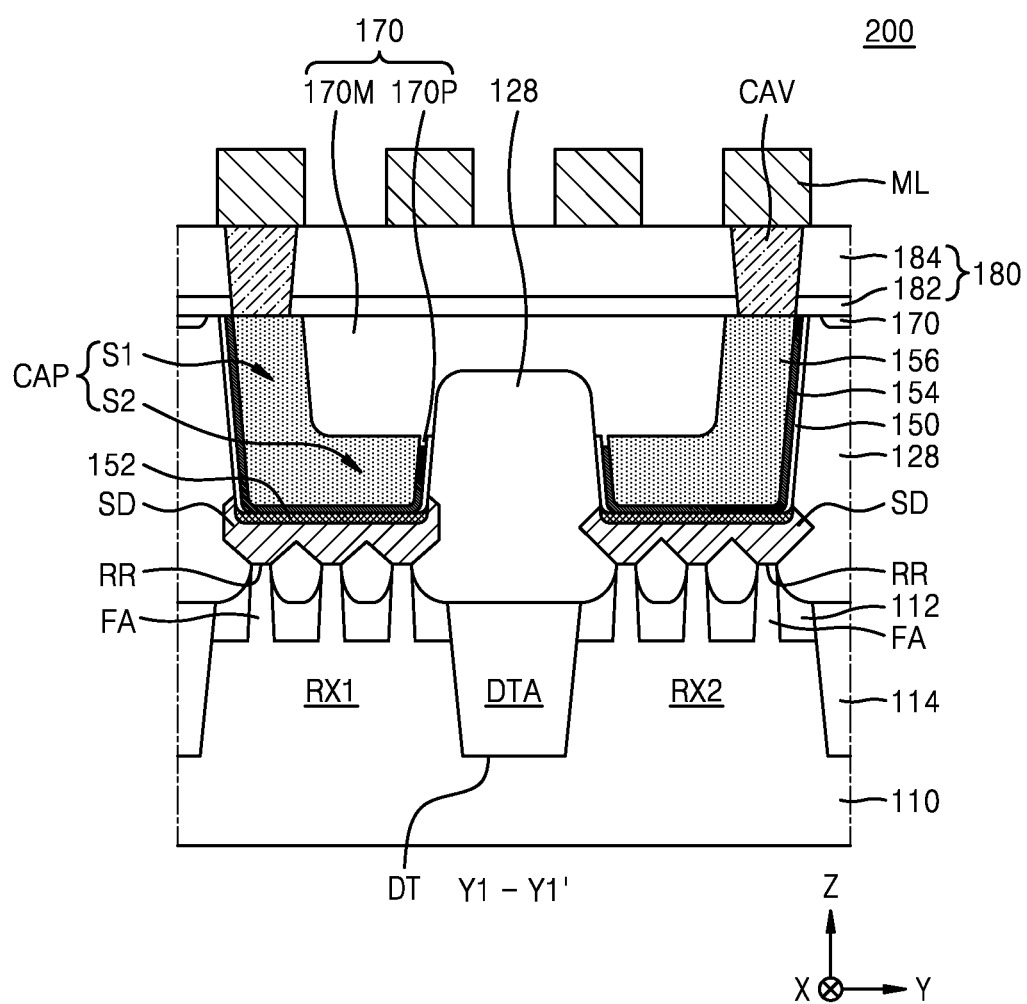

FIGS. 4A and 4B are cross-sectional views of an integrated circuit device 200 according to some embodiments of the present inventive concept. FIG. 4A shows cross-sectional views of the integrated circuit device 200 taken along the line X1-X1' and the line X2-X2' in FIG. 1, and FIG. 4B shows a cross-section view of the integrated circuit device 200 taken along the line Y1-Y1' in FIG. 1.

Referring to FIGS. 4A and 4B, the integrated circuit device 200 may be substantially the same as or similar to the integrated circuit device 100 described with reference to FIGS. 1 through 2D. However, the integrated circuit device 200 includes a plurality of conductive lines ML, which extend on the via contacts CAV in a direction crossing a plurality of gate lines GL.

Some of the conductive lines ML may each be connected to a source/drain region SD through a via contact CAV and a source/drain contact pattern CAP. Although not shown, others of the conductive lines ML may each be connected to a gate line GL through a gate contact CB.

The conductive lines ML may be formed at the same level as the ground line VSS and the power supply line VDD on the substrate 110. The conductive lines ML may include a plurality of unidirectional wiring layers extending in the first horizontal direction (the X direction) to be parallel to each other. Each of the conductive lines ML may include a conductive barrier film and a wiring conductive layer. The conductive barrier film may include, for example, Ti, Ta, TiN, TaN, or a combination thereof. The wiring conductive layer may include, for example, Co, Cu, W, an alloy thereof, or a combination thereof.

Figure 5A:
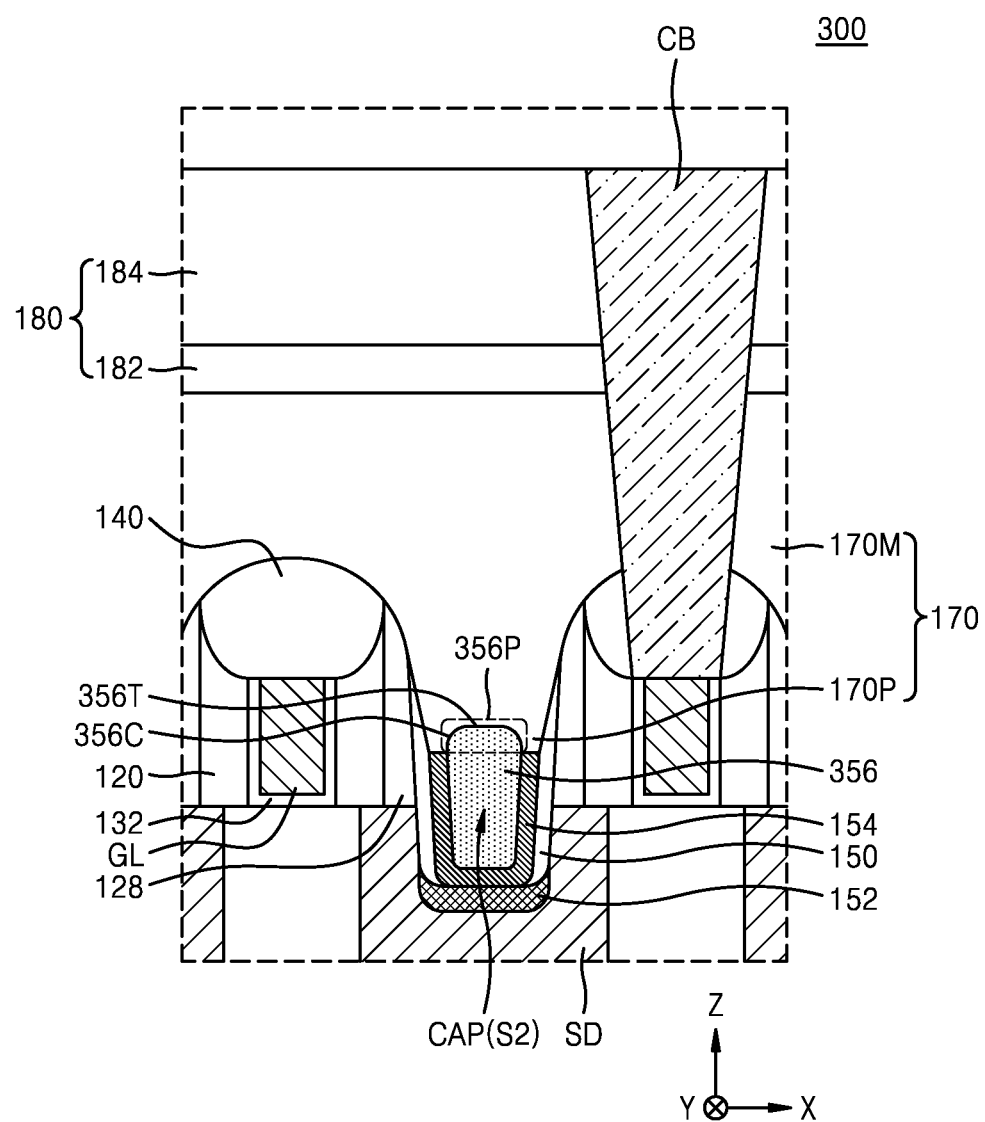
FIGS. 5A and 5B are cross-sectional views of an integrated circuit device according to some embodiments of the present inventive concept.
Figure 5B:
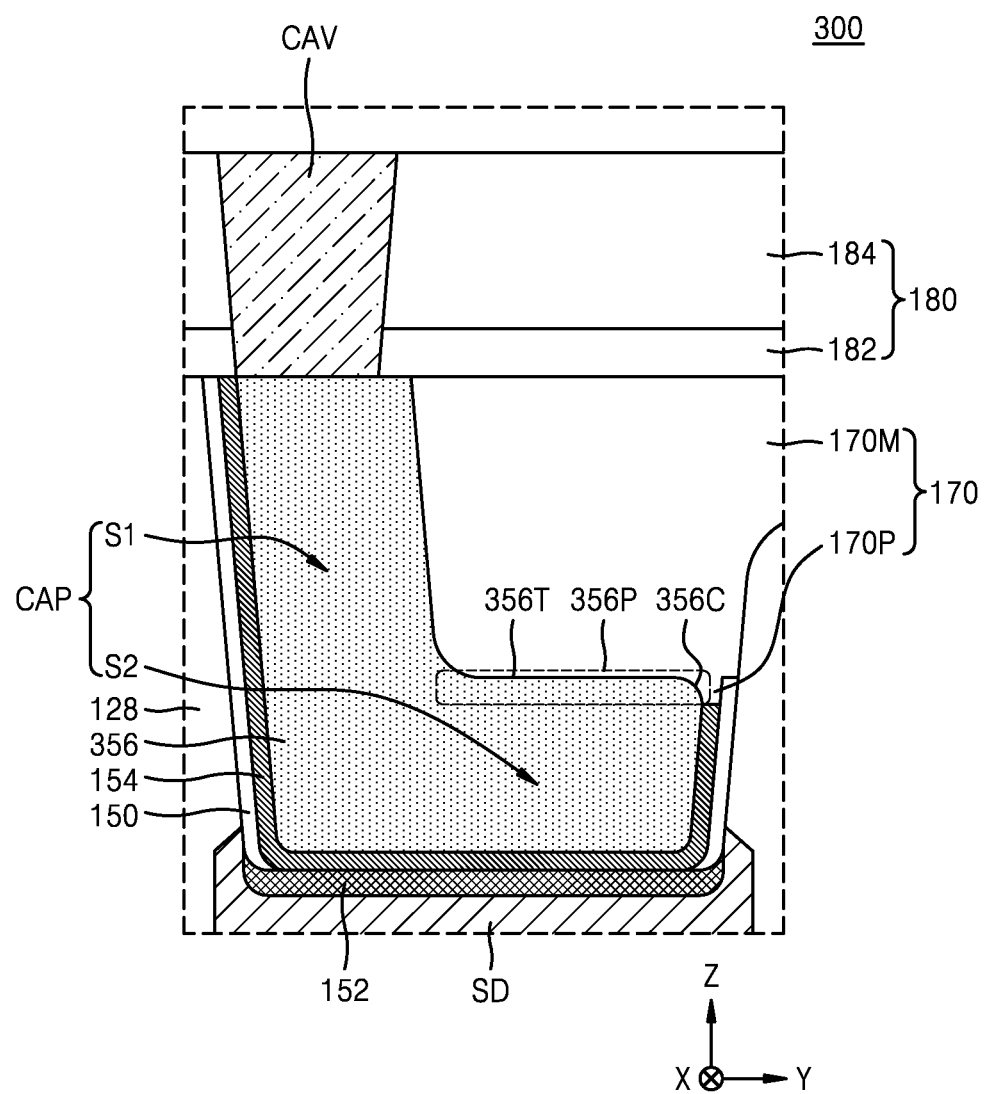

FIGS. 5A and 5B are cross-sectional views of an integrated circuit device 300 according to some embodiments of the present inventive concept. In detail, FIG. 5A is an enlarged cross-sectional view of the region C1 in FIG. 1 taken along the line X1-X1' in FIG. 1, and FIG. 5B is an enlarged cross-sectional view of the region C1 in FIG. 1 taken along the line Y1-Y1' in FIG. 1.

Referring to FIGS. 5A and 5B, the integrated circuit device 300 may be substantially the same as or similar to the integrated circuit device 100 described with reference to FIGS. 1 through 2D. However, a source/drain contact pattern CAP of the integrated circuit device 300 includes a metal plug 356 instead of the metal plug 156. The metal plug 356 may include a protruding top portion 356P at a higher level than the conductive barrier film 154 in the second segment S2 of the source/drain contact pattern CAP. The protruding top portion 356P may have a rounded corner 356C in an outer edge thereof. A top surface portion 356T substantially in the middle of the protruding top portion 356P in the first horizontal direction (the X direction) may extend substantially evenly in a direction parallel to the main surface 110M of the substrate 110. The detailed configuration of the metal plug 356 is substantially the same as or similar to that of the metal plug 156 of the integrated circuit device 100 described with reference to FIGS. 1 through 2D.

Figure 6A:
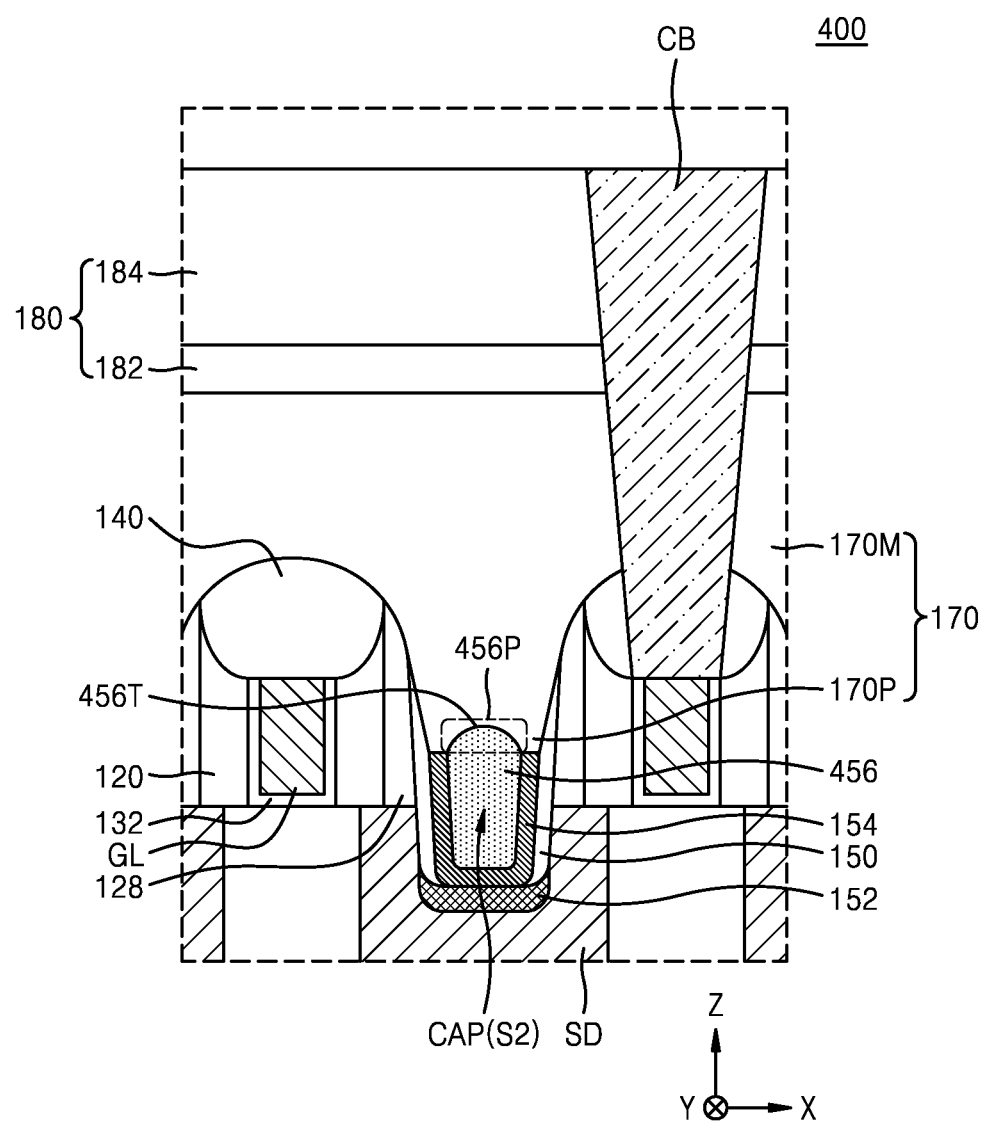
FIGS. 6A and 6B are cross-sectional views of an integrated circuit device according to some embodiments of the present inventive concept.
Figure 6B:
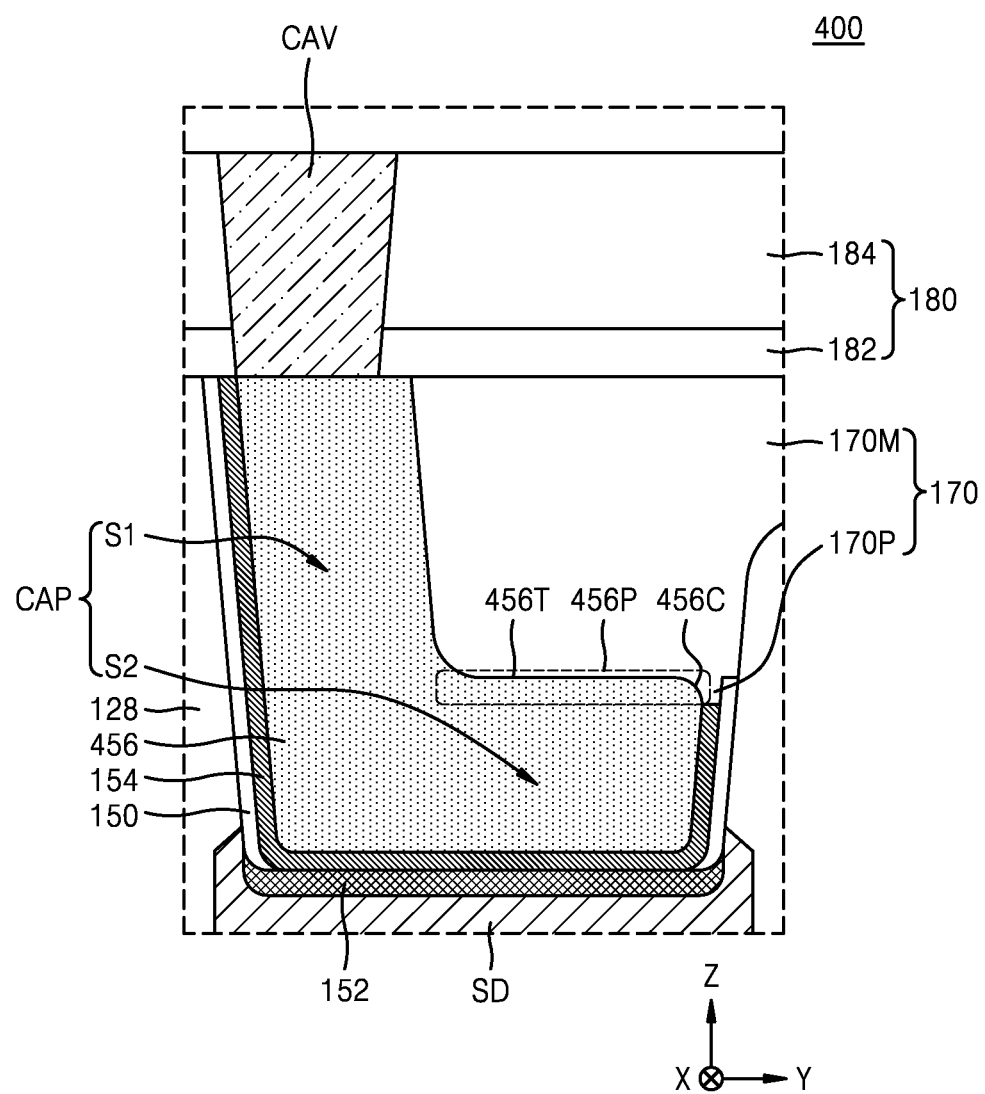

FIGS. 6A and 6B are cross-sectional views of an integrated circuit device 400 according to some embodiments of the present inventive concept. In detail, FIG. 6A is an enlarged cross-sectional view of the region C1 in FIG. 1 taken along the line X1-X1' in FIG. 1, and FIG. 6B is an enlarged cross-sectional view of the region C1 in FIG. 1 taken along the line Y1-Y1' in FIG. 1.

Referring to FIGS. 6A and 6B, the integrated circuit device 400 may be substantially the same as or similar to the integrated circuit device 100 described with reference to FIGS. 1 through 2D. However, the source/drain contact pattern CAP of the integrated circuit device 400 includes a metal plug 456 instead of the metal plug 156. The metal plug 456 may include a protruding top portion 456P at a higher level than the conductive barrier film 154 in the second segment S2 of the source/drain contact pattern CAP. The protruding top portion 456P may have a top surface portion 456T, which bulges in a direction away from the substrate 110. The top surface portion 456T of the protruding top portion 456P may extend not evenly but in a curved shape in the first horizontal direction (the X direction). The protruding top portion 456P may have a rounded corner 456C in an outer edge thereof in the second horizontal direction (the Y direction). The detailed configuration of the metal plug 456 may be substantially the same as or similar to that of the metal plug 156 of the integrated circuit device 100 described with reference to FIGS. 1 through 2D.

Figure 7A:
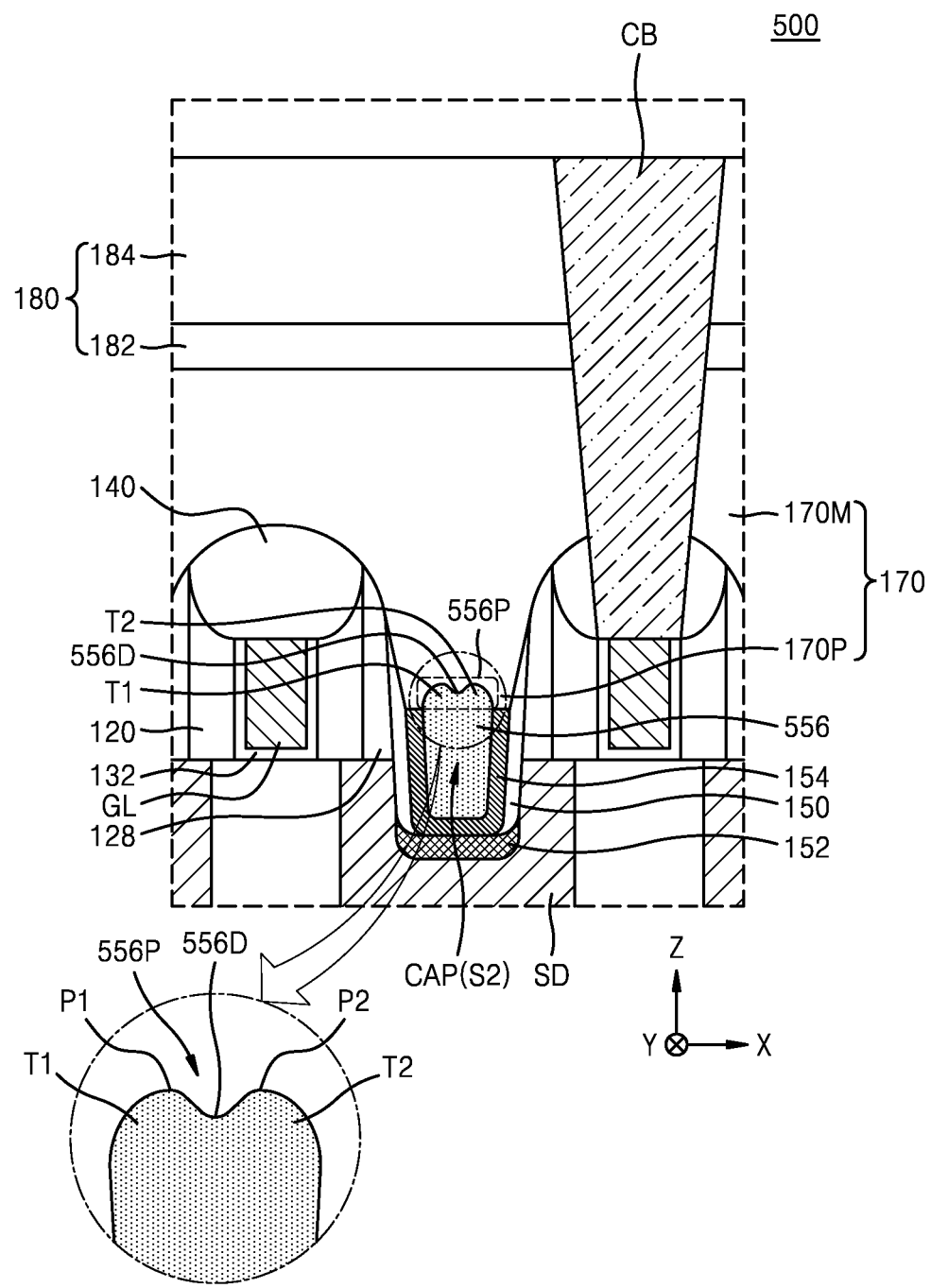
FIGS. 7A and 7B are cross-sectional views of an integrated circuit device according to some embodiments of the present inventive concept.
Figure 7B:
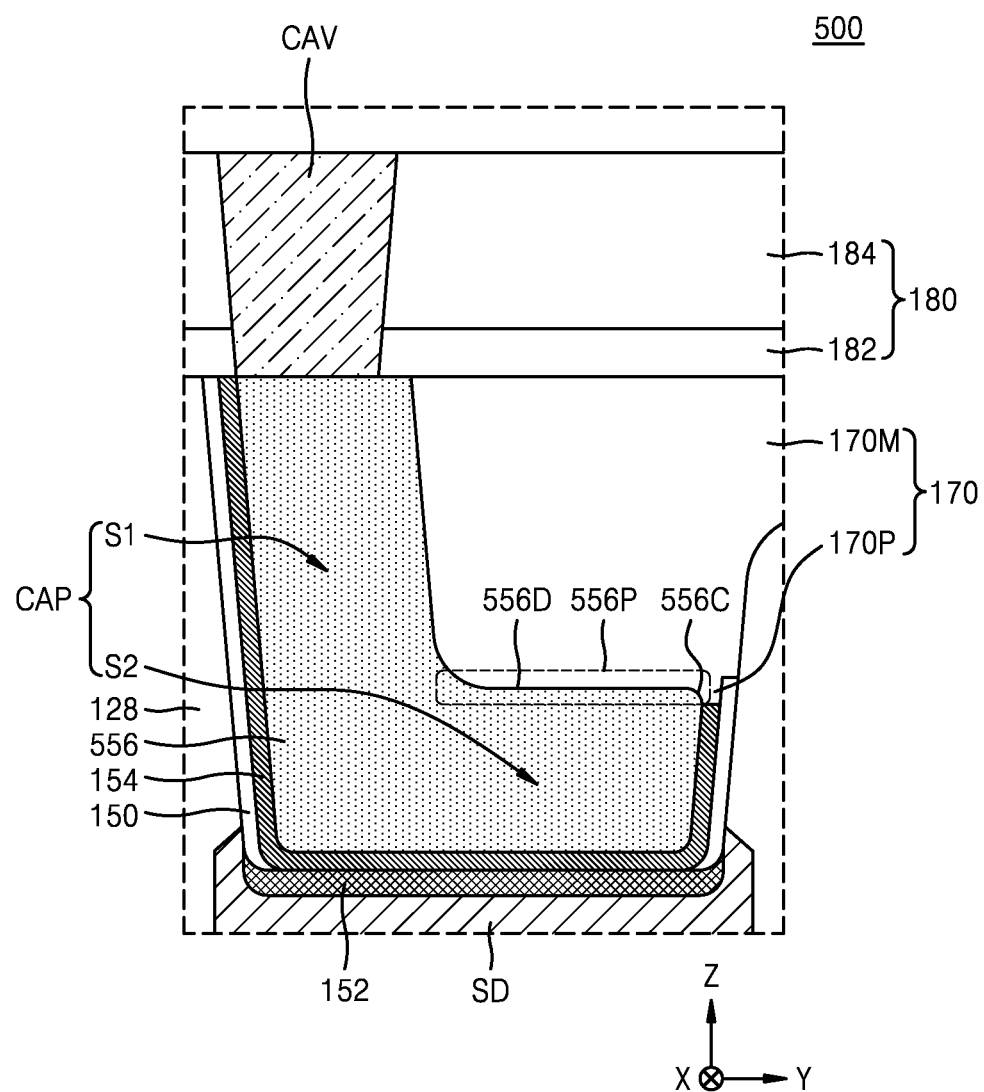

FIGS. 7A and 7B are cross-sectional views of an integrated circuit device 500 according to some embodiments of the present inventive concept. In detail, FIG. 7A is an enlarged cross-sectional view of the region C1 in FIG. 1 taken along the line X1-X1' in FIG. 1, and FIG. 7B is an enlarged cross-sectional view of the region C1 in FIG. 1 taken along the line Y1-Y1' in FIG. 1.

Referring to FIGS. 7A and 7B, the integrated circuit device 500 may be substantially the same as or similar to the integrated circuit device 100 described with reference to FIGS. 1 through 2D. However, the source/drain contact pattern CAP of the integrated circuit device 500 includes a metal plug 556 instead of the metal plug 156. The metal plug 556 may include a protruding top portion 556P at a higher level than the conductive barrier film 154 in the second segment S2 of the source/drain contact pattern CAP. The protruding top portion 556P may have a double-humped protrusion, which bulges in a direction away from the substrate 110.

In detail, the protruding top portion 556P may include a double-humped protrusion, which includes a first hump T1 and a second hump T2, which bulge in the direction away from the substrate 110. An indentation 556D may be between the first hump T1 and the second hump T2. Opposite sidewalls of the first hump Ti of the protruding top portion 556P may be symmetric or asymmetric with respect to a first peak P1. Opposite sidewalls of the second hump T2 may be symmetric or asymmetric with respect to a second peak P2. A level of the first peak P1 may be equal or similar to a level of the second peak P2 in the vertical direction (the Z direction). In some embodiments, the first peak P1 and the second peak P2 may be equidistant from the substrate 110.

The protruding top portion 556P may have a rounded corner 556C in an outer edge in the second horizontal direction (the Y direction). The indentation 556D of the protruding top portion 556P may extend substantially evenly in the second horizontal direction (the Y direction). The detailed configuration of the metal plug 556 is substantially the same as that of the metal plug 156 of the integrated circuit device 100 described with reference to FIGS. 1 through 2D.

In the integrated circuit devices 300, 400, and 500 illustrated in FIGS. 5A through 7B, the metal plugs 356, 456, and 556 of the second segment S2 of the source/drain contact pattern CAP may respectively include the protruding top portions 356P, 456P, and 556P at a higher level than the conductive barrier film 154 in the second segment S2, each of the protruding top portions 356P, 456P, and 556P may include the rounded corner 356C, 456C, or 556C in the outer edge thereof, the top surface portions 356T, 456T, and 556T that may be flat (e.g., substantially planar), may bulge, or may include a double-humped protrusion including the first hump T1 and the second hump T2. Accordingly, even when each of some gate contacts CB is arranged to be adjacent to the second segment S2 of the source/drain contact pattern CAP, a separation distance between the second segment S2 of the source/drain contact pattern CAP and an adjacent gate contact CB in the first horizontal direction (the X direction) may be sufficiently secured. Therefore, even when the gate contact CB and the second segment S2 of the source/drain contact pattern CAP are arranged to be adjacent to each other, an insulation margin between the gate contact CB and the source/drain contact pattern CAP may be more easily secured, thereby reducing or preventing an undesirable short-circuit between the gate contact CB and the source/drain contact pattern CAP.

Figure 8A:
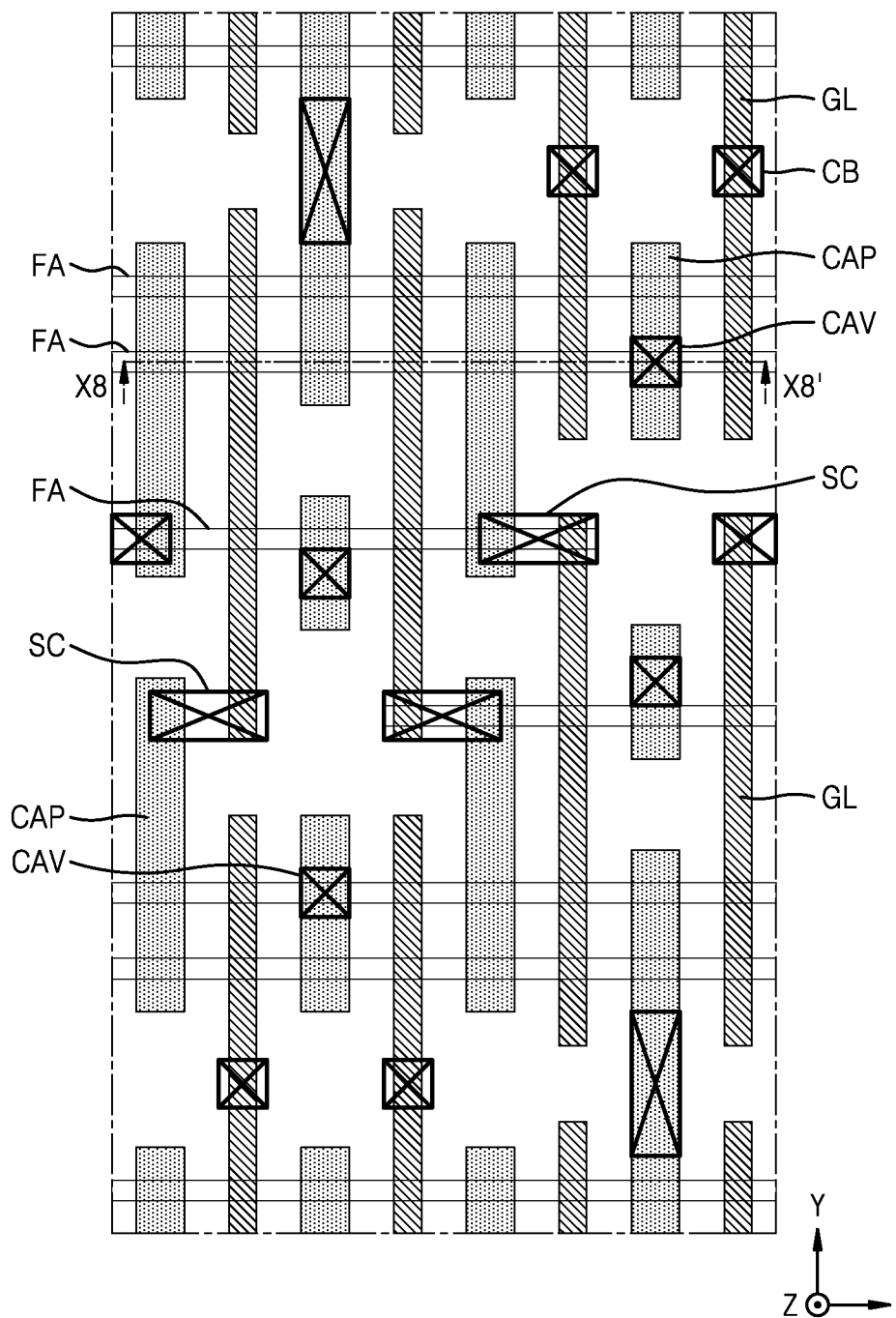
FIG. 8A is a layout of an integrated circuit device according to some embodiments of the present inventive concept.
Figure 8B:
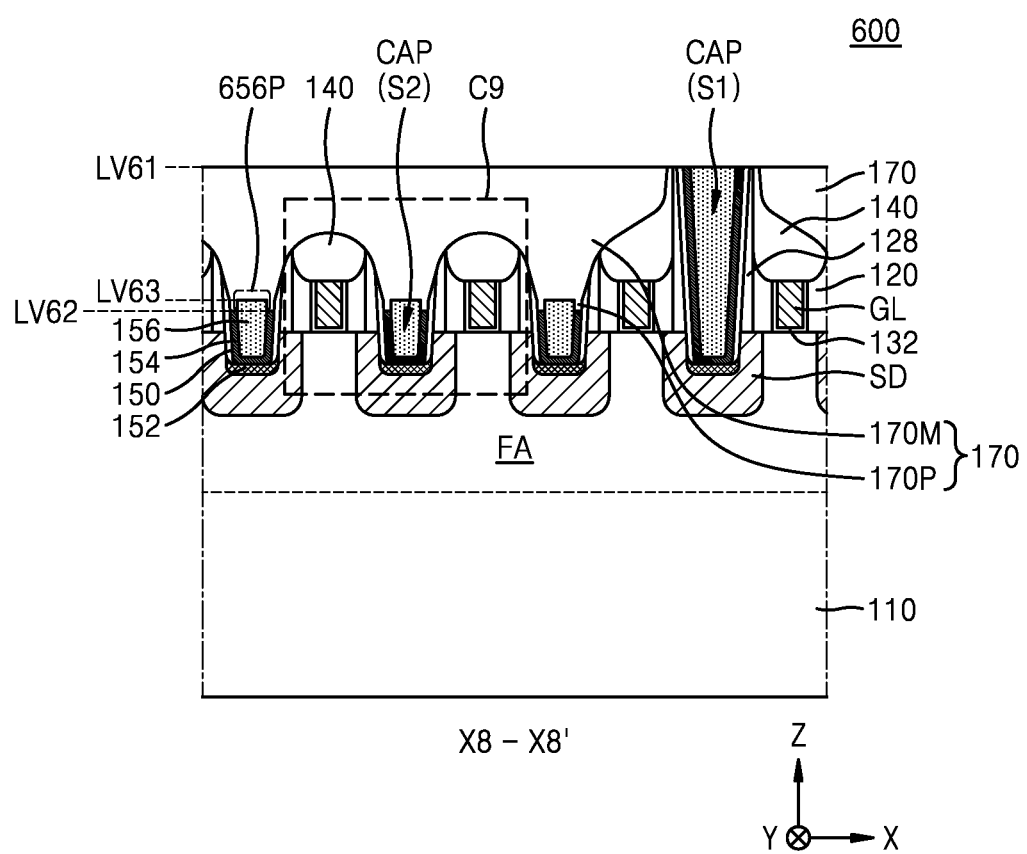
FIG. 8B is a cross-sectional view taken along line X8-X8' in FIG. 8A.

FIGS. 8A and 8B are diagrams of an integrated circuit device 600 according to some embodiments of the present inventive concept, wherein FIG. 8A is a layout of the integrated circuit device 600, and FIG. 8B is a cross-sectional view taken along line X8-X8' in FIG. 8A. In FIGS. 1 through 2D and FIGS. 8A and 8B, like reference numerals denote like elements, and detailed descriptions thereof may be omitted. The integrated circuit device 600 illustrated in FIGS. 8A and 8B may include an SRAM array including a plurality of SRAM cells arranged in a matrix on the substrate 110.

Referring to FIGS. 8A and 8B, the integrated circuit device 600 includes a plurality of fin-type active regions FA, which extend in the first horizontal direction (the X direction) to be parallel to each other, and a plurality of gate lines GL, which extend on the fin-type active regions FA in the second horizontal direction (the Y direction) to be parallel to each other. Transistors may be formed at respective intersections between the fin-type active regions FA and the gate lines GL. The integrated circuit device 600 may include a plurality of shared contacts SC each being connected to a gate line GL and a source/drain region SD.

In the integrated circuit device 600, each of the source/drain contact patterns CAP may include the conductive barrier film 154 and the metal plug 156. Each of the source/drain contact patterns CAP may include the first segment S1 and the second segment S2, which respectively have different heights in the vertical direction (the Z direction) and are integrally connected to each other. In each of the source/drain contact patterns CAP, the conductive barrier film 154 and the metal plug 156 may extend across the first segment S1 and the second segment S2 to be included in the first segment S1 and the second segment S2.

In the first segment S1 of each of the source/drain contact patterns CAP, the top surface of the conductive barrier film 154 may be coplanar with the top surface of the metal plug 156 at a vertical level LV61. In the second segment S2 of each of the source/drain contact patterns CAP, a vertical level LV62 of the topmost surface of the conductive barrier film 154 is lower than a vertical level LV63 of the topmost surface of the metal plug 156. A height difference between the vertical level LV63 of the topmost surface of the metal plug 156 and the vertical level LV62 of the topmost surface of the conductive barrier film 154 in the second segment S2 may be about 1 nm to about 5 nm, for example, about 2 nm to about 3 nm.

In the second segment S2 of each of the source/drain contact patterns CAP, the metal plug 156 may include a protruding top portion 656P at a level higher than the vertical level LV62 of the topmost surface of the conductive barrier film 154. In the second segment S2 of each of the source/drain contact patterns CAP, a sidewall of the protruding top portion 656P of the metal plug 156 may not be covered with the conductive barrier film 154.

Similar to the protruding top portion 156P illustrated in FIGS. 2C and 2D, the protruding top portion 656P may have a flat top surface (e.g., a substantially planar top surface). However, embodiments are not limited thereto. For example, the metal plug 156 of the integrated circuit device 600 may include, instead of the protruding top portion 656P, a protruding top portion having a shape the same as or similar to one of the protruding top portions 356P, 456P, and 556P illustrated in FIGS. 5A through 7B.

The buried insulating film 170 may cover the top surface of the second segment S2 of each of the source/drain contact patterns CAP and the top surface of the insulating capping line 140. The buried insulating film 170 may include the main buried portion 170M and the buried protrusion 170P protruding from the main buried portion 170M toward the substrate 110. The main buried portion 170M may be in contact with the top surface of the metal plug 156 included in each of a plurality of second segments S2, a portion of the intergate insulating film 128, and a plurality of insulating capping lines 140. The buried protrusion 170P may be on the second segment S2 of each of the source/drain contact patterns CAP to be in contact with the topmost surface of the conductive barrier film 154. The buried protrusion 170P may also be in contact with the sidewall of the protruding top portion 656P of the metal plug 156. The buried protrusion 170P may fill a space, which is defined by the topmost surface of the conductive barrier film 154 of the second segment S2, the sidewall of the protruding top portion 656P of the metal plug 156, and the contact insulating spacer 150.

The buried insulating film 170 may have a planarized top surface. The buried insulating film 170 may include a portion filling a space above the second segment S2 of each of the source/drain contact patterns CAP among the gate lines GL. The top surface of the buried insulating film 170 may be coplanar with the topmost surfaces of the conductive barrier film 154 and the metal plug 156, which are included in the first segment S1 of each of the source/drain contact patterns CAP, may be substantially at the vertical level LV61.

The integrated circuit device 600 includes the metal plug 156, which includes the protruding top portion 656P in the second segment S2 of a source/drain contact pattern CAP. The sidewall of the protruding top portion 656P may be covered with the buried protrusion 170P of the buried insulating film 170. Accordingly, a separation distance from the conductive barrier film 154 and the metal plug 156, which form the second segment S2, to another conductive region adjacent to the second segment S2 may be secured at least by the buried protrusion 170P. Therefore, an insulation margin between the second segment S2 of the source/drain contact pattern CAP and an adjacent conductive region may be secured, thereby reducing or preventing an undesirable short-circuit between the second segment S2 and the adjacent conductive region and increasing the reliability of the integrated circuit device 600.

Figure 9:
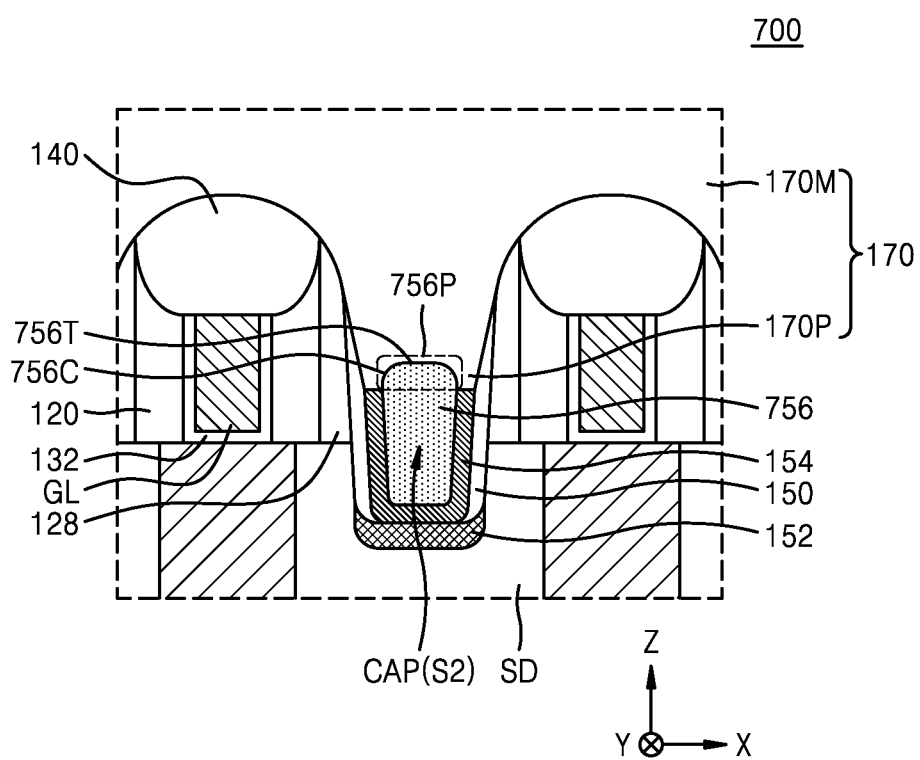
FIG. 9 is a cross-sectional view of an integrated circuit device according to some embodiments of the present inventive concept.

FIG. 9 is a cross-sectional view of an integrated circuit device 700 according to some embodiments of the present inventive concept. FIG. 9 illustrates an enlarged cross-sectional view of a portion corresponding to region C9 in FIG. 8B.

Referring to FIG. 9, the integrated circuit device 700 may be substantially the same as or similar to the integrated circuit device 600 described with reference to FIGS. 8A and 8B. However, the integrated circuit device 700 includes a metal plug 756 instead of the metal plug 156 in the source/drain contact pattern CAP. The metal plug 756 may include a protruding top portion 756P at a higher level than the conductive barrier film 154 in the second segment S2 of the source/drain contact pattern CAP. The protruding top portion 756P may have a rounded corner 756C in an outer edge. A top surface portion 756T substantially in the middle of the protruding top portion 756P in the first horizontal direction (the X direction) may extend substantially evenly in a direction parallel to the main surface 110M of the substrate 110. However, embodiments are not limited thereto. For example, the protruding top portion 756P may have a bulging curved shape like the protruding top portion 456P described with reference to FIGS. 6A and 6B. In another example, the protruding top portion 756P may include a double-humped protrusion, which bulges in a direction away from the substrate 110, like the protruding top portion 556P described with reference to FIGS. 7A and 7B. The detailed configuration of the metal plug 756 may be substantially the same as or similar to that of the metal plug 156 of the integrated circuit device 100 described with reference to FIGS. 1 through 2D.

Figure 10A:
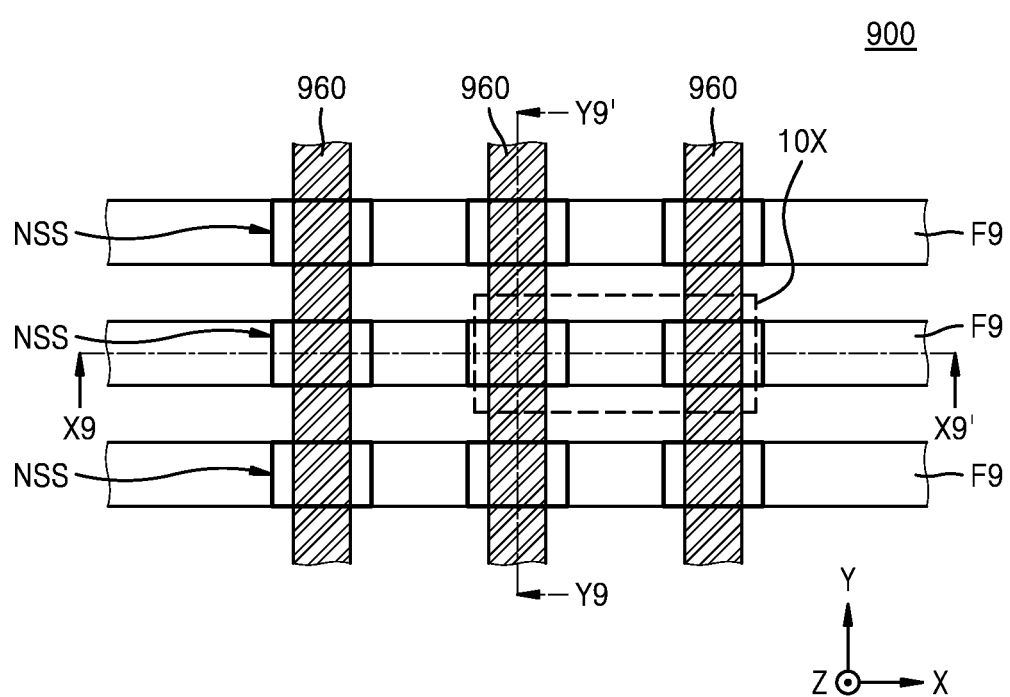
FIG. 10A is a layout of an integrated circuit device according to some embodiments of the present inventive concept.
Figure 10B:
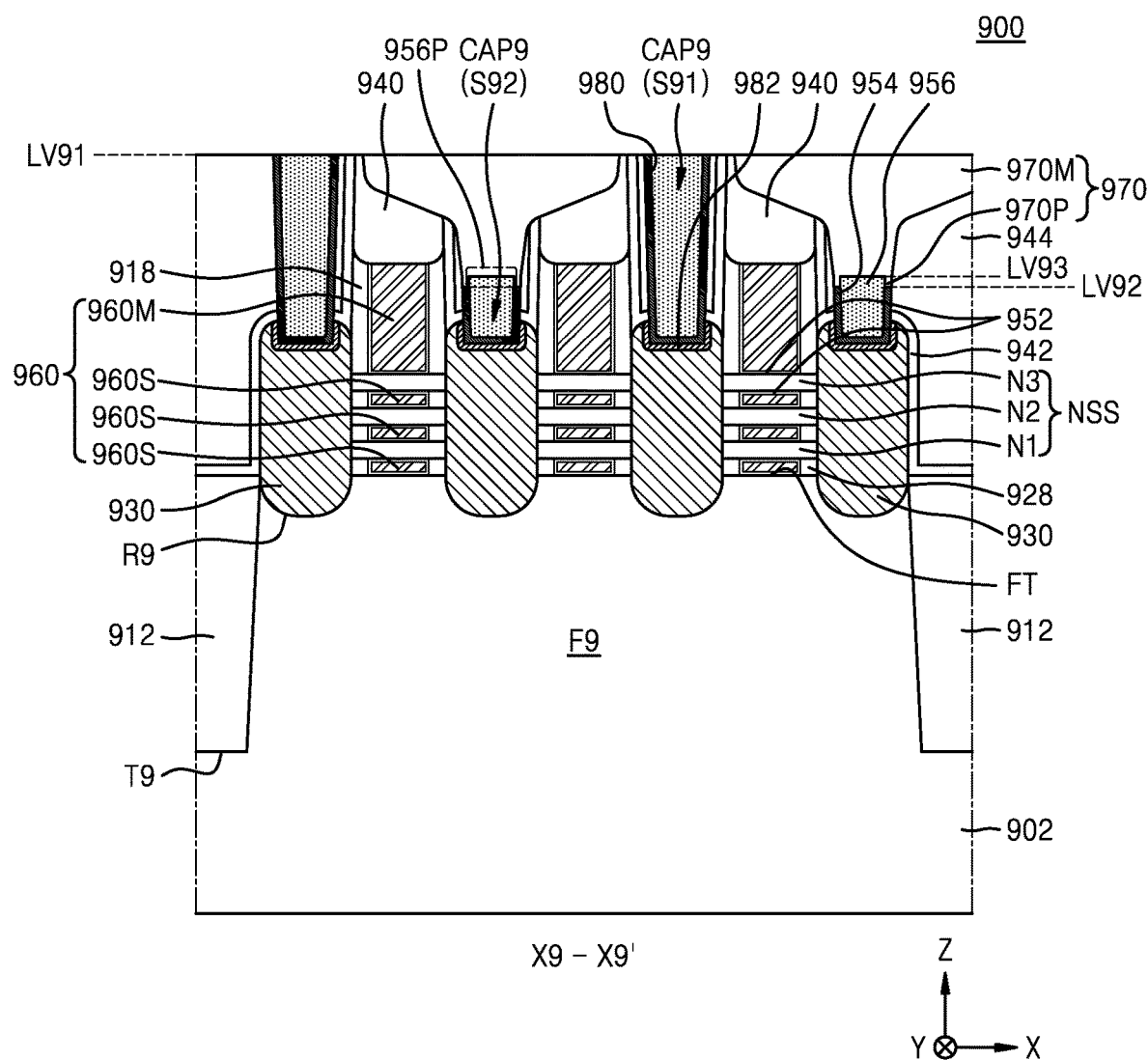
FIG. 10B is a cross-sectional view taken along line X9-X9' in FIG. 10A.
Figure 10C:
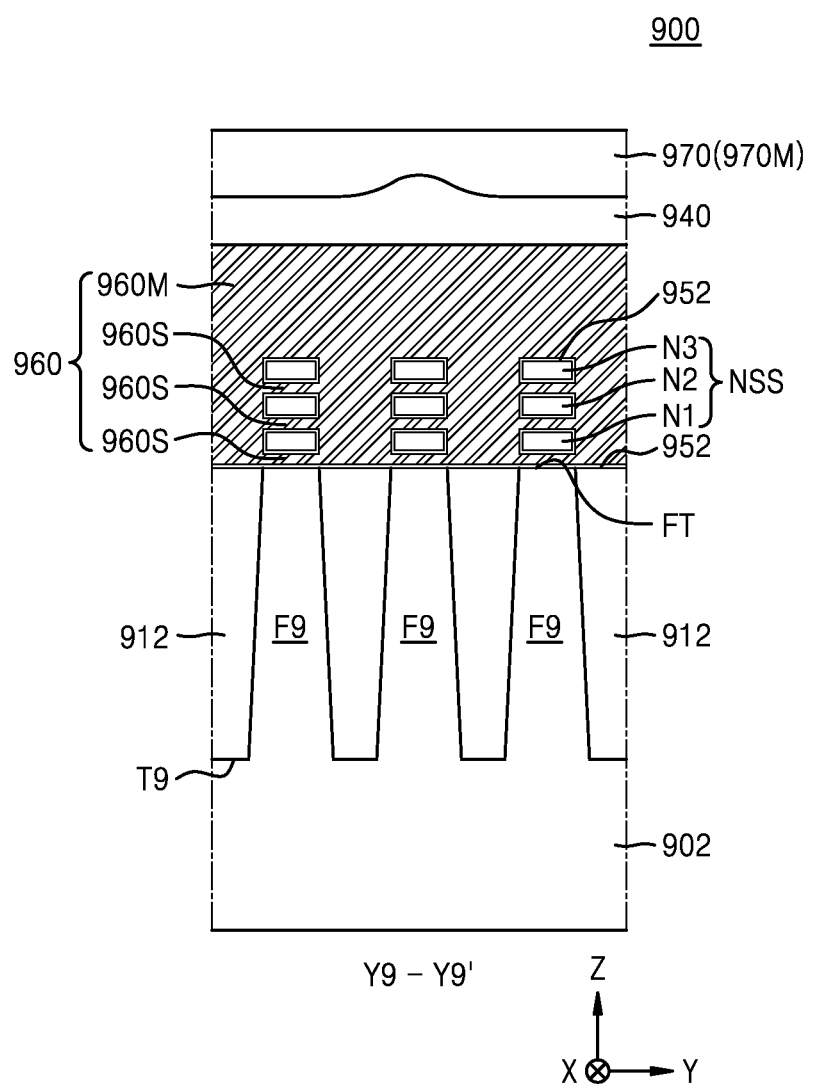
FIG. 10C is a cross-sectional view taken along line Y9-Y9' in FIG. 10A.

FIGS. 10A through 10C are diagrams of an integrated circuit device 900 according to some embodiments of the present inventive concept, wherein FIG. 10A is a layout of the integrated circuit device 900, FIG. 10B is a cross-sectional view taken along line X9-X9' in FIG. 10A, and FIG. 10C is a cross-sectional view taken along line Y9-Y9' in FIG. 10A.

Referring to FIGS. 10A through 10C, the integrated circuit device 900 includes a plurality of fin-type active regions F9, which protrude from a substrate 902 and extend (e.g., extend longitudinally) in the first horizontal direction (e.g., the X direction), and a plurality of nanosheet stacks NSS, each of which is separated from the underlying fin-type active region F9 in the vertical direction (the Z direction) and faces a top surface FT of the fin-type active region F9. In this specification, the term "nanosheet" refers to a conductive structure having a cross-section substantially perpendicular to a direction in which current flows. It will be understood that the nanosheet includes a nanowire.

A trench T9 defining a plurality of fin-type active regions F9 may be formed in the substrate 902 and filled with an isolation film 912. The substrate 902, the fin-type active regions F9, and the isolation film 912 may be the same as or similar to the substrate 110, the fin-type active regions FA, and the isolation film 112, which are illustrated in FIGS. 2A and 2B, respectively.

A plurality of gate lines 960 extend on the fin-type active regions F9 in the second horizontal direction (the Y direction). Each of the nanosheet stacks NSS may be above the top surface FT of one of the fin-type active regions F9 at an intersection between one of the fin-type active regions F9 and one of the gate lines 960, may face the top surface FT of one of the fin-type active regions F9, and may be at a position separated from one of the fin-type active regions F9. A plurality of nanosheet transistors may be formed at respective intersections between the fin-type active regions F9 and the gate lines 960 on the substrate 902.

Each of the nanosheet stacks NSS may include a plurality of nanosheets, which overlap each other in the vertical direction (the Z direction) above the top surface FT of one of the fin-type active regions F9. The nanosheets may include a first nanosheet N1, a second nanosheet N2, and a third nanosheet N3, which respectively have different vertical distances from the top surface FT of each of the fin-type active regions F9. As used herein, "an element A overlaps an element B in a vertical direction" (or similar language) may mean that at least one vertical line intersecting both the elements A and B exists.

Although FIG. 10A show the nanosheet stacks NSS having a rectangular shape, embodiments are not limited thereto. The nanosheet stacks NSS may have various shapes in a plan view according to shapes of the fin-type active regions F9 and the gate lines 960. Further, although FIGS. 10A, 10B, and 10C show that a plurality of nanosheet stacks NSS and a plurality of gate lines 960 are formed on one fin-type active region F9 and the nanosheet stacks NSS are arranged on the fin-type active region F9 along the first horizontal direction (the X direction), the present inventive concept is not limited thereto. The number of nanosheet stacks NSS on one fin-type active region F9 is not particularly limited. For example, one nanosheet stack NSS may be formed on one fin-type active region F9. Still further, although FIGS. 10B and 10C show that each of the nanosheet stacks NSS includes three nanosheets, embodiments are not limited thereto. For example, each of the nanosheet stacks NSS may include at least two nanosheets (e.g., two, four or more), and the number of nanosheets included in each nanosheet stack NSS is not particularly limited.

Each of the first, second, and third nanosheets N1, N2, and N3 may have a channel region. As used herein, the term "nanosheet" may also be referred to as a "channel region." In example embodiments, each of the first, second, and third nanosheets N1, N2, and N3 may include, for example, a Si layer, a SiGe layer, or a combination thereof.

A plurality of recess regions R9 may be formed in an upper portion of the fin-type active region F9, and a plurality of source/drain regions 930 may be formed in the recess regions R9. The source/drain regions 930 may include, for example, an epitaxially grown semiconductor layer. The source/drain regions 930 may be substantially the same as or similar to the source/drain regions SD described above with reference to FIGS. 2A and 2B. Each of the first, second, and third nanosheets N1, N2, and N3 may contact adjacent source/drain region 930 from among the plurality of source/drain regions 930.

The gate lines 960 may be on the fin-type active regions F9 to cover the nanosheet stacks NSS and surround each of the first, second, and third nanosheets N1, N2, and N3. Each of the gate lines 960 may include a main gate portion 960M, which extends (e.g., extends longitudinally) in the second horizontal direction (the Y direction) to cover the top surface of a nanosheet stack NSS, and a plurality of sub gate portions 960S, which are integrally connected to the main gate portion 960M and respectively between the third nanosheet N3 and the second nanosheet N2, between the second nanosheet N2 and the first nanosheet N1, and between the first nanosheet N1 and a fin-type active region F9. The first, second, and third nanosheets N1, N2, and N3 may have a gate-all-around (GAA) structure surrounded by a gate line 960. The gate line 960 may include, for example, a metal, a metal nitride, a metal carbide, or a combination thereof. The metal may be selected from, for example, Ti, W, Ru, Nb, Mo, Hf, Ni, Co, Pt, Yb, Tb, Dy, Er, and Pd. The metal nitride may be selected from, for example, TiN and TaN. The metal carbide may include, for example, TiAlC. A gate insulating film 952 may be between the nanosheet stack NSS and the gate line 960. The gate insulating film 952 may be substantially the same as or similar to the gate insulating film 132 described with reference to FIGS. 2A and 2B.

A metal silicide film 982 may be formed on the top surface of each of the source/drain regions 930. The metal silicide film 982 may be substantially the same as or similar to the metal silicide film 152 described with reference to FIGS. 2A and 2B. The metal silicide film 982 may be omitted.

Both sidewalls of each of the gate lines 960 may be covered with a plurality of outer insulating spacers 918. The outer insulating spacers 918 may be on a plurality of nanosheet stacks NSS to cover both sidewalls of the main gate portion 960M. The outer insulating spacers 918 and the source/drain regions 930 may be covered with an insulating liner 942. The outer insulating spacers 918 and the insulating liner 942 may include, for example, SiN, SiCN, SiBN, SiON, SiOCN, SiBCN, SiOC, $SiO_2$, or a combination thereof. The insulating liner 942 may be omitted.

A plurality of inner insulating spacers 928 are between the third nanosheet N3 and the second nanosheet N2, between the second nanosheet N2 and the first nanosheet N1, and between the first nanosheet N1 and the fin-type active region F9. Each of both sidewalls of each of the sub gate portions 960S may be covered with an inner insulating spacer 928 with the gate insulating film 952 between the sidewall of each sub gate portion 960S and the inner insulating spacer 928. A plurality of inner insulating spacers 928 may be between the sub gate portions 960S and a source/drain region 930. In example embodiments, the outer insulating spacers 918 and the inner insulating spacers 928 may include the same insulating material as each other. In example embodiments, the outer insulating spacers 918 and the inner insulating spacers 928 may include different insulating materials from each other. The inner insulating spacer 928 may include, for example, SiN, SiCN, SiBN, SiON, SiOCN, SiBCN, SiOC, $SiO_2$, or a combination thereof. The inner insulating spacer 928 may further include an air gap.

The insulating liner 942 may be covered with an intergate insulating film 944. The intergate insulating film 944 may include, for example, a silicon oxide film. A plurality of source/drain contact patterns CAP9 may be respectively in a plurality of contact holes 980, which pass through the intergate insulating film 944 and the insulating liner 942. Each of the source/drain contact patterns CAP9 may be connected to the source/drain region 930 through the metal silicide film 982. Each of the source/drain contact patterns CAP9 may include a conductive barrier film 954 and a metal plug 956. Each of the source/drain contact patterns CAP9 may include a first segment S91 and a second segment S92, which have different heights in the vertical direction (the Z direction) and are integrally connected to each other.

In each of the source/drain contact patterns CAP9, the conductive barrier film 954 and the metal plug 956 may extend across the first segment S91 and the second segment S92 to be included in the first segment S91 and the second segment S92.

In the first segment S91 of each of the source/drain contact patterns CAP9, the top surface of the conductive barrier film 954 may be coplanar with the top surface of the metal plug 956 at a vertical level LV91. In the second segment S92 of each of the source/drain contact patterns CAP9, a vertical level LV92 of the topmost surface of the conductive barrier film 954 is lower than a vertical level LV93 of the topmost surface of the metal plug 956. A height difference between the vertical level LV93 of the topmost surface of the metal plug 956 and the vertical level LV92 of the topmost surface of the conductive barrier film 954 in the second segment S92 may be about 1 nm to about 5 nm, for example, about 2 nm to about 3 nm.

In the second segment S92 of each of the source/drain contact patterns CAP9, the metal plug 956 may include a protruding top portion 956P at a level higher than the vertical level LV92 of the topmost surface of the conductive barrier film 954. In the second segment S92 of each of the source/drain contact patterns CAP9, a sidewall of the protruding top portion 956P of the metal plug 956 may not be covered with the conductive barrier film 954.

Similar to the protruding top portion 156P illustrated in FIGS. 2C and 2D, the protruding top portion 956P may have a flat top surface (e.g., a substantially planar top surface). However, embodiments are not limited thereto. For example, the metal plug 956 may include, instead of the protruding top portion 956P, a protruding top portion having a shape the same as or similar to one of the protruding top portions 356P, 456P, and 556P illustrated in FIGS. 5A through 7B.

The conductive barrier film 954 and the metal plug 956, which form each of the source/drain contact patterns CAP9, may be substantially the same as or similar to, respectively, the conductive barrier film 154 and the metal plug 156, which have been described with reference to FIGS. 2A through 2D. Each of the gate lines 960 may be covered with an insulating capping line 940. The insulating capping line 940 may have a different thickness at a different position. For example, the insulating capping line 940 may have a variable thickness in the first horizontal direction (the X direction). The insulating capping line 940 may be substantially the same as or similar to the insulating capping line 140 described with reference to FIGS. 2A and 2B.

A buried insulating film 970 may cover the top surface of the second segment S92 of each of the source/drain contact patterns CAP9 and the top surface of the insulating capping line 940. The buried insulating film 970 may be in contact with the top surface of the second segment S92 and the top surface of the insulating capping line 940.

The buried insulating film 970 may include a main buried portion 970M and a buried protrusion 970P protruding from the main buried portion 970M toward the substrate 902. The main buried portion 970M may be in contact with the top surface of the metal plug 956 included in each of a plurality of second segments S92, a portion of the insulating liner 942, a portion of the intergate insulating film 944, and a plurality of insulating capping lines 940. The buried protrusion 970P may be on the second segment S92 of each of the source/drain contact patterns CAP9 to be in contact with the top surface of the conductive barrier film 954. The buried protrusion 970P may also be in contact with the sidewall of the protruding top portion 956P of the metal plug 956. The buried protrusion 970P may fill a space, which is defined by the top surface of the conductive barrier film 954 of the second segment S92, the sidewall of the protruding top portion 956P of the metal plug 956, and a sidewall of the intergate insulating film 944.

The buried insulating film 970 may have a planarized top surface. The buried insulating film 970 may include a portion filling a space above the second segment S92 of each of the source/drain contact patterns CAP9 among the gate lines 960. The top surface of the buried insulating film 970 may be coplanar with the respective topmost surfaces of the conductive barrier film 954 and the metal plug 956, which are included in the first segment S91 of each of the source/drain contact patterns CAP9, and may be substantially at the vertical level LV91. The detailed configuration of the buried insulating film 970 may be the same as or similar to that of the buried insulating film 170 described above with reference to FIGS. 2A through 2D. The integrated circuit device 900 described with reference to FIGS. 10A through 10C includes the metal plug 956, which includes the protruding top portion 956P in the second segment S92 of each of the source/drain contact patterns CAP9. The sidewall of the protruding top portion 956P may be covered with the buried protrusion 970P of the buried insulating film 970. Accordingly, a separation distance from the conductive barrier film 954 and the metal plug 956, which form the second segment S92, to another conductive region adjacent to the second segment S92 may be secured at least by the buried protrusion 970P. Therefore, an insulation margin between the second segment S92 of each of the source/drain contact pattern CAP9 and an adjacent conductive region may be secured, thereby reducing or preventing an undesirable short-circuit between the second segment S92 and the adjacent conductive region and increasing the reliability of the integrated circuit device 900.

Figure 10D:
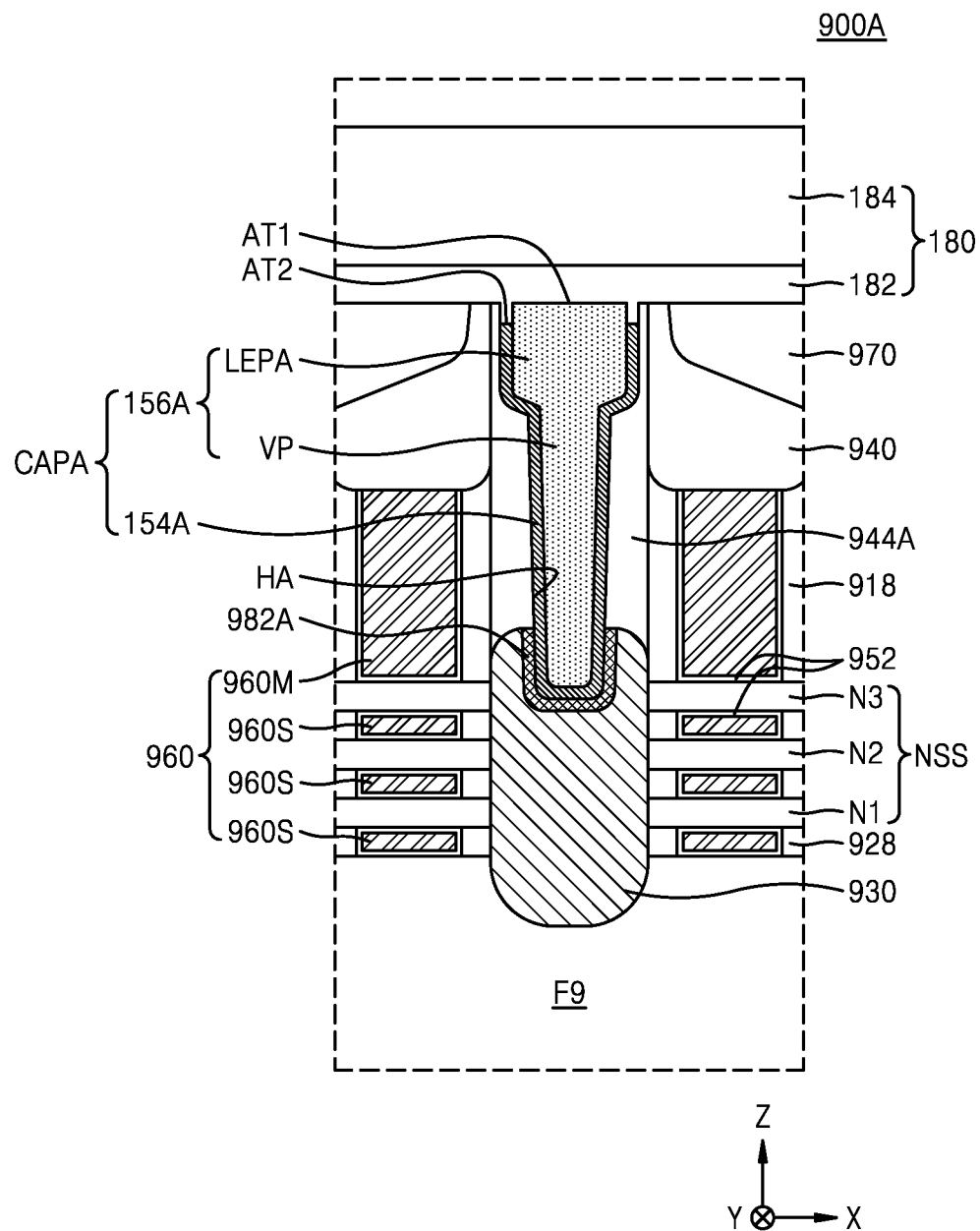
FIG. 10D is an enlarged cross-sectional view of an integrated circuit device according to some embodiments of the present inventive concept.

FIG. 10D is a cross-sectional view of an integrated circuit device 900A according to some embodiments of the present inventive concept. In detail, FIG. 10D is an enlarged cross-sectional view corresponding to a cross-sectional view of a region 10X taken along the line X9-X9' in FIG. 10A.

Referring to FIG. 10D, the integrated circuit device 900A may be substantially the same as or similar to the integrated circuit device 900 described with reference to FIGS. 10A through 10C. However, the integrated circuit device 900A includes a lower interlayer insulating film 944A covering a source/drain region 930, and a source/drain contact pattern CAPA penetrating the lower interlayer insulating film 944A. The detailed configuration of the lower interlayer insulating film 944A may be substantially the same as or similar to those of a structure including the insulating liner 942 and the intergate insulating film 944, which have been described with reference to FIG. 10B. The source/drain contact pattern CAPA may vertically extend toward the source/drain region 930 in the source/drain contact hole HA defined in the lower interlayer insulating film 944A. The source/drain contact pattern CAPA may include a conductive barrier film 154A and a metal plug 156A. The metal plug 156A may include lateral expansion portion LEPA and the through portion VP. The detailed configuration of the source/drain contact pattern CAPA is as described with reference to FIG. 3A.

A metal silicide film 982A may be formed between the source/drain region 930 and the source/drain contact pattern CAPA. The metal plug 156A may be electrically connected to the source/drain region 930 through the metal silicide film 982A. The metal silicide film 982A may be substantially the same as or similar to the metal silicide film 982 described with reference to FIG. 10B. The metal silicide film 982A may be omitted.

Each of the lateral expansion portion LEPA and the through portion VP of the metal plug 156A may be spaced apart from the interlayer insulating film 944A with the conductive barrier film 154A therebetween. The detailed configuration of each of the conductive barrier film 154A and the metal plug 156A is as described with reference to FIG. 3A.

An insulating structure 180 may be disposed on the interlayer insulating film 944A and on the source/drain contact pattern CAPA. The insulating structure 180 may include the etch stop film 182 and the interlayer insulating film 184, which are sequentially formed on each of the lower interlayer insulating film 944A and the source/drain contact pattern CAPA. The etch stop film 182 may be disposed on each of the topmost surface AT1 of the metal plug 156A and the topmost surface AT2 of the conductive barrier film 154A.

Figure 10E:
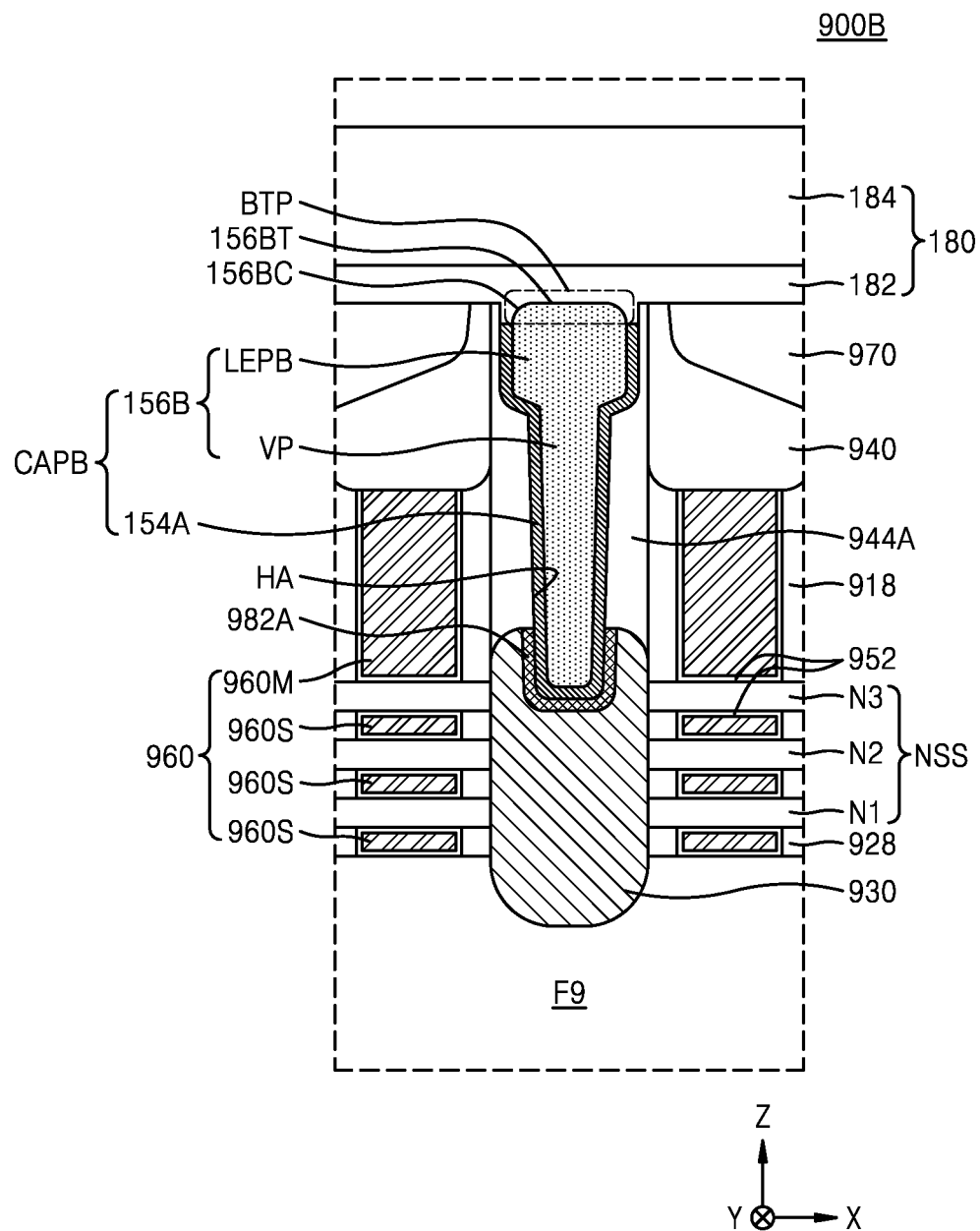
FIG. 10E is an enlarged cross-sectional view of an integrated circuit device according to some embodiments of the present inventive concept.

FIG. 10E is a cross-sectional view of an integrated circuit device 900B according to some embodiments of the present inventive concept. In detail, FIG. 10E is an enlarged cross-sectional view corresponding to a cross-sectional view of the region 10X taken along the line X9-X9' in FIG. 10A.

Referring to FIG. 10E, the integrated circuit device 900B may be substantially the same as or similar to the integrated circuit device 900A described with reference to FIG. 10D. However, the integrated circuit device 900B includes a source/drain contact pattern CAPB in the source/drain contact hole HA penetrating a lower interlayer insulating film 944A toward the source/drain region 930. The source/drain contact pattern CAPB may include the conductive barrier film 154A and a metal plug 156B. The metal plug 156B may include a lateral expansion portion LEPB in an upper portion of the source/drain contact hole HA, and a through portion VP integrally connected to the lateral expansion portion LEPB and vertically extending between the lateral expansion portion LEPB and the source/drain region 930. The detailed configuration of the source/drain contact pattern CAPB is as described with reference to FIG. 3B.

Figure 10F:
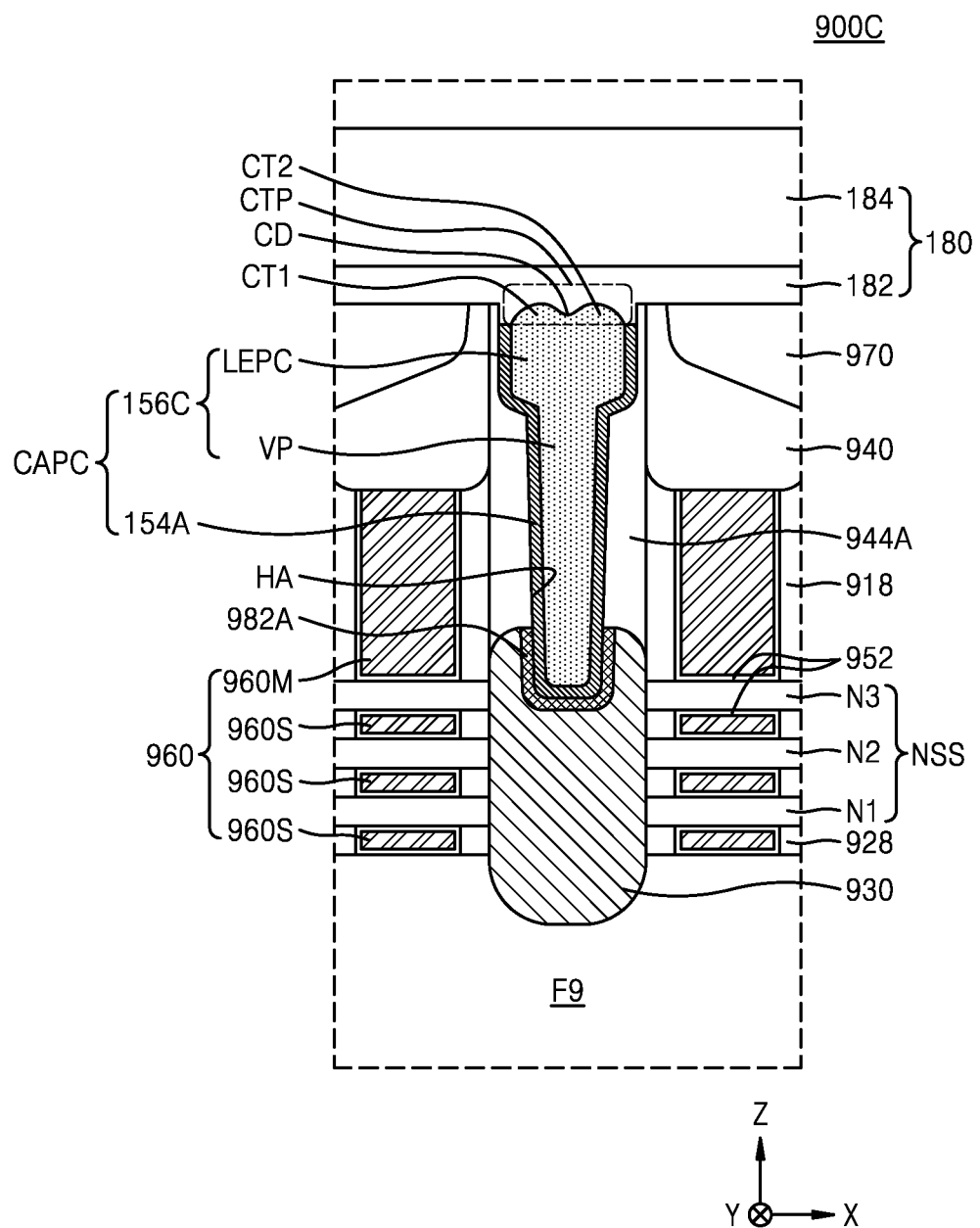
FIG. 10F is an enlarged cross-sectional view of an integrated circuit device according to some embodiments of the present inventive concept.

FIG. 10F is a cross-sectional view of an integrated circuit device 900C according to some embodiments of the present inventive concept. In detail, FIG. 10F is an enlarged cross-sectional view corresponding to a cross-sectional view of the region 10X taken along the line X9-X9' in FIG. 10A.

Referring to FIG. 10F, the integrated circuit device 900C may be substantially the same as or similar to the integrated circuit device 900A described with reference to FIG. 10D. However, the integrated circuit device 900C includes a source/drain contact pattern CAPC in the source/drain contact hole HA penetrating a lower interlayer insulating film 944A toward the source/drain region 930. The source/drain contact pattern CAPC may include the conductive barrier film 154A and a metal plug 156C. The metal plug 156C may include a lateral expansion portion LEPC in an upper portion of the source/drain contact hole HA, and a through portion VP integrally connected to the lateral expansion portion LEPC and vertically extending between the lateral expansion portion LEPC and the source/drain region 930. The detailed configuration of the source/drain contact pattern CAPC is as described with reference to FIG. 3C.

Figure 10G:
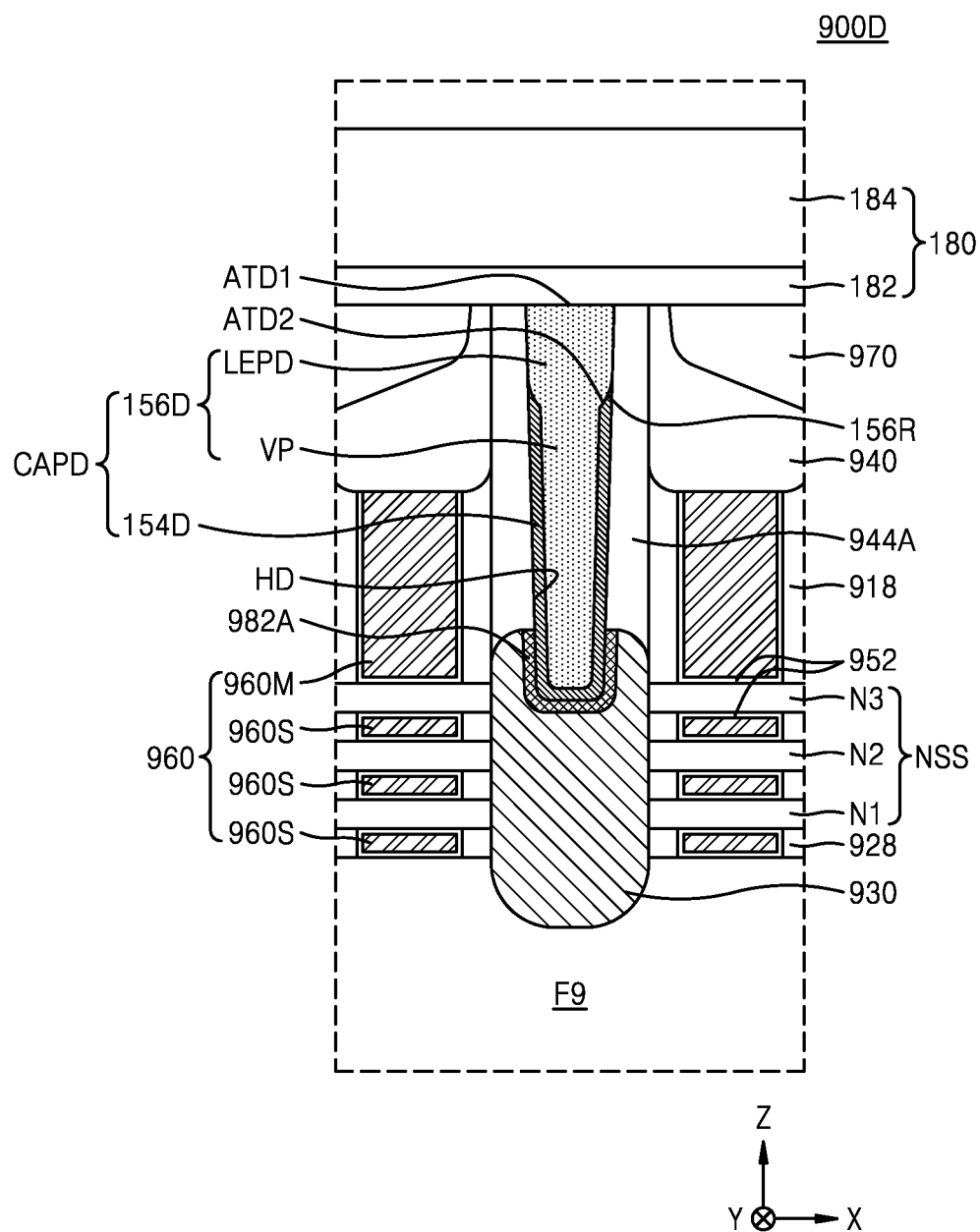
FIG. 10G is an enlarged cross-sectional view of an integrated circuit device according to some embodiments of the present inventive concept.

FIG. 10G is a cross-sectional view of an integrated circuit device 900D according to some embodiments of the present inventive concept. In detail, FIG. 10G is an enlarged cross-sectional view corresponding to a cross-sectional view of the region 10X taken along the line X9-X9' in FIG. 10A.

Referring to FIG. 10G, the integrated circuit device 900D may be substantially the same as or similar to the integrated circuit device 900A described with reference to FIG. 10D. However, the integrated circuit device 900D includes a source/drain contact pattern CAPD in the source/drain contact hole HD penetrating a lower interlayer insulating film 944A toward the source/drain region 930. The source/drain contact pattern CAPD may include the conductive barrier film 154D and a metal plug 156D. The metal plug 156D may include a lateral expansion portion LEPD in an upper portion of the source/drain contact hole HD, and a through portion VP integrally connected to the lateral expansion portion LEPD and vertically extending between the lateral expansion portion LEPD and the source/drain region 930. The conductive barrier film 154D may cover a sidewall of the through portion VP of metal plug 156D in the source/drain contact hole HD. The conductive barrier film 154D may not cover a sidewall (e.g., an upper portion of the sidewall) of the lateral expansion portion LEPD. The sidewall of the lateral expansion portion LEPD may contact the interlayer insulating film 944A. The through portion VP may be spaced apart from the interlayer insulating film 944A with the conductive barrier film 154D between the through portion VP and the interlayer insulating film 944A. The detailed configuration of each of the source/drain contact pattern CAPD and the source/drain contact hole HD is as described with reference to FIG. 3D.

Figure 10H:
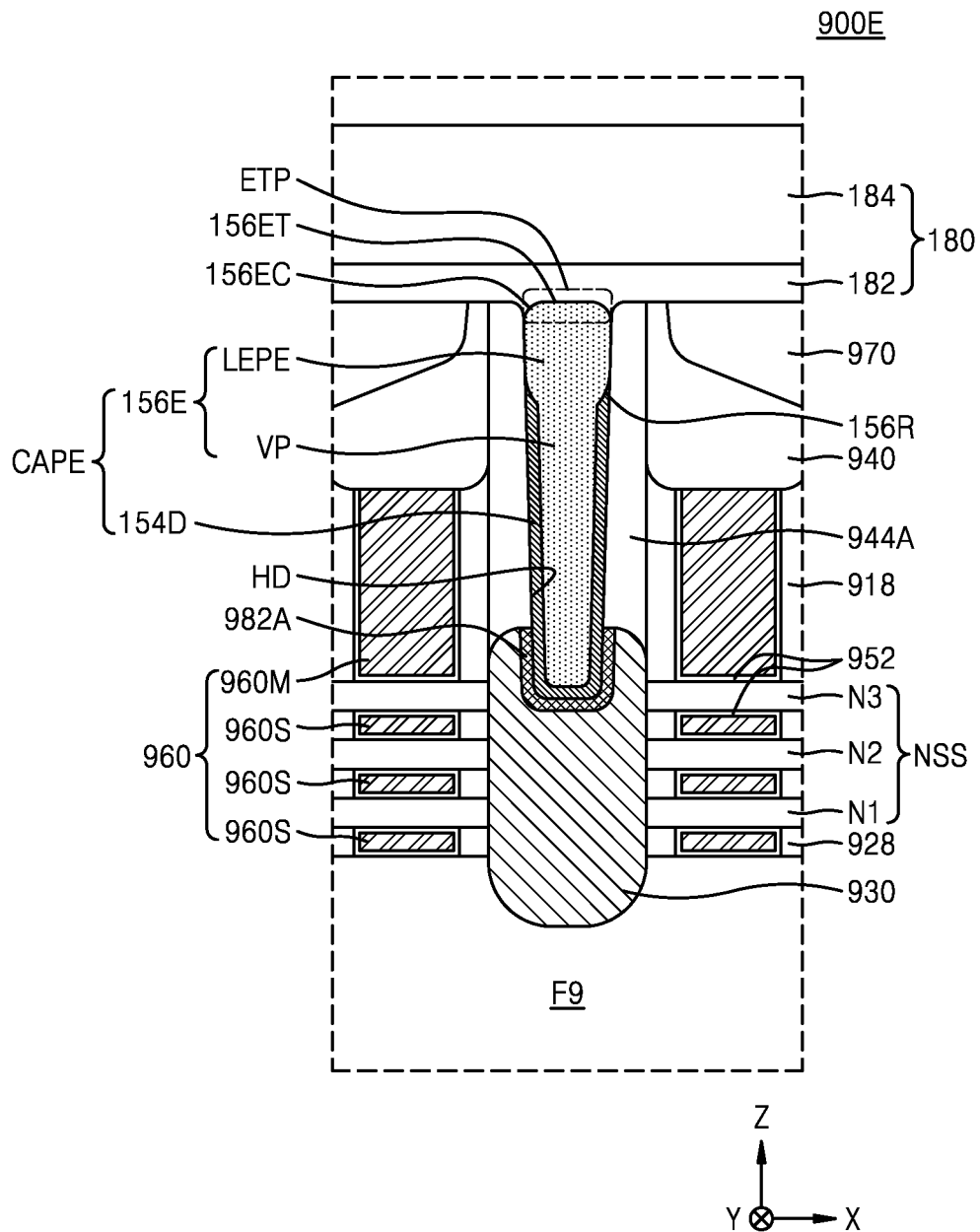
FIG. 10H is an enlarged cross-sectional view of an integrated circuit device according to some embodiments of the present inventive concept.

FIG. 10H is a cross-sectional view of an integrated circuit device 900E according to some embodiments of the present inventive concept. In detail, FIG. 10H is an enlarged cross-sectional view corresponding to a cross-sectional view of the region 10X taken along the line X9-X9' in FIG. 10A.

Referring to FIG. 10H, the integrated circuit device 900E may be substantially the same as or similar to the integrated circuit device 100E described with reference to FIG. 3E. However, the integrated circuit device 900E includes a source/drain contact pattern CAPE in the source/drain contact hole HD penetrating a lower interlayer insulating film 944A toward the source/drain region 930. The source/drain contact pattern CAPE may include the conductive barrier film 154D and a metal plug 156E. The metal plug 156E may include a lateral expansion portion LEPE and a through portion VP. The detailed configuration of the source/drain contact pattern CAPE is as described with reference to FIG. 3E.

Figure 10I:
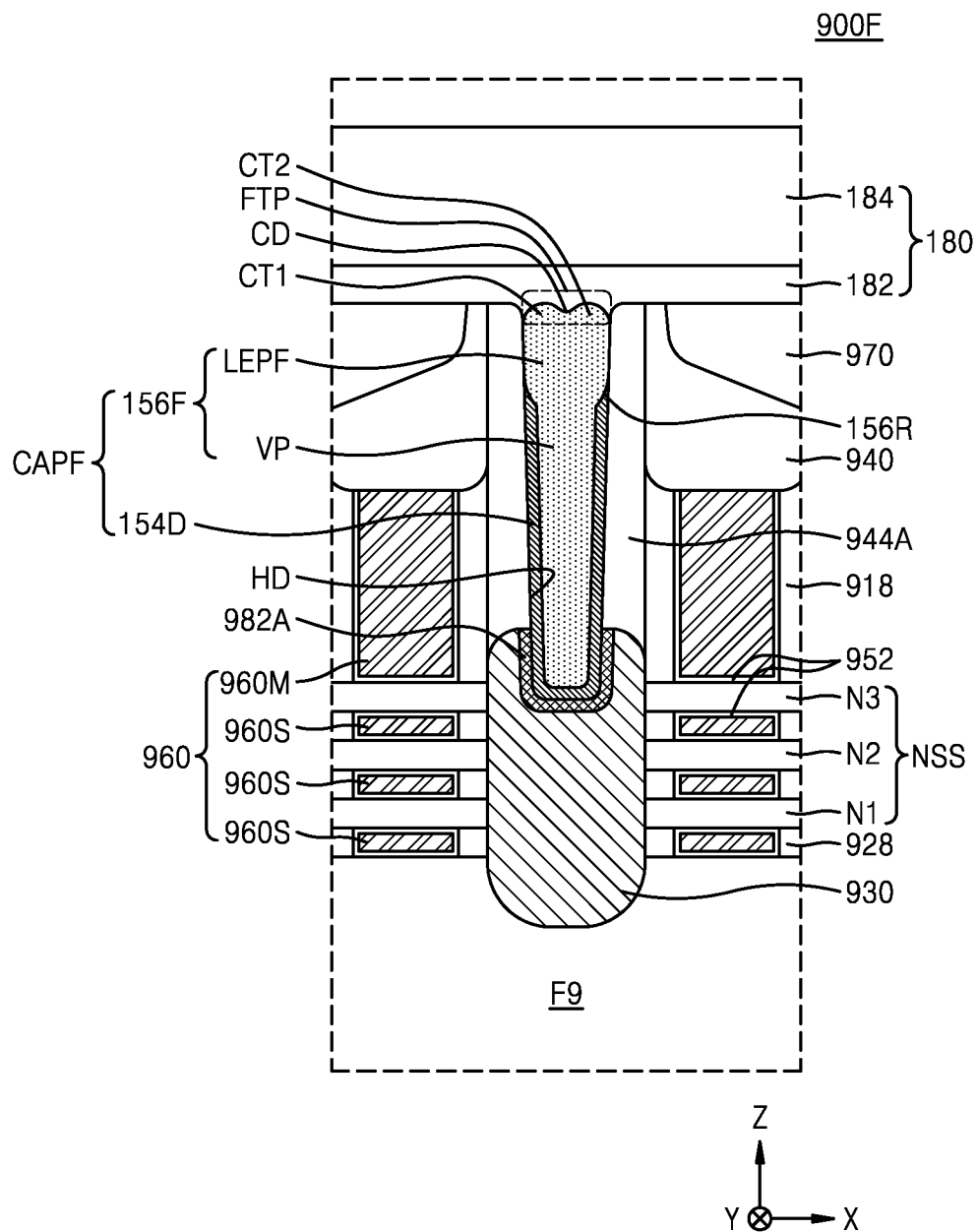
FIG. 10I is an enlarged cross-sectional view of an integrated circuit device according to some embodiments of the present inventive concept.

FIG. 10I is a cross-sectional view of an integrated circuit device 900F according to some embodiments of the present inventive concept. In detail, FIG. 10I is an enlarged cross-sectional view corresponding to a cross-sectional view of the region 10X taken along the line X9-X9' in FIG. 10A.

Referring to FIG. 10I, the integrated circuit device 900F may be substantially the same as or similar to the integrated circuit device 900D described with reference to FIG. 10G. However, the integrated circuit device 900F includes a source/drain contact pattern CAPF in the source/drain contact hole HD penetrating a lower interlayer insulating film 944A toward the source/drain region 930. The source/drain contact pattern CAPF may include the conductive barrier film 154D and a metal plug 156F. The metal plug 156F may include a lateral expansion portion LEPF in an upper portion of the source/drain contact hole HD, and a through portion VP integrally connected to the lateral expansion portion LEPF and vertically extending between the lateral expansion portion LEPF and the source/drain region 930. The detailed configuration of the source/drain contact pattern CAPF is as described with reference to FIG. 3F.

Figure 10J:
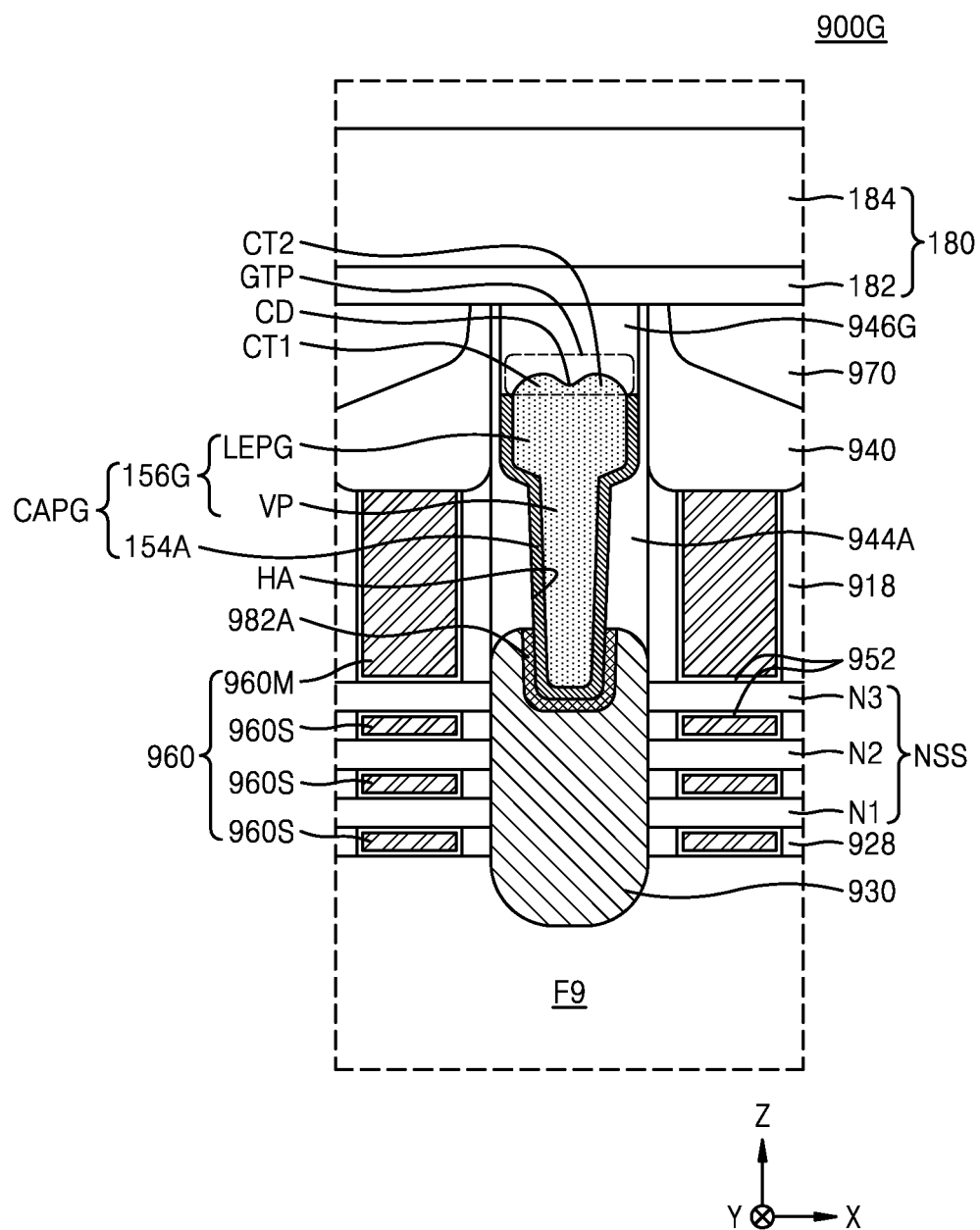
FIG. 10J is an enlarged cross-sectional view of an integrated circuit device according to some embodiments of the present inventive concept.

FIG. 10J is a cross-sectional view of an integrated circuit device 900G according to some embodiments of the present inventive concept. In detail, FIG. 10J is an enlarged cross-sectional view corresponding to a cross-sectional view of the region 10X taken along the line X9-X9' in FIG. 10A.

Referring to FIG. 10J, the integrated circuit device 900G may be substantially the same as or similar to the integrated circuit device 900C described with reference to FIG. 10F. However, the integrated circuit device 900G includes a source/drain contact pattern CAPG in the source/drain contact hole HA penetrating a lower interlayer insulating film 944A toward the source/drain region 930. A top surface of the source/drain contact pattern CAPG may be covered with a capping layer 946G in the source/drain contact hole HA.

The source/drain contact pattern CAPG may include the conductive barrier film 154A and a metal plug 156G. The metal plug 156G may include a lateral expansion portion LEPG in the source/drain contact hole HA, and a through portion VP integrally connected to the lateral expansion portion LEPG and vertically extending between the lateral expansion portion LEPG and the source/drain region 930. The lateral expansion portion LEPG of the metal plug 156G may include a protruding top portion GTP at a higher level than the conductive barrier film 154A of the source/drain contact pattern CAPG. The protruding top portion GTP may have a double-humped protrusion, which bulges in a direction away from the fin-type active regions F9. The detailed configuration of the source/drain contact pattern CAPG is as described with reference to FIG. 3G.

The capping layer 946G and the lower interlayer insulating film 944A may be covered with the etch stop film 182 of the insulating structure 180. The capping layer 946G may be interposed between a topmost surface of the metal plug 156G and the etch stop film 182. Sidewalls of the capping layer 946G may be covered with the lower interlayer insulating film 944A defining the source/drain contact hole HA. The capping layer 946G may include, for example, a silicon carbide film, a silicon nitride film, a silicon oxide film, or a combination thereof.

Figure 10K:
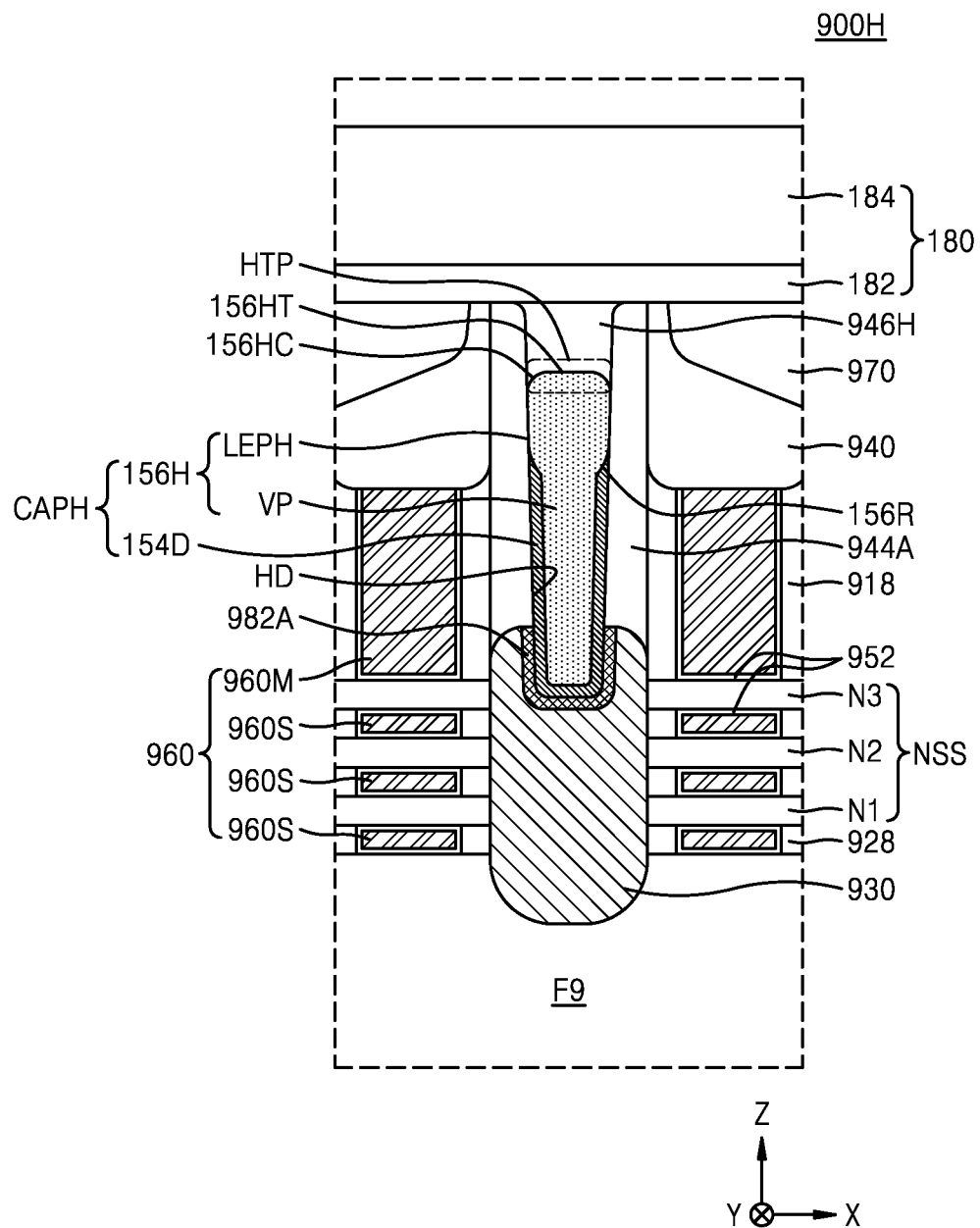
FIG. 10K is an enlarged cross-sectional view of an integrated circuit device according to some embodiments of the present inventive concept.

FIG. 10K is a cross-sectional view of an integrated circuit device 900H according to some embodiments of the present inventive concept. In detail, FIG. 10K is an enlarged cross-sectional view corresponding to a cross-sectional view of the region 10X taken along the line X9-X9' in FIG. 10A.

Referring to FIG. 10K, the integrated circuit device 900H may be substantially the same as or similar to the integrated circuit device 900E described with reference to FIG. 10H. However, the integrated circuit device 900H includes a source/drain contact pattern CAPH in the source/drain contact hole HD penetrating a lower interlayer insulating film 944A toward the source/drain region 930. A top surface of the source/drain contact pattern CAPH may be covered with a capping layer 946H in the source/drain contact hole HD.

The source/drain contact pattern CAPH may include the conductive barrier film 154D and a metal plug 156H. The metal plug 156H may include a lateral expansion portion LEPH in the source/drain contact hole HD, and a through portion VP integrally connected to the lateral expansion portion LEPH and vertically extending between the lateral expansion portion LEPH and the source/drain region 930. The lateral expansion portion LEPH of the metal plug 156H may include a protruding top portion HTP at a higher level than the conductive barrier film 154D of the source/drain contact pattern CAPH. The protruding top portion HTP may have a rounded corner 156HC in an outer edge thereof, and a top surface portion 156HT substantially in the middle of the protruding top portion HTP in the first horizontal direction (the X direction). The detailed configuration of the source/drain contact pattern CAPH is as described with reference to FIG. 3H.

The capping layer 946H and the lower interlayer insulating film 944A may be covered with the etch stop film 182 of the insulating structure 180. The capping layer 946H may be interposed between a topmost surface of the metal plug 156H and the etch stop film 182. Sidewalls of the capping layer 946H may be covered with the lower interlayer insulating film 944A defining the source/drain contact hole HD. The capping layer 946H may include, for example, a silicon carbide film, a silicon nitride film, a silicon oxide film, or a combination thereof.

Methods of manufacturing integrated circuit devices according to some embodiments of the present inventive concept will be described with specific examples below.

FIGS. 11A through 22B are cross-sectional views illustrating a method of manufacturing an integrated circuit device, according to some embodiments of the present inventive concept. FIGS. 11A, 12A, 13A, 14A, 15A, 16A, 17A, 18A, 19A, 20A, 21A, and 22A show portions respectively corresponding to the cross-sections respectively taken along the lines X1-X1' and X2-X2' in FIG. 1, and FIGS. 11B, 12B, 13B, 14B, 15B, 16B, 17B, 18B, 19B, 20B, 21B, and 22B show a portion corresponding to the cross-section taken along the line Y1-Y1' in FIG. 1. An example of a method of manufacturing the integrated circuit device 100 illustrated in FIGS. 1 through 2D will be described with reference to FIGS. 11A through 22B below.

Figure 11A:
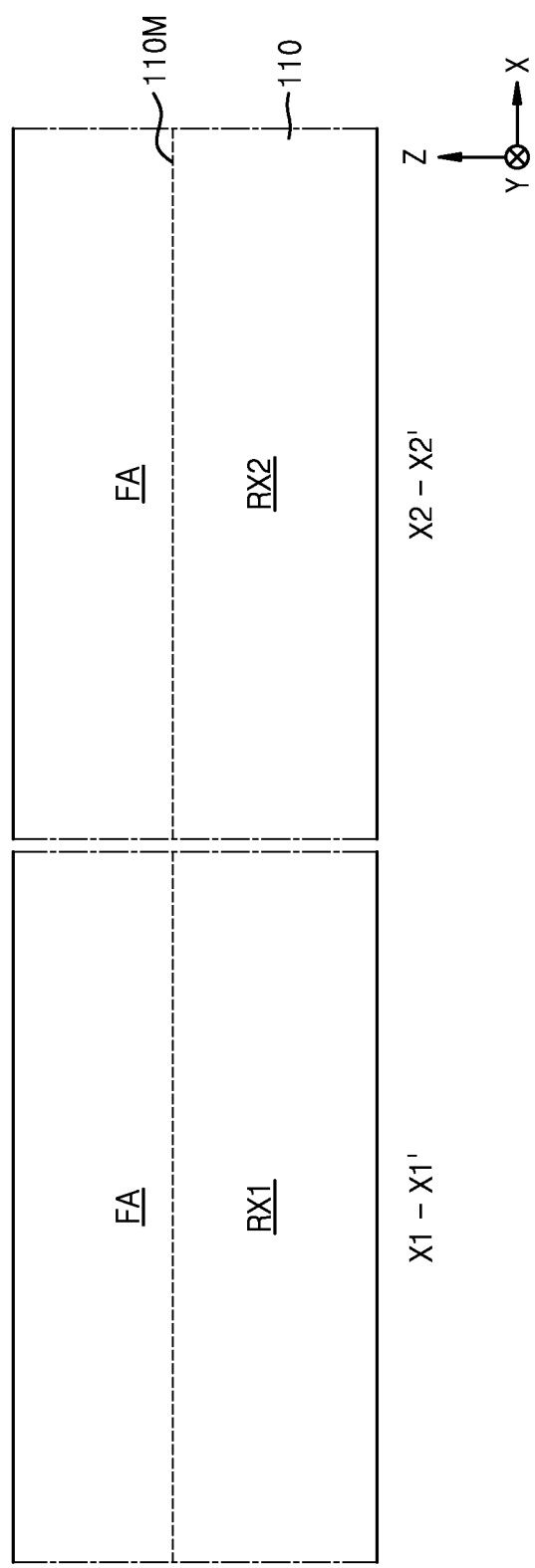
Figure 11B:
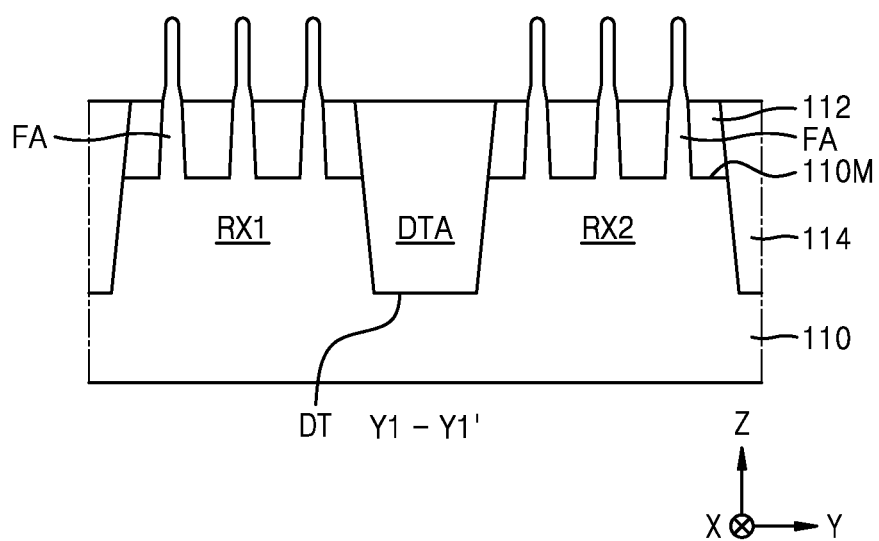

Referring to FIGS. 11A and 11B, a plurality of fin-type active regions FA, which protrude in the vertical direction (the Z direction) from the main surface 110M of the substrate 110 and extend in the first horizontal direction (the X direction) to be parallel to each other, and an isolation film 112, which covers both sidewalls of a lower portion of each of the fin-type active regions FA, may be formed by partially etching the substrate 110 in the first device region RX1 and the second device region RX2. A deep trench DT, which defines the first device region RX1 and the second device region RX2, may be formed by etching a portion of the isolation film 112 and a portion of the substrate 110 and may be filled with an isolation insulating film 114. Accordingly, the deep trench DT in the device isolation region DTA may be filled with the isolation insulating film 114. In the first device region RX1 and the second device region RX2, the fin-type active regions FA may protrude upward from the top surface of the isolation film 112.

Figure 12A:
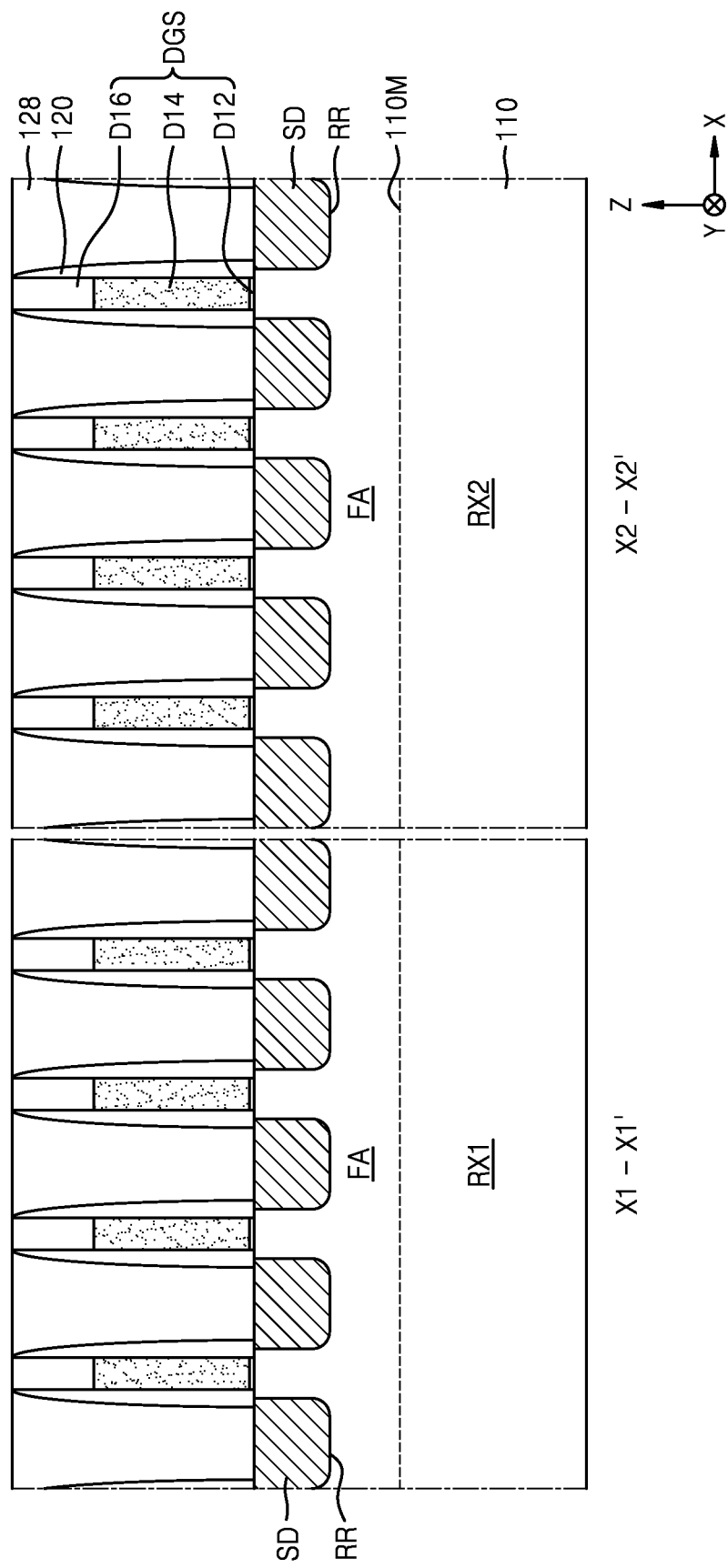
Figure 12B:
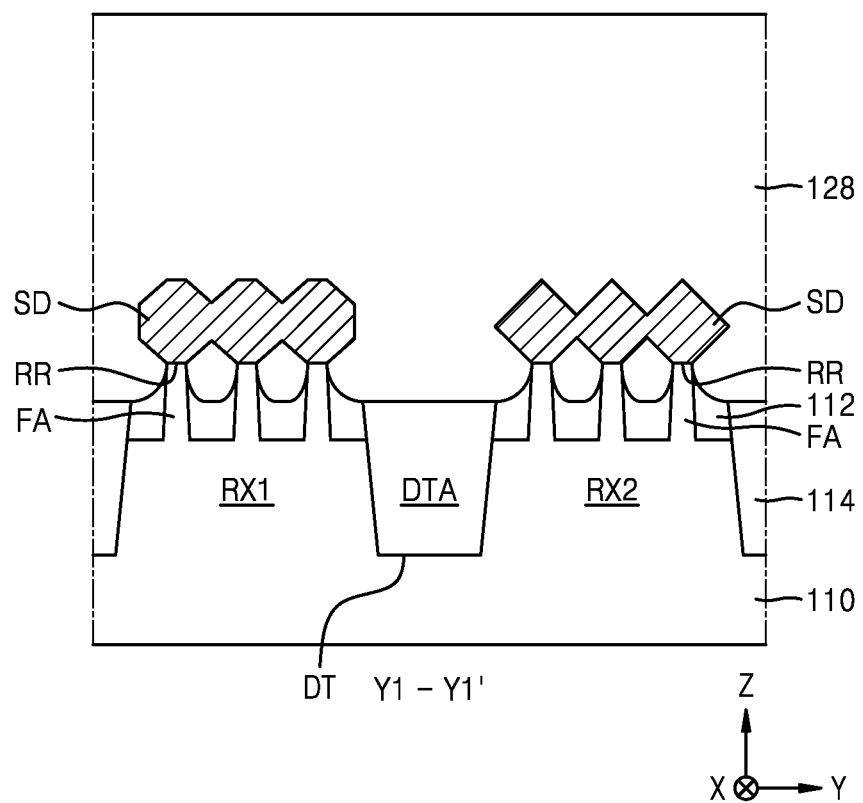

Referring to FIGS. 12A and 12B, a plurality of dummy gate structures DGS extending to cross the fin-type active regions FA are formed on the isolation film 112 and the isolation insulating film 114. Each of the dummy gate structures DGS may include a dummy gate insulating film D12, a dummy gate line D14, and a dummy insulating capping layer D16, which are sequentially stacked on the fin-type active regions FA. The dummy gate insulating film D12 may include, for example, silicon oxide. The dummy gate line D14 may include, for example, polysilicon. The dummy insulating capping layer D16 may include, for example, silicon nitride.

An insulating spacer 120 may be formed on each of both sidewalls of each of the dummy gate structures DGS, and a plurality of recess regions RR may be formed in an upper portion of each of a plurality of fin-type active regions FA by partially etching the fin-type active regions FA exposed at both sides of each dummy gate structure DGS. Thereafter, a plurality of source/drain regions SD filling the recess regions RR may be formed.

The isolation film 112, the isolation insulating film 114, the source/drain regions SD, and the intergate insulating film 128 covering the source/drain regions SD may be formed among the dummy gate structures DGS. In example embodiments, before the intergate insulating film 128 is formed, an insulating liner (not shown) covering the source/drain regions SD may also be formed. The insulating liner may include, for example, SiN, SiCN, SiBN, SiON, SiOCN, SiBCN, SiOC, $SiO_2$, or a combination thereof.

Figure 13A:
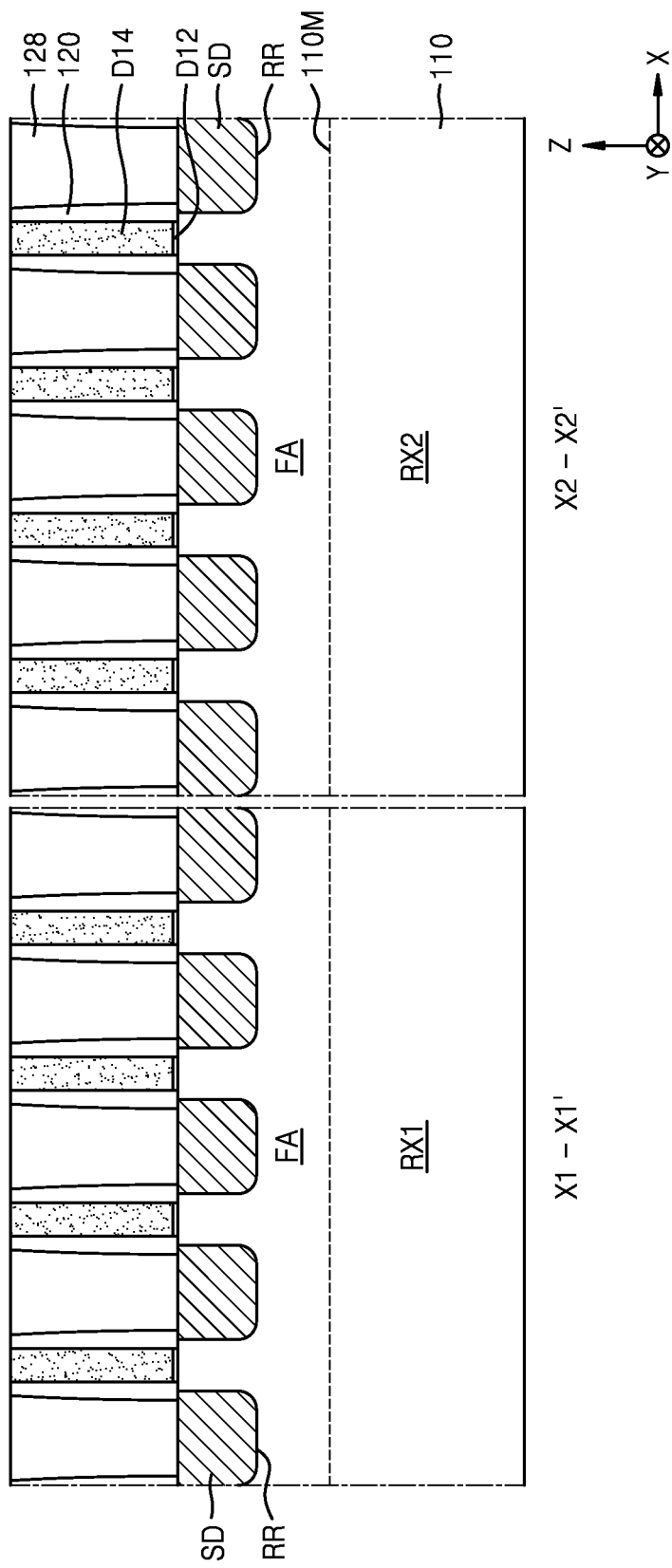
Figure 13B:
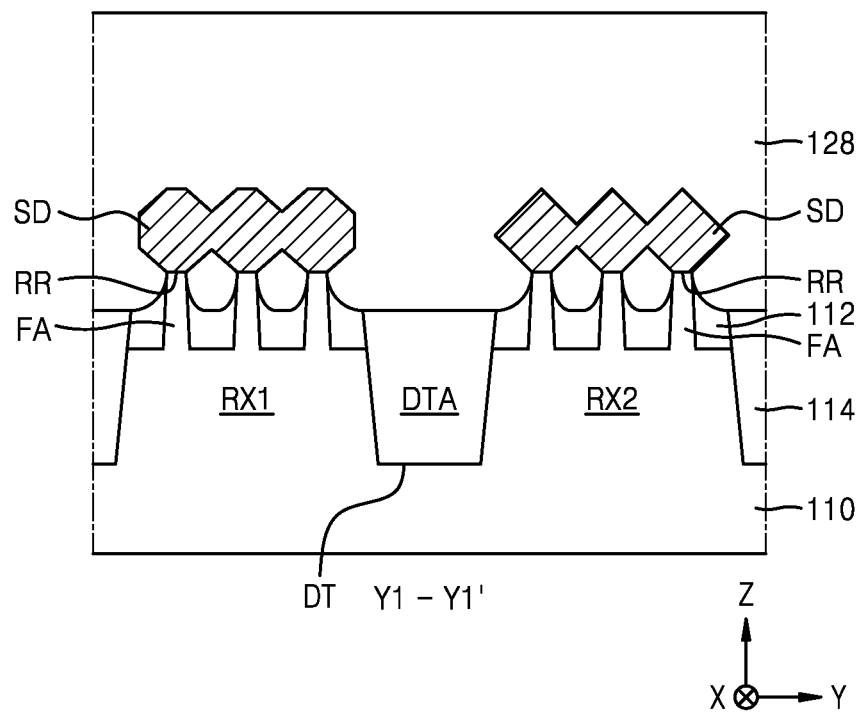

Referring to FIGS. 13A and 13B, the dummy gate line D14 is exposed by removing the dummy insulating capping layer D16 and insulating films around the dummy insulating capping layer D16 from the resultant structure of FIGS. 12A and 12B by using, for example, a chemical mechanical polishing (CMP) process. At this time, the heights of the intergate insulating film 128 and the insulating spacer 120 may be lowered.

Figure 14A:
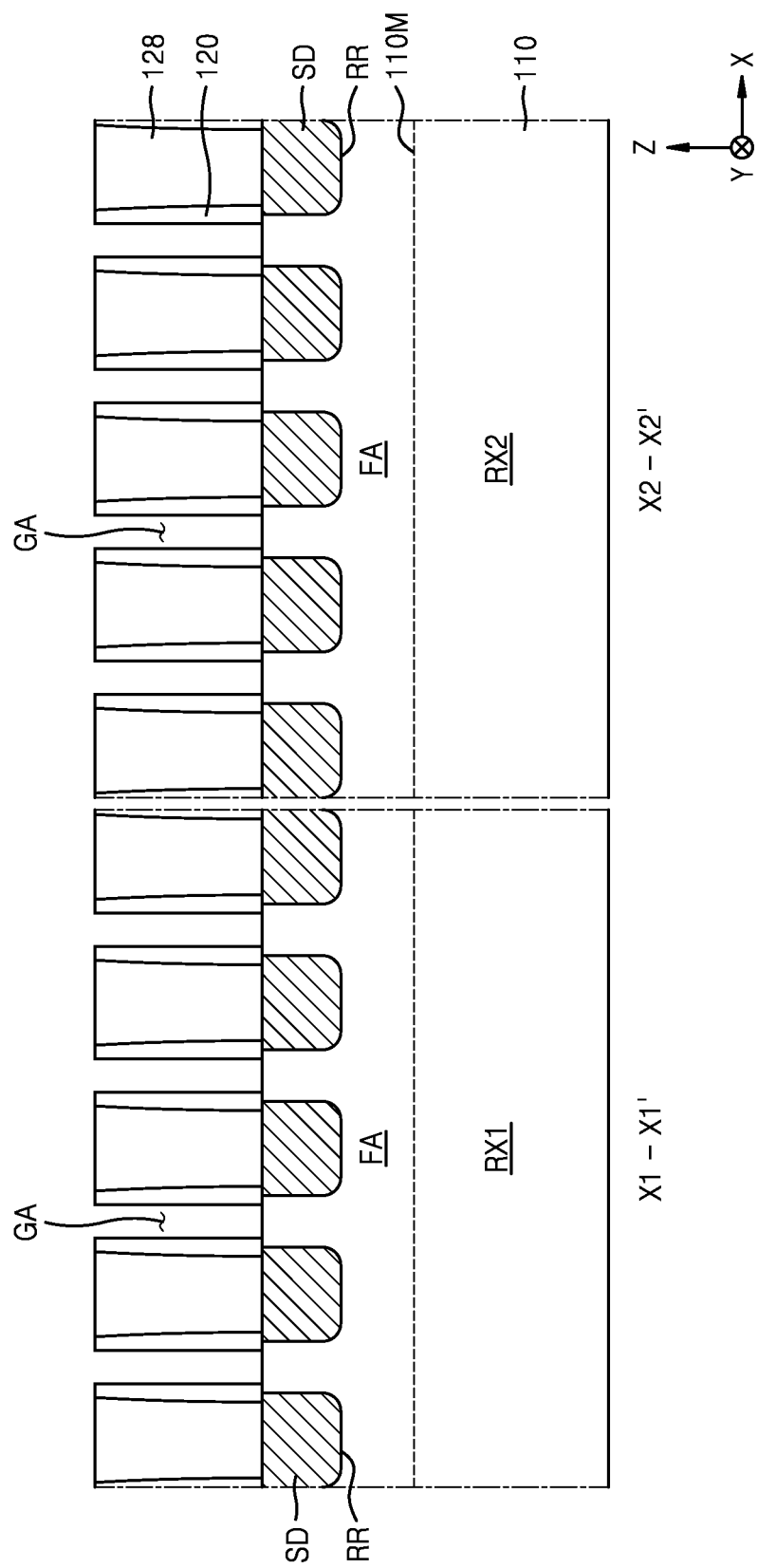
Figure 14B:
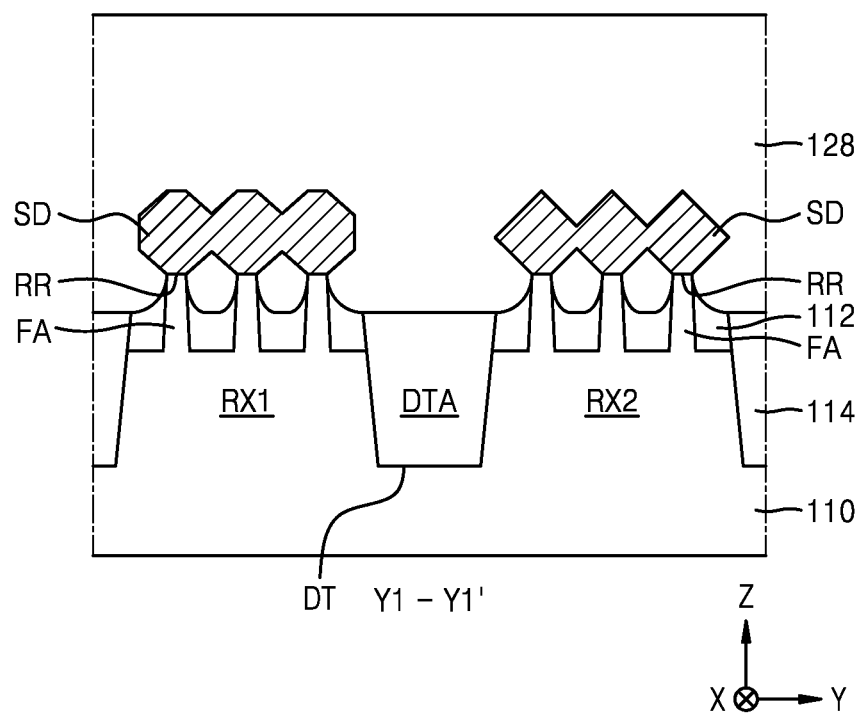

Referring to FIGS. 14A and 14B, a plurality of gate spaces GA are provided by removing a plurality of dummy gate lines D14 and a plurality of dummy gate insulating films D12 from the resultant structure of FIGS. 13A and 13B. The insulating spacer 120, the fin-type active regions FA, the isolation film 112, and the isolation insulating film 114 may be exposed by the gate spaces GA.

Figure 15A:
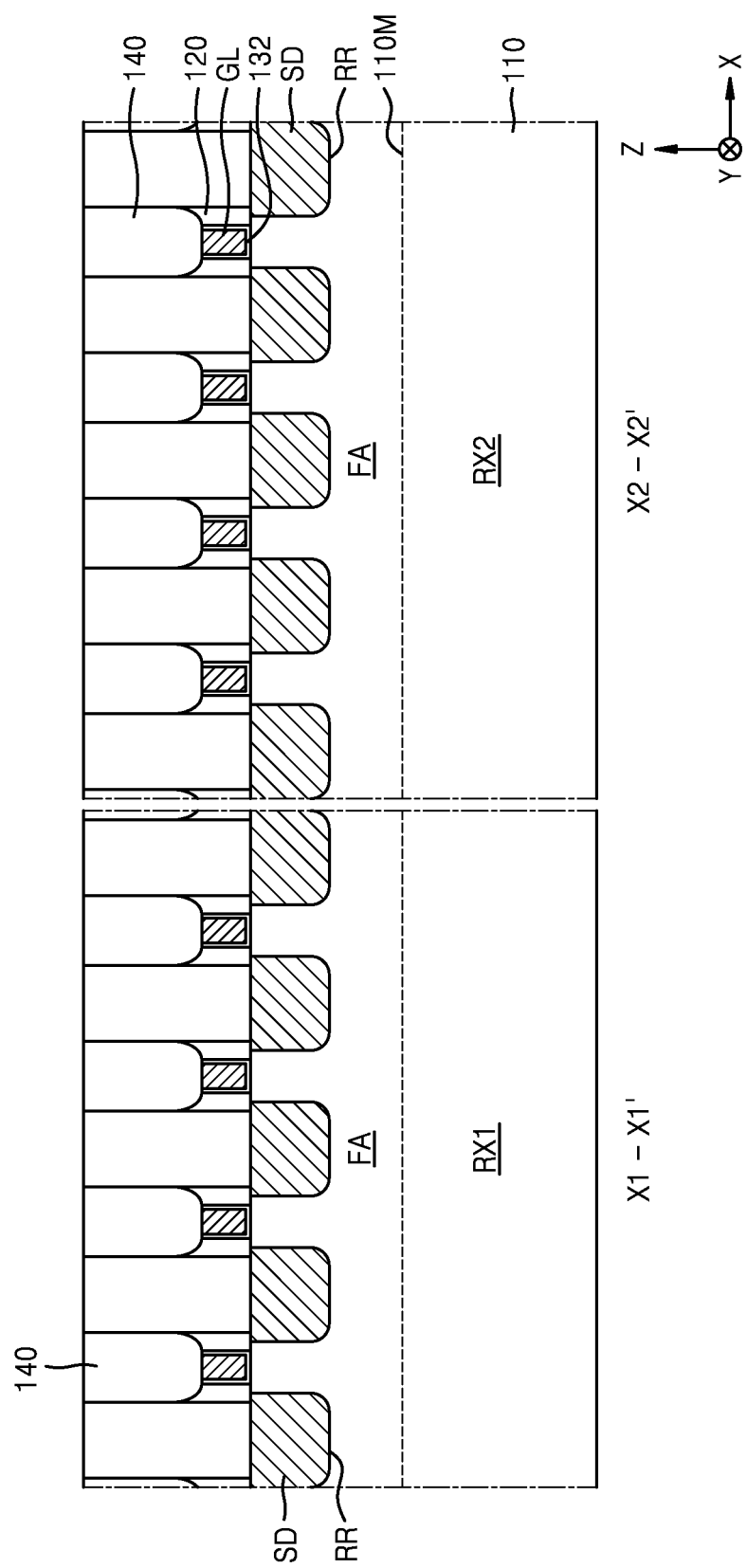
Figure 15B:
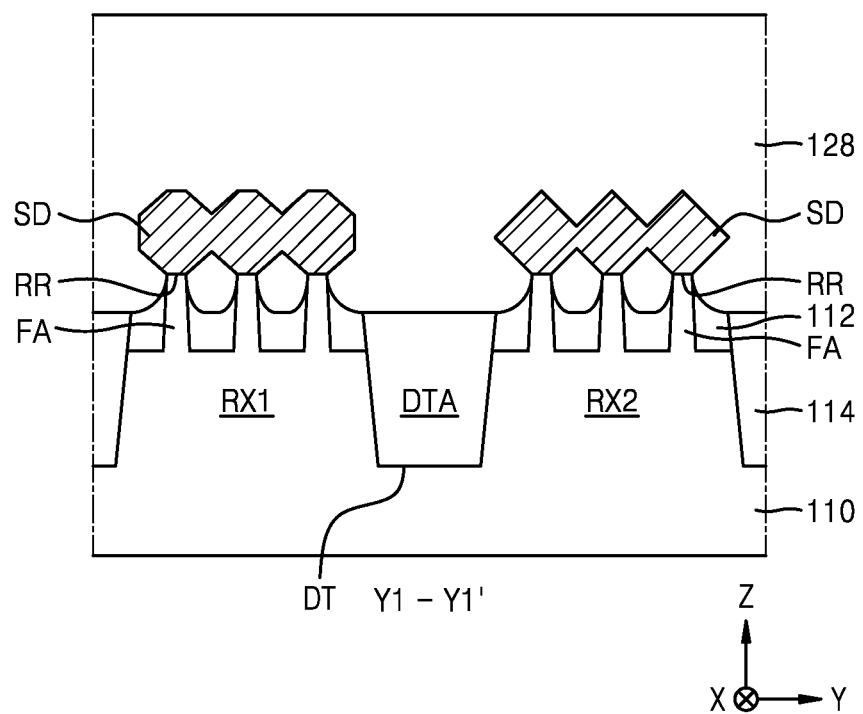

Referring to FIGS. 15A and 15B, a gate insulating film 132, a gate line GL, and an insulating capping line 140 are formed in the gate spaces GA of the resultant structure of FIGS. 14A and 14B.

To form the gate insulating film 132, the gate line GL, and the insulating capping line 140, a plurality of gate insulating films 132 and a plurality of gate lines GL may be formed to fill the gate spaces GA and then etched back to be lowered so as to fill only lower portions of the gate spaces GA. During the etch-back of the gate insulating films 132 and the gate lines GL, an upper portion of the insulating spacer 120 defining the gate spaces GA may also be removed such that the height of the insulating spacer 120 may be lowered. Thereafter, the insulating capping line 140 may be formed to cover the top surface of each of the gate lines GL, the gate insulating films 132, and the insulating spacer 120 in the gate spaces GA and to fill the upper portions of the gate spaces GA.

In example embodiments, before the gate insulating films 132 are formed, an interface film (not shown) may be formed to cover the surface of each of the fin-type active regions FA exposed by the gate spaces GA. For example, to form the interface film, the fin-type active regions FA exposed in the gate spaces GA may be partially oxidized.

Figure 16A:
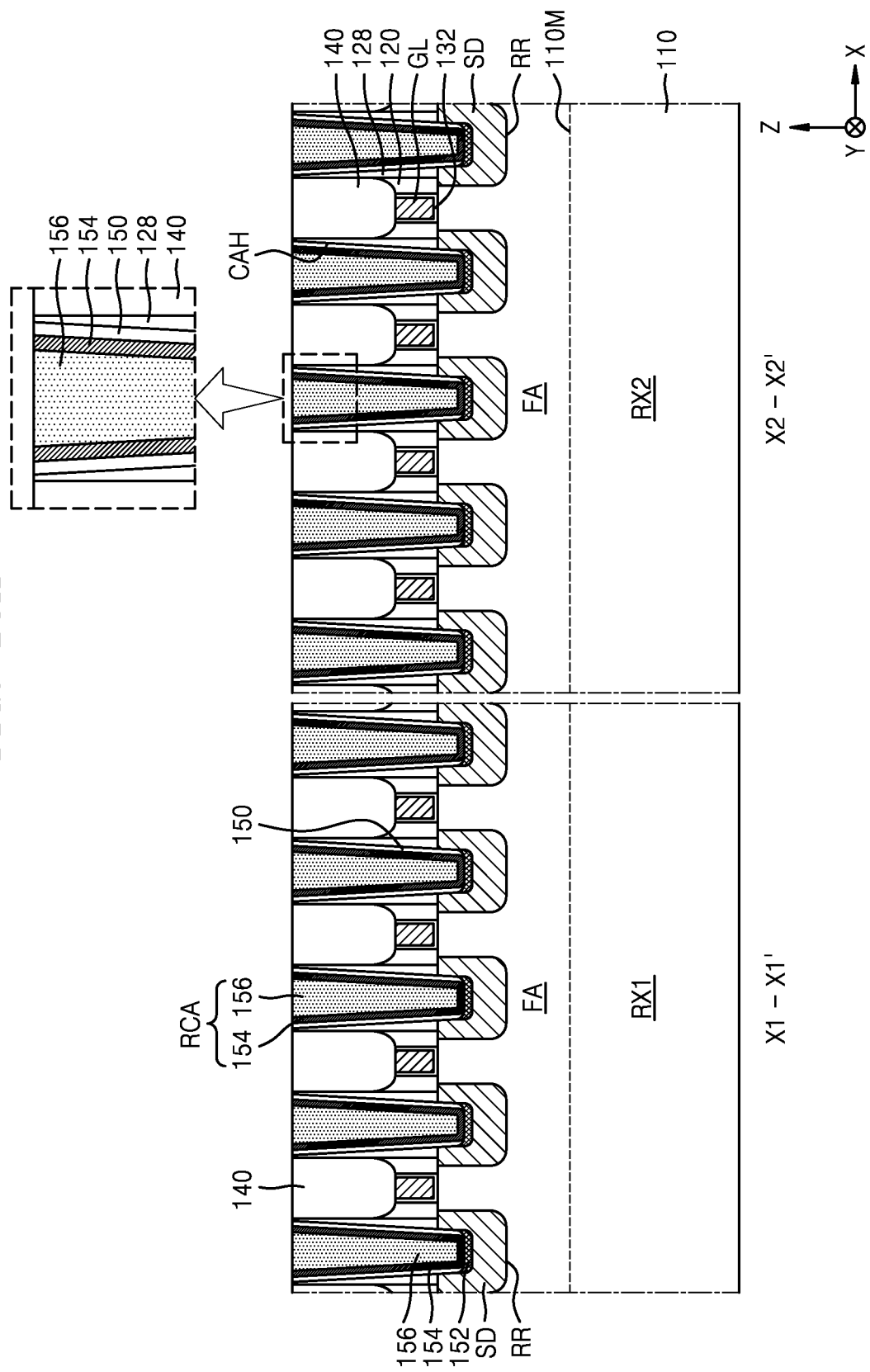
Figure 16B:
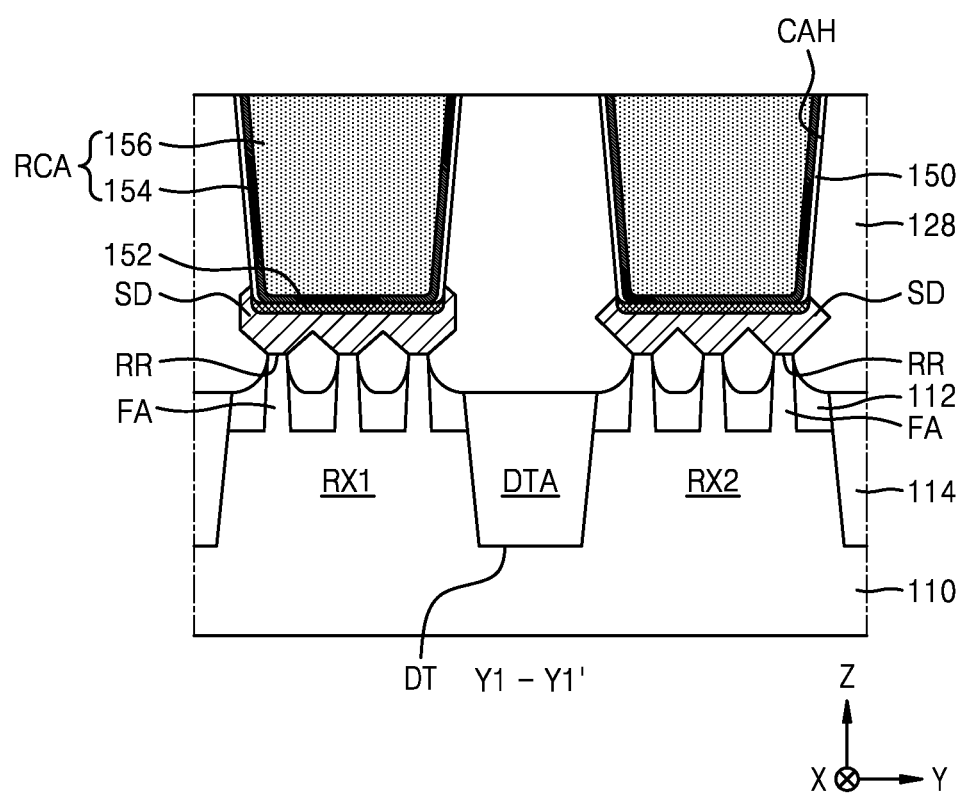

Referring to FIGS. 16A and 16B, a plurality of source/drain contact holes CAH are formed to expose the source/drain regions SD through the intergate insulating film 128, and a contact insulating spacer 150 is formed to cover the inner sidewalls of each of the source/drain contact holes CAH. To form the contact insulating spacer 150, an insulating spacer film may be formed to conformally cover the inner wall of each of the source/drain contact holes CAH and then anisotropically etched to expose a source/drain region SD through each source/drain contact hole CAH. Consequently, a plurality of contact insulating spacers 150 each including a portion of the insulating spacer film remaining on the sidewall of the source/drain contact hole CAH may be obtained.

A plurality of metal silicide films 152, which respectively cover the source/drain regions SD in the lower portions of the source/drain contact holes CAH, and a plurality of preliminary source/drain contacts RCA, which respectively fill the source/drain contact holes CAH, are formed. The preliminary source/drain contacts RCA may include the conductive barrier film 154 and the metal plug 156. In the present specification, the conductive barrier film 154 included in the preliminary source/drain contacts RCA may be referred to as a "preliminary conductive barrier film", and the metal plug 156 included in the preliminary source/drain contacts RCA may be referred to as a "preliminary metal plug".

In example embodiments, the metal silicide films 152, the conductive barrier film 154, and the metal plug 156 may be formed by performing the processes described below. Firstly, a metal liner conformally covering the source/drain regions SD may be formed in the source/drain contact holes CAH. The metal liner may include, for example, Ti, W, Ru, Nb, Mo, Hf, Ni, Co, Pt, Yb, Tb, Dy, Er, Pd, or a combination thereof. Thereafter, the conductive barrier film 154 may be formed to cover an exposed surface of the metal liner and the inner walls of the source/drain contact holes CAH. The metal liner and the conductive barrier film 154 may be formed using, for example, physical vapor deposition (PVD), CVD, or atomic layer deposition (ALD). Thereafter, a heat treatment may be performed on a resultant structure including the metal liner and the conductive barrier film 154 to induce a reaction between a semiconductor material of the source/drain regions SD and a metal of the metal liner, thereby forming the metal silicide films 152 covering the source/drain regions SD. In example embodiments, after the metal silicide films 152 are formed, a portion of the metal liner may remain between each of the metal silicide films 152 and the conductive barrier film 154. In example embodiments, the entire metal liner may be used to form the metal silicide films 152 and thus the metal liner may not remain between each of the metal silicide films 152 and the conductive barrier film 154.

Thereafter, a metal film may be formed on a resultant structure including the metal silicide films 152 and the conductive barrier film 154 to be thick enough to fill the inside of each of the source/drain contact holes CAH. The metal film may be formed using, for example, CVD, PVD, or electroplating. Thereafter, the metal plug 156 including the metal film remaining on the conductive barrier film 154 in each of the source/drain contact holes CAH may be formed by removing the conductive barrier film 154 and an unnecessary portion of the metal film using, for example, CMP to expose the top surface of the intergate insulating film 128.

Figure 17A:
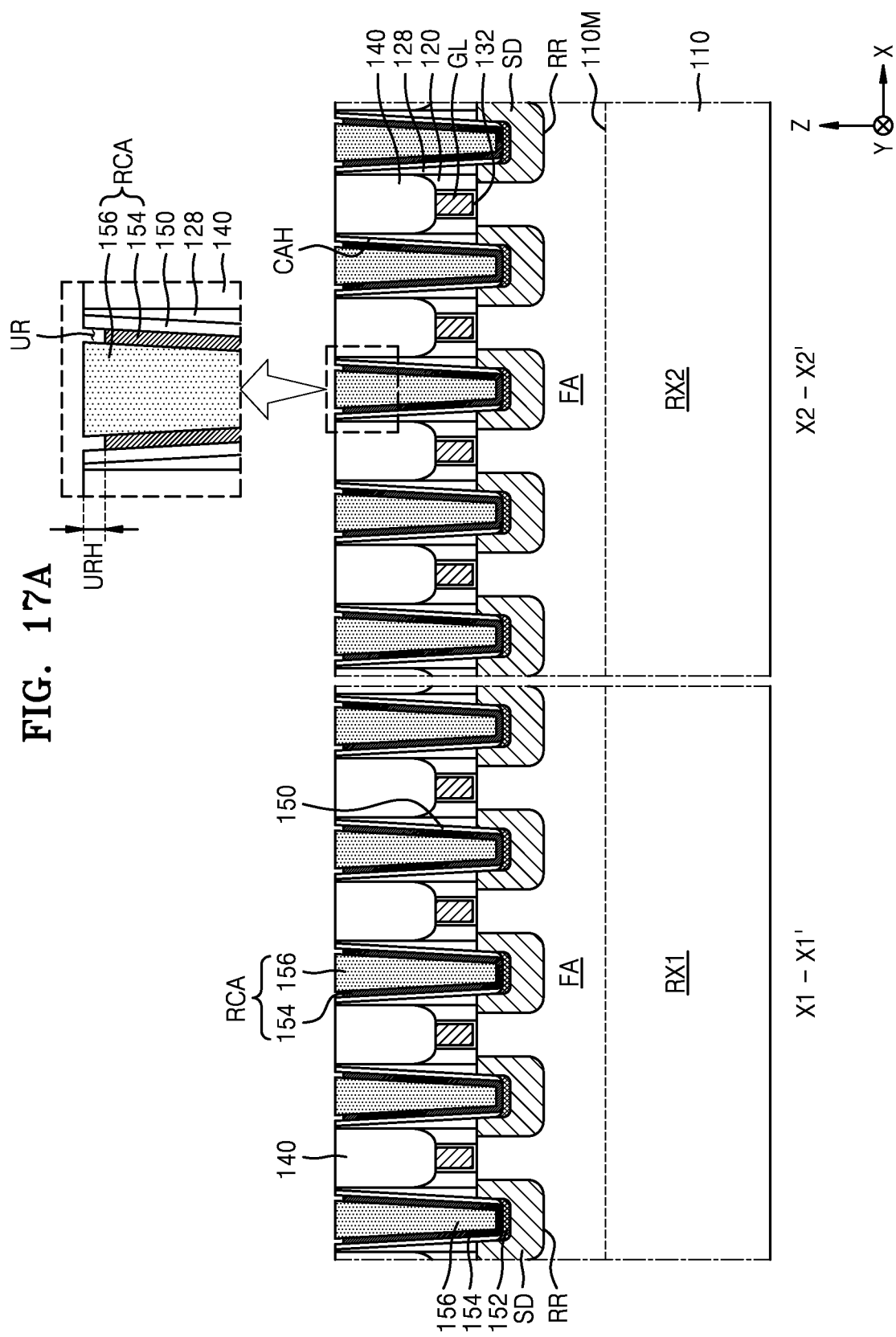
Figure 17B:
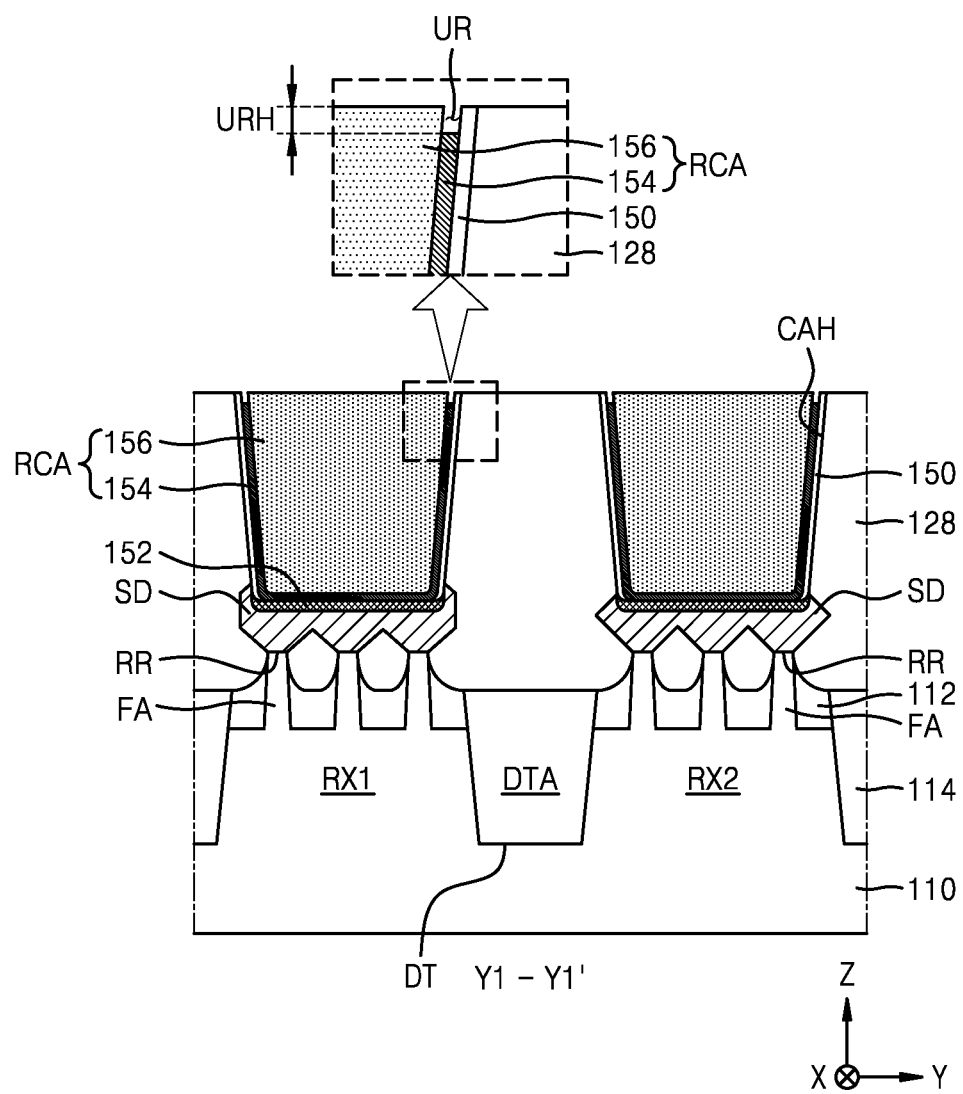

Referring to FIGS. 17A and 17B, the height of the top surface of the conductive barrier film 154 is lowered by performing an etch-back process for selectively removing a portion (e.g., an upper portion) of the conductive barrier film 154 in the resultant structure of FIGS. 16A and 16B. As a result, an upper recess UR exposing the top surface of the conductive barrier film 154 may be formed between the metal plug 156 and a contact insulating spacer 150 in each of the source/drain contact holes CAH. An outer sidewall of the metal plug 156 and an inner sidewall of the contact insulating spacer 150 may be exposed by the upper recess UR.

In example embodiments, a vertical height URH of the upper recess UR exposing the top surface of the conductive barrier film 154 may be about 1 nm to about 5 nm, for example, about 2 nm to about 3 nm.

Figure 18A:
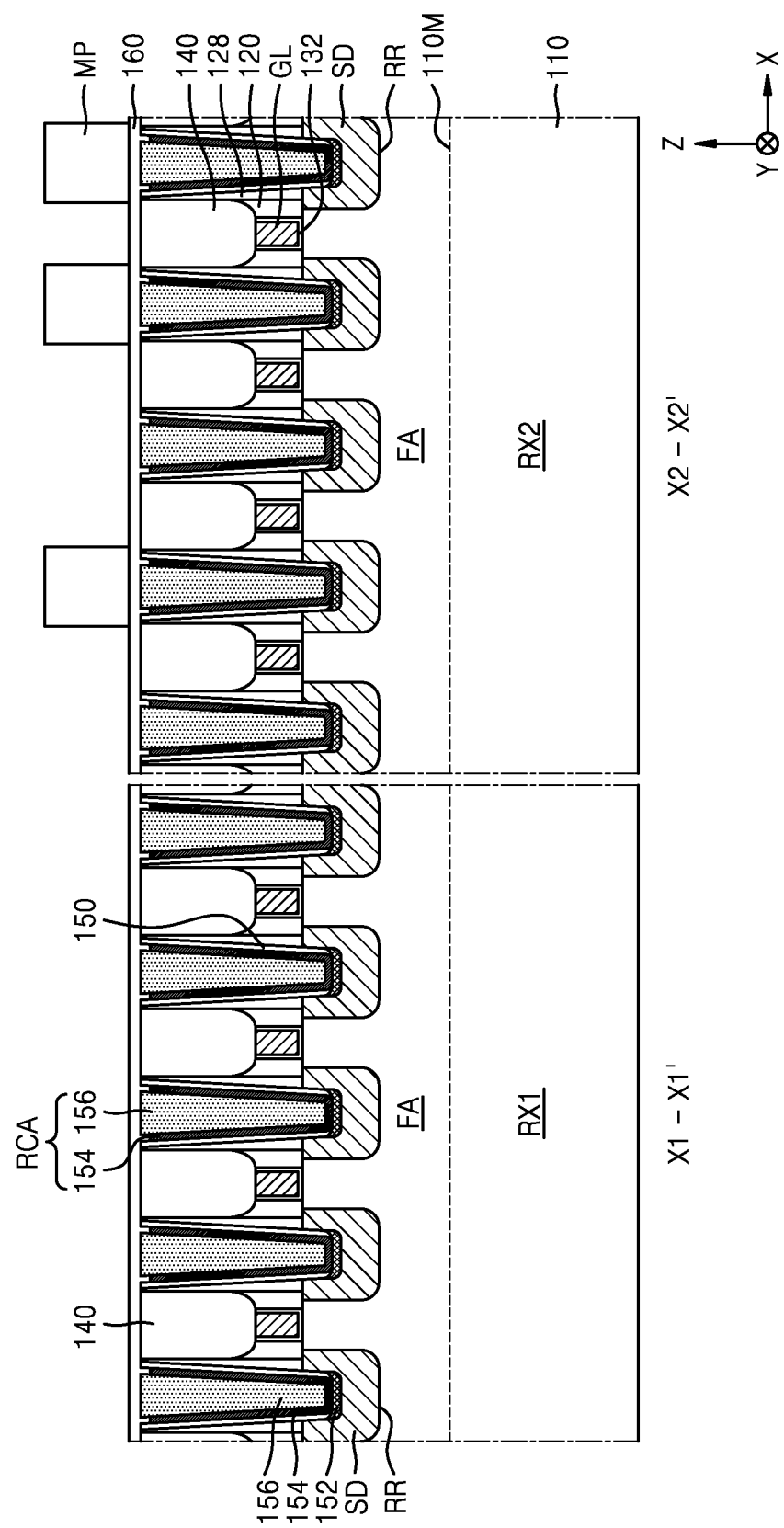
Figure 18B:
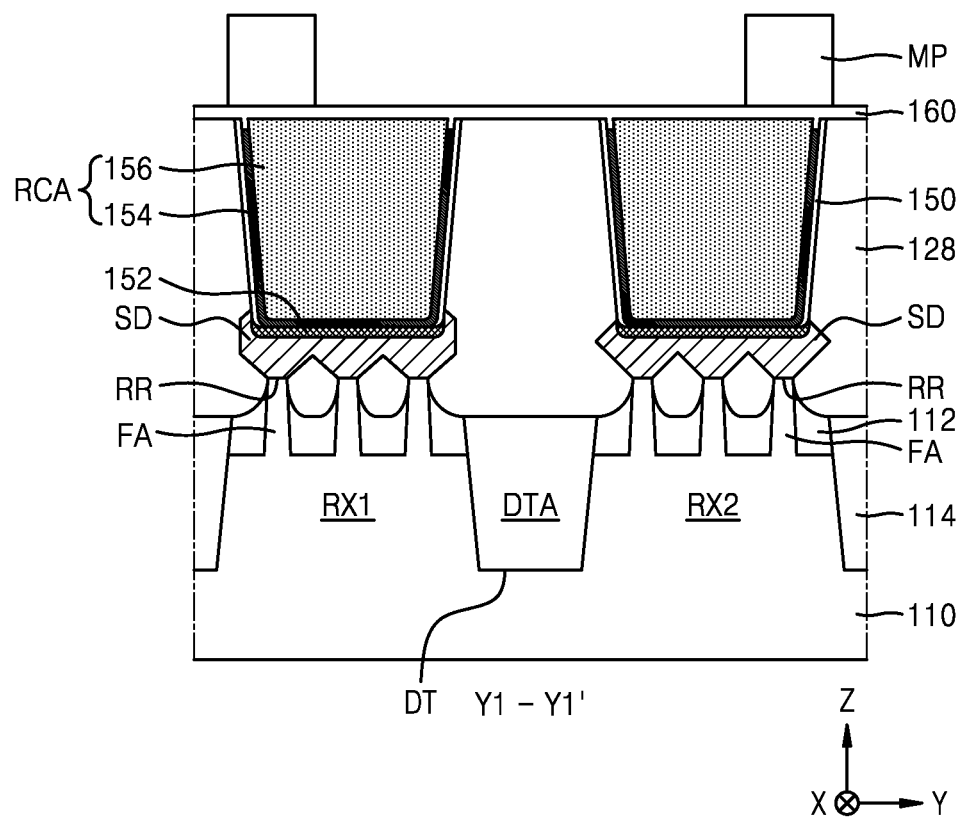

Referring to FIGS. 18A and 18B, an etch stop film 160 is formed to cover the top surface of the resultant structure of FIGS. 17A through 17B, and a plurality of mask patterns MP may be formed on the etch stop film 160 to partially cover the preliminary source/drain contacts RCA. The mask patterns MP may be positioned to correspond to the source/drain via contacts CAV in FIG. 1. In some embodiments, each of the mask pattern MP may overlap a first portion of the upper recess UR and may not overlap a second portion of the upper recess UR as illustrated in FIGS. 18A and 18B.

The etch stop film 160 may include a different material than the mask patterns MP. In example embodiments, the etch stop film 160 may include, for example, SiOC, SiN, or a combination thereof, and the mask patterns MP may include, for example, a silicon oxide film, a spin-on-hard-mask (SOH) film, a photoresist film, or a combination thereof, but embodiments are not limited thereto.

Figure 19B:
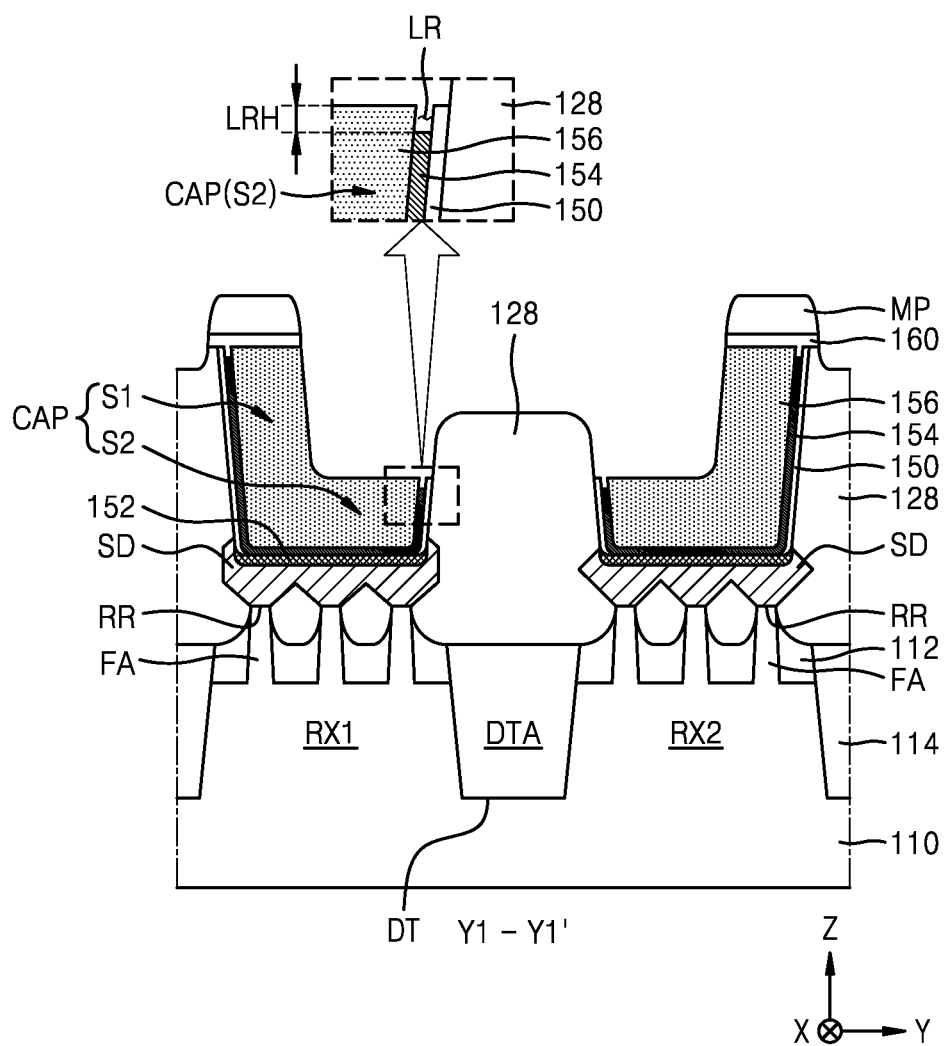

Referring to FIGS. 19A and 19B, the etch stop film 160 is etched using the mask patterns MP as etch masks, and the preliminary source/drain contacts RCA that are exposed are etched in a certain etching atmosphere to be lowered. As a result, a plurality of source/drain contact patterns CAP having different heights at different positions may be formed. Each of the source/drain contact patterns CAP may include a first segment S1 and a second segment S2, which have different heights in the vertical direction (the Z direction) and are integrally connected to each other. The first segment S1 may include a first portion of the metal plug 156, and a second segment S2 may include a second portion of the metal plug 156. Each of the first and second portions of the metal plug 156 may be a portion of a metal film that is a monolithic or unitary film and is formed by a single process, and the first and second portions of the metal plug 156 may be connected to each other without an interface or boundary. The first segment S1 may include a first portion of the conductive barrier film 154, and a second segment S2 may include a second portion of the conductive barrier film 154. Each of the first and second portions of the conductive barrier film 154 may be a portion of a barrier film that is a monolithic or unitary film is formed by a single process, and the first and second portions of the conductive barrier film 154 may be connected to each other without an interface or boundary.

The certain etching atmosphere may be provided to etch a metal containing film forming the preliminary source/drain contacts RCA. In the certain etching atmosphere, the etching amount of the metal containing film forming the preliminary source/drain contacts RCA may be greater than the etching amount of an insulating film forming a plurality of insulating capping lines 140, and the etching amount of the insulating film forming the insulating capping lines 140 may be greater than 0. While each of the metal plug 156 and the contact insulating spacer 150 is being lowered by etching the exposed portions of the preliminary source/drain contacts RCA using the mask patterns MP as etch masks, the profile of the top surface of a preliminary source/drain contact RCA including the upper recess UR illustrated in FIGS. 17A and 17B may be transferred downwards. As a result, after the source/drain contact patterns CAP are formed, a lower recess LR exposing the top surface of the conductive barrier film 154 may be formed on a top surface of the second segment S2 of each of the source/drain contact patterns CAP, which is between the metal plug 156 and the contact insulating spacer 150. The outer sidewall of the metal plug 156 of each of the source/drain contact patterns CAP and the inner sidewall of the contact insulating spacer 150 may be exposed by the lower recess LR.

In example embodiments, a vertical height LRH of the lower recess LR exposing the top surface of the conductive barrier film 154 may be about 1 nm to about 5 nm, for example, about 2 nm to about 3 nm.

The heights of portions of the insulating capping lines 140, which are exposed to the certain etching atmosphere while the exposed portions of the preliminary source/drain contacts RCA are being etched using the mask patterns MP as etch masks, may be lowered.

While the source/drain contact patterns CAP including the first segment S1 and the second segment S2 are being formed, the height of each of the mask patterns MP, a plurality of insulating spacers 120, and the intergate insulating film 128 may be lowered in the certain etching atmosphere.

Figure 20A:
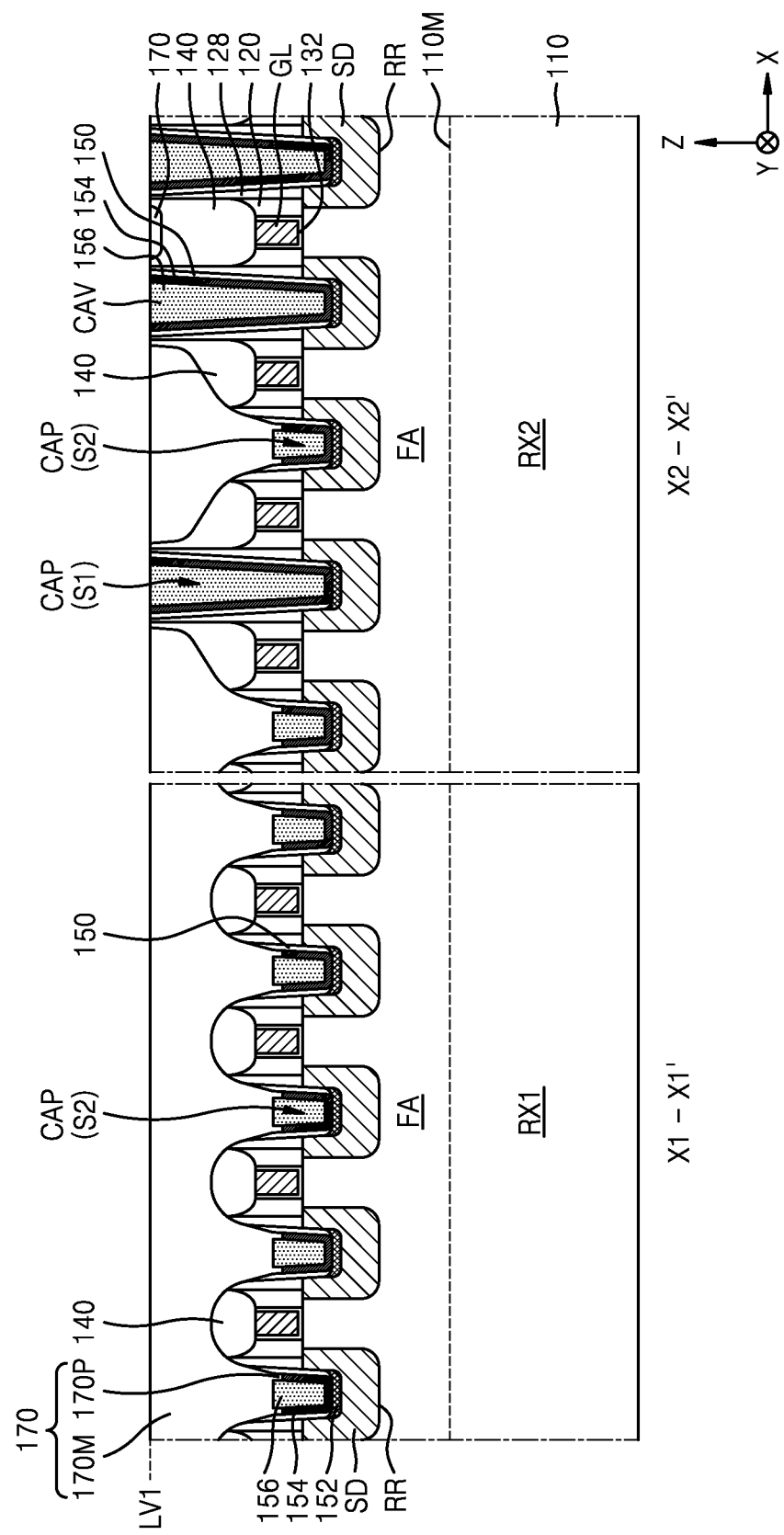
Figure 20B:
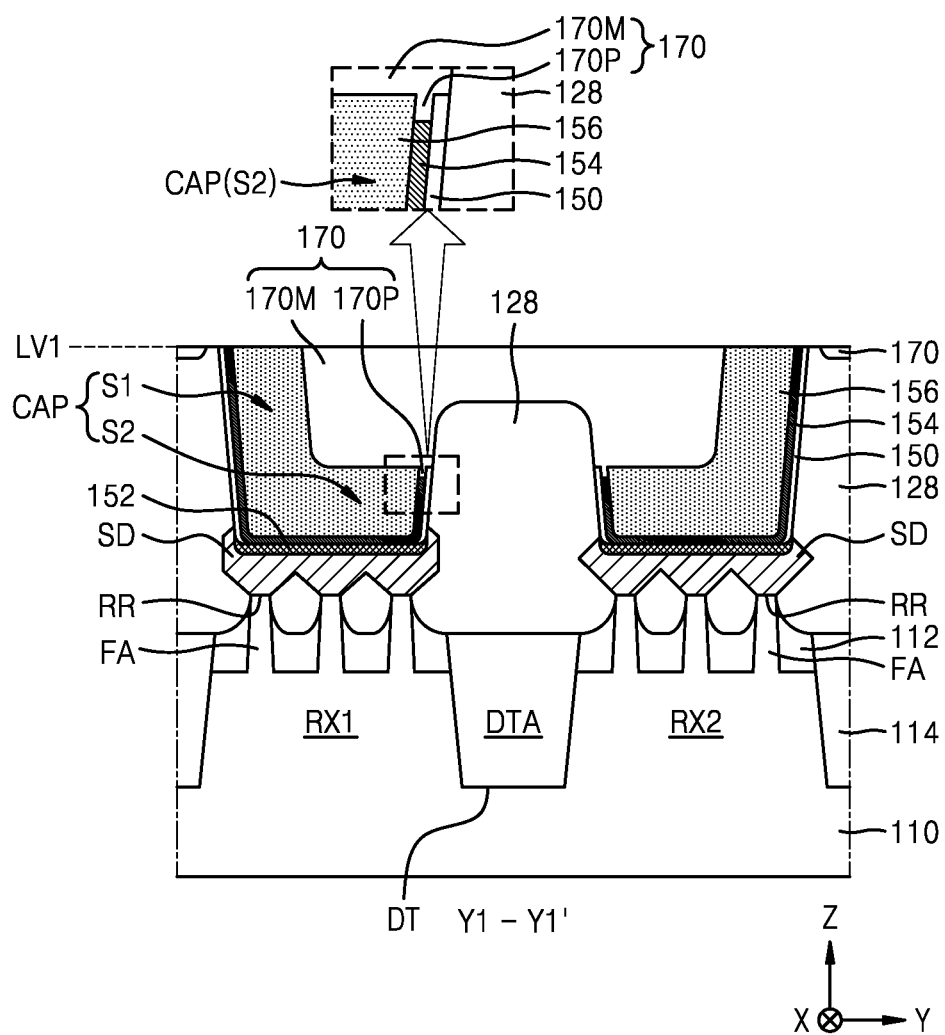

Referring to FIGS. 20A and 20B, an insulating film is formed on the resultant structure of FIGS. 19A and 19B to have a thickness enough to fill spaces among the mask patterns MP, and planarization is performed on a resultant structure including the insulating film to form the buried insulating film 170 including the planarized insulating film. While the planarization is being performed until the buried insulating film 170 is obtained, the mask patterns MP, the etch stop film 160, an upper portion of each of the source/drain contact patterns CAP are removed such that the respective top surfaces of the conductive barrier film 154 and the metal plug 156, which form the first segment S1 of each of the source/drain contact patterns CAP, may be coplanar with each other and may be substantially at the vertical level LV1.

The second segment S2 of each of the source/drain contact patterns CAP and the insulating capping lines 140 may be covered with the buried insulating film 170. The buried insulating film 170 may be formed to fill a space above the second segment S2 of each of the source/drain contact patterns CAP among the gate lines GL. The buried insulating film 170 may include the buried protrusion 170P, which fills the lower recess LR (see FIGS. 19A and 19B) on the top surface of the second segment S2.

The buried insulating film 170 may have a planarized top surface (e.g., a flat or substantially planar top surface). The top surface of the buried insulating film 170 may extend substantially at the vertical level LV1 on the same plane as the respective top surfaces of the conductive barrier film 154 and the metal plug 156, which form the first segment S1.

Figure 21A:
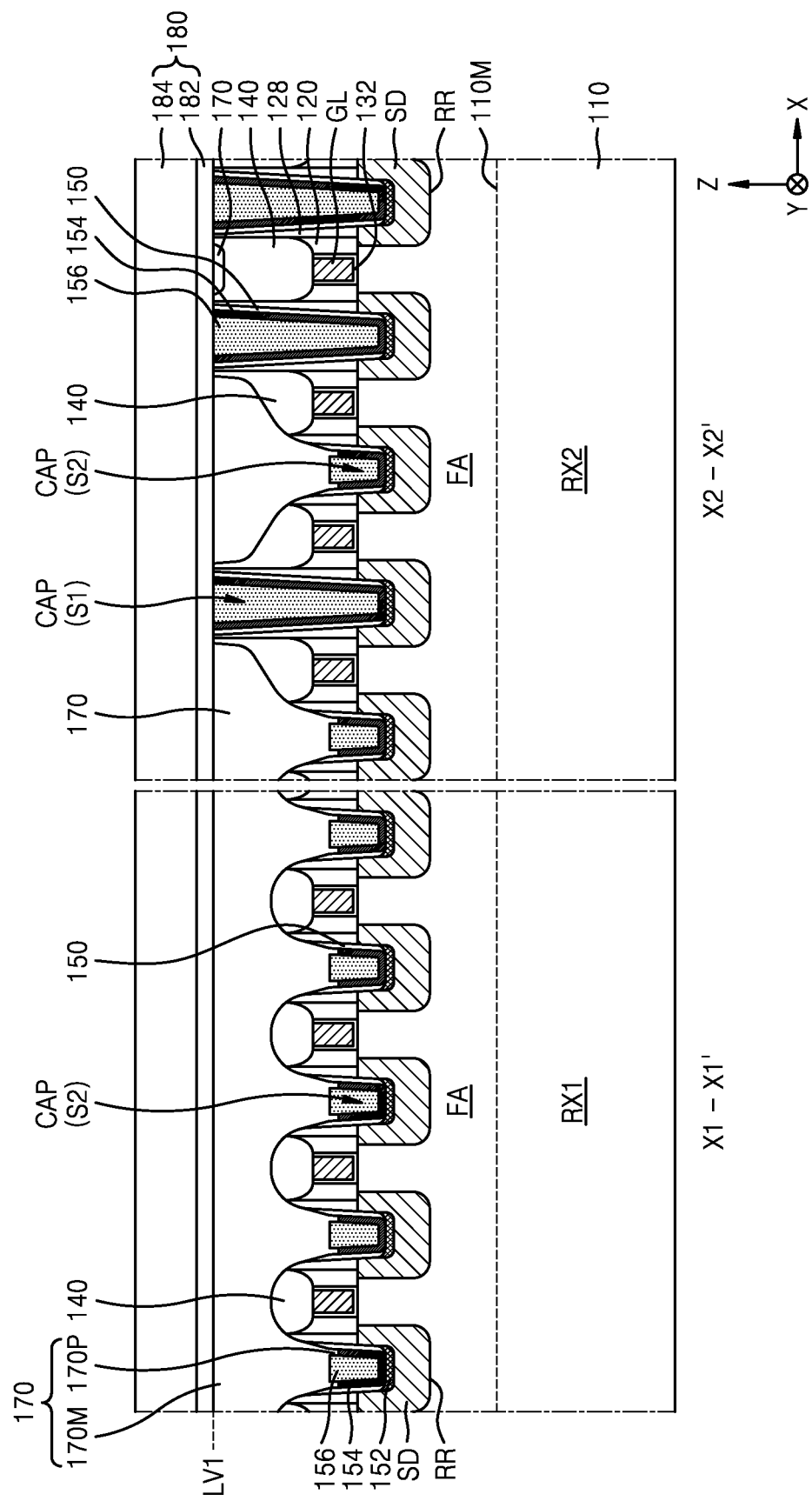
Figure 21B:
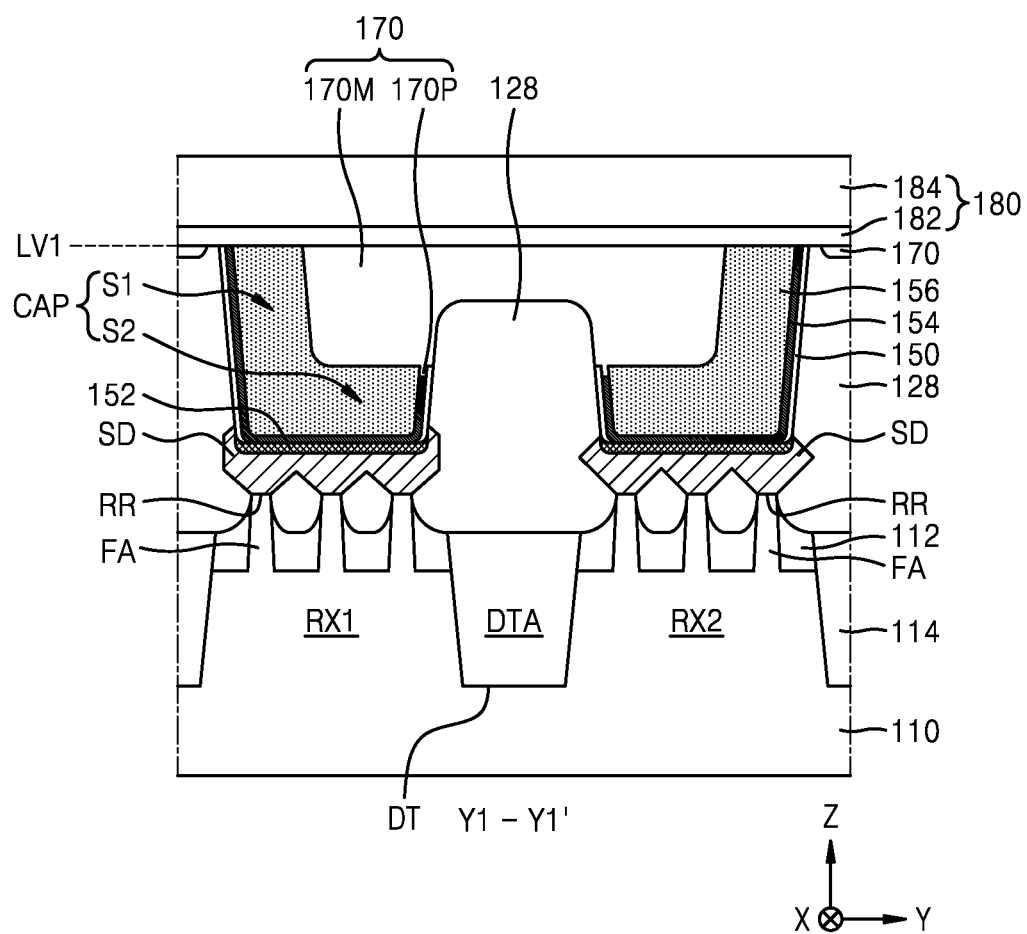

Referring to FIGS. 21A and 21B, the insulating structure 180 is formed on the resultant structure of FIGS. 20A and 20B. The insulating structure 180 may include the etch stop film 182 and the interlayer insulating film 184, which are sequentially formed on the buried insulating film 170 and the source/drain contact patterns CAP.

Figure 22A:
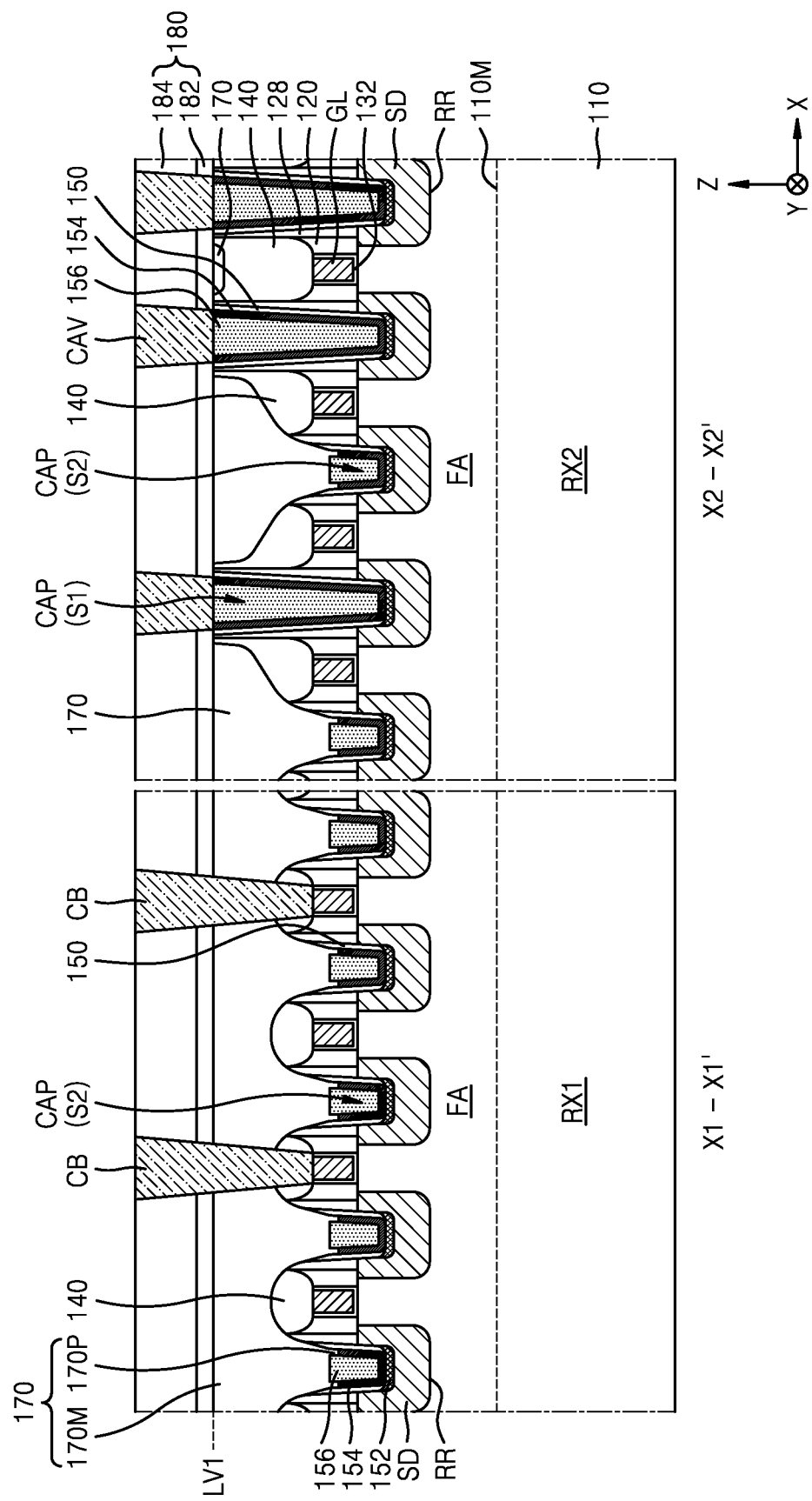
Figure 22B:
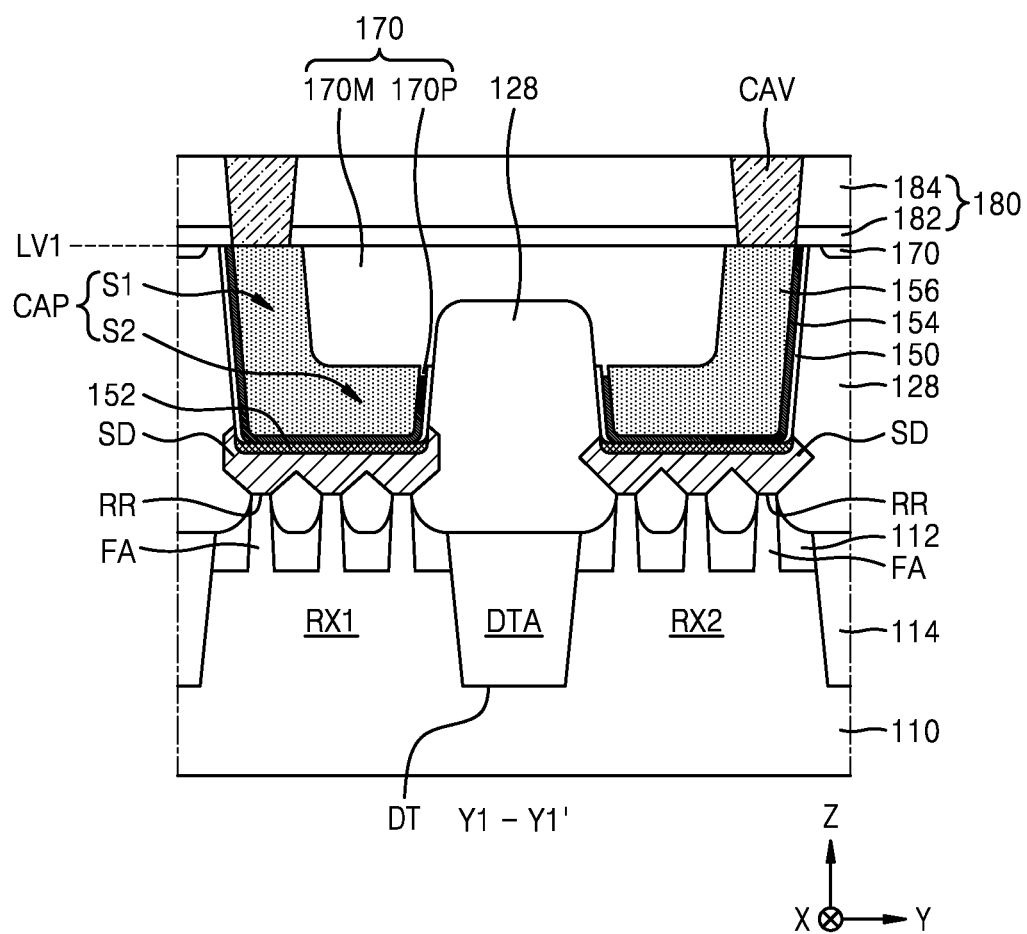

Referring to FIGS. 22A and 22B, a plurality of source/drain via contacts CAV connected to the respective first segments S1 of the source/drain contact patterns CAP and a plurality of gate contacts CB connected to a plurality of gate lines GL, respectively, are formed.

In example embodiments, the source/drain via contacts CAV and the gate contacts CB may be simultaneously formed. In example embodiments, the source/drain via contacts CAV and the gate contacts CB may be sequentially formed using separate processes. In this case, the gate contacts CB may be formed after the source/drain via contacts CAV are formed, or the source/drain via contacts CAV may be formed after the gate contacts CB are formed.

Each of the source/drain via contacts CAV may pass through the insulating structure 180 and be in contact with the top surface of the first segment S1 of one of the source/drain contact patterns CAP. Each of the gate contacts CB may pass through the interlayer insulating film 184, the etch stop film 182, the buried insulating film 170, and one of the insulating capping lines 140 and be in contact with the top surface of one of the gate lines GL.

Each of some gate contacts CB may be in contact with the gate line GL in a location adjacent to the second segment S2 of the source/drain contact pattern CAP. In this case, as shown in FIG. 22A, the buried protrusion 170P of the buried insulating film 170 may be between the second segment S2 of the source/drain contact pattern CAP and the gate line GL adjacent to the second segment S2 in the first horizontal direction (the X direction). Accordingly, a separation distance from the conductive barrier film 154 and the metal plug 156, which form the second segment S2, to the gate line GL may be secured at least by the buried protrusion 170P. Therefore, even when the gate contact CB is adjacent to the second segment S2 of the source/drain contact pattern CAP, an insulation margin between the gate contact CB and the source/drain contact pattern CAP may be secured, thereby reducing or preventing an undesirable short-circuit between the gate contact CB and the source/drain contact pattern CAP.

FIGS. 23A through 23D are cross-sectional views illustrating a method of manufacturing an integrated circuit device, according to some embodiments of the present inventive concept. FIGS. 23A through 23D show cross-sectional views of portions respectively corresponding to the cross-sections, respectively taken along the lines X1-X1' and X2-X2' in FIG. 1, in the sequential stages. Another example of a method of manufacturing the integrated circuit device 100 illustrated in FIGS. 1 through 2D will be described with reference to FIGS. 23A through 23D below.

Figure 23A:
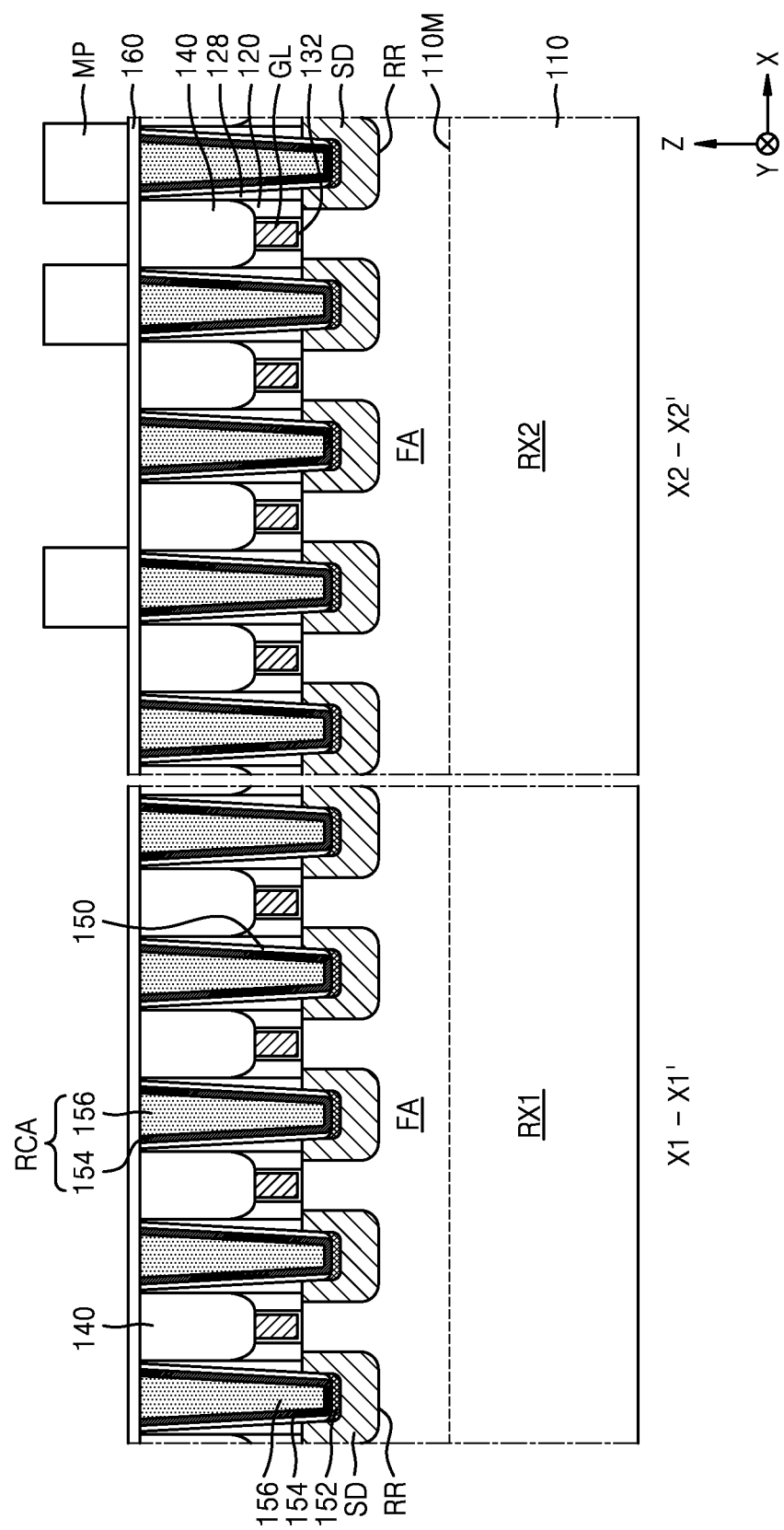
FIGS. 23A through 23D are cross-sectional views illustrating a method of manufacturing an integrated circuit device, according to some embodiments of the present inventive concept.

Referring to FIG. 23A, the etch stop film 160 and a plurality of mask patterns MP are formed on the resultant structure, which is obtained by performing the method described with reference to FIGS. 11A through 16B to form a plurality of preliminary source/drain contacts RCA, using the method described with reference to FIGS. 18A and 18B.

Figure 23B:
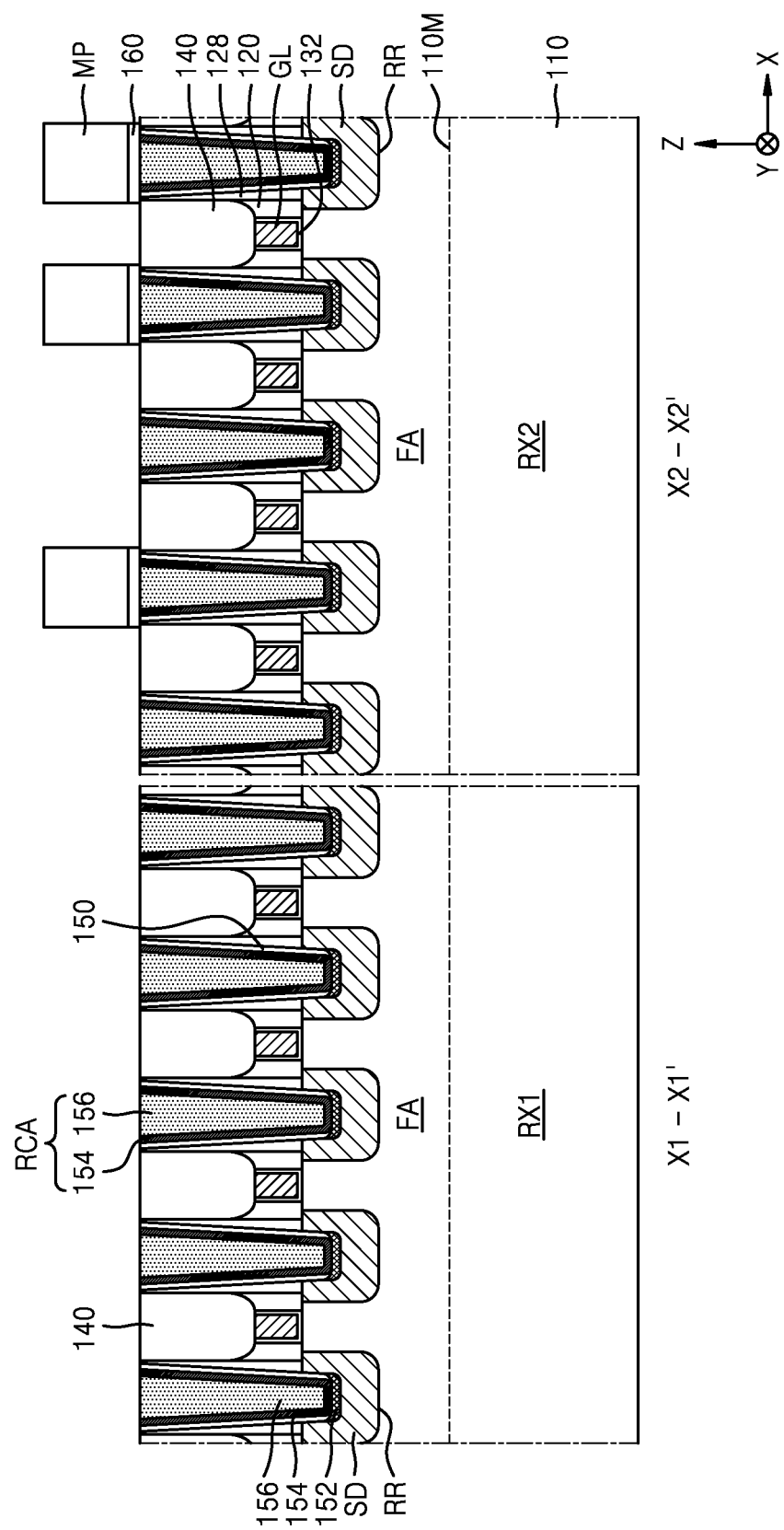

Referring to FIG. 23B, the etch stop film 160 is etched using the mask patterns MP as etch masks in the resultant structure of FIG. 23A, thereby exposing some of the preliminary source/drain contacts RCA.

Figure 23C:
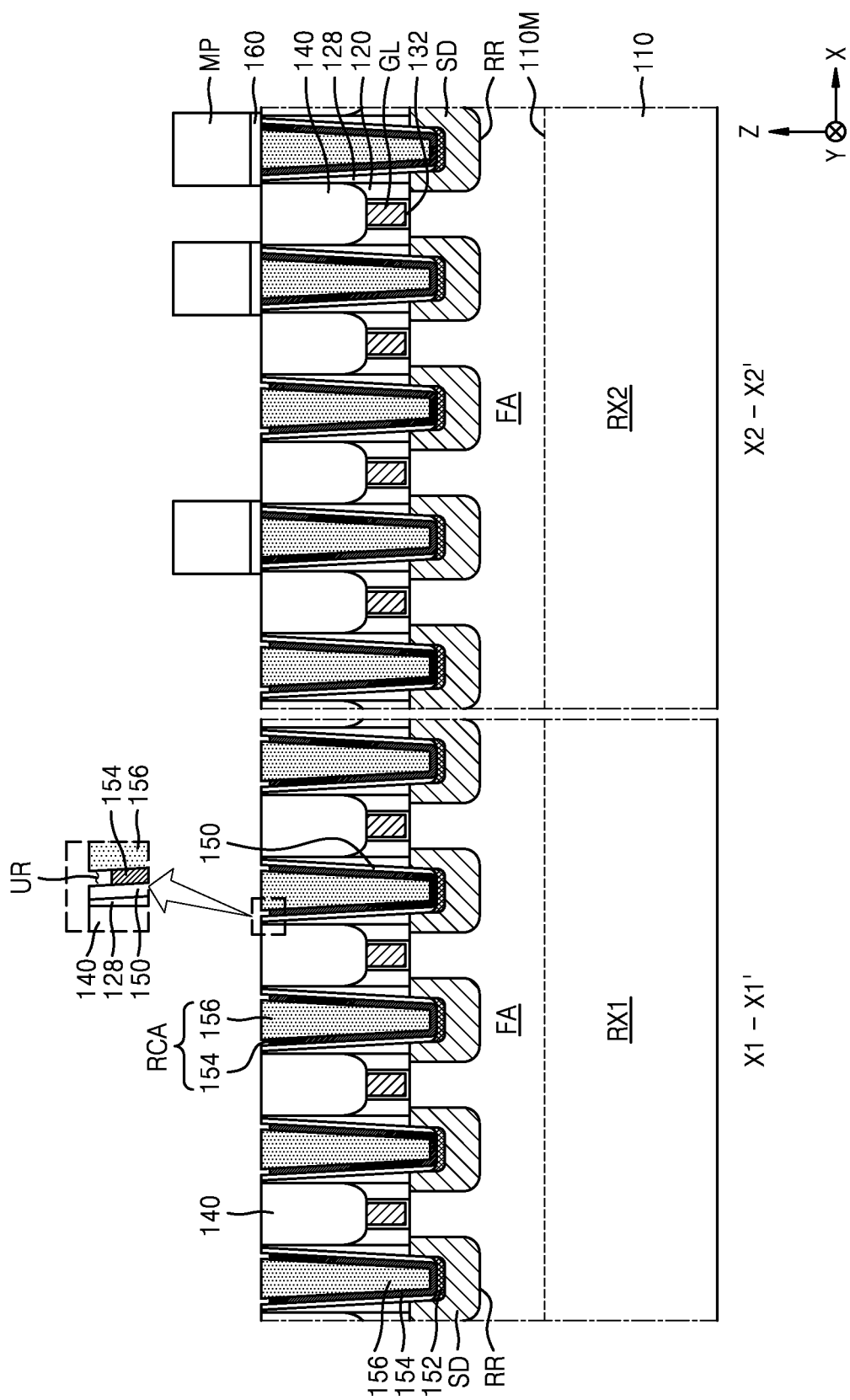

Referring to FIG. 23C, an etch-back process is performed on the resultant structure of FIG. 23B using the mask patterns MP as etch masks so that a portion of the conductive barrier film 154 in each exposed one among the preliminary source/drain contacts RCA is selectively removed by the method described with reference to FIGS. 17A and 17B. As a result, the height of the top surface of the conductive barrier film 154 is lowered and the upper recess UR is formed.

Figure 23D:
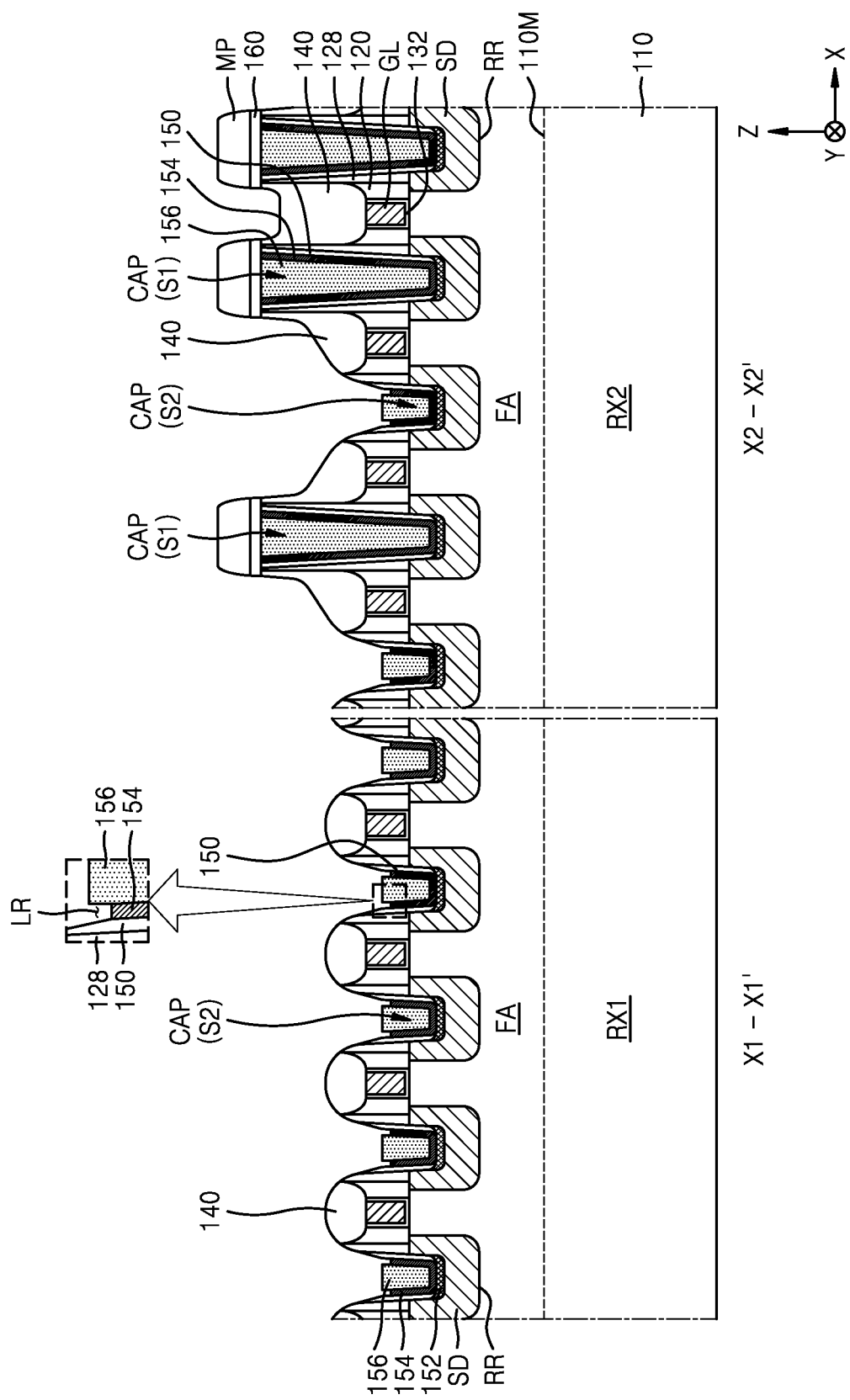

Referring to FIG. 23D, a plurality of source/drain contact patterns CAP each including a first segment S1 and a second segment S2, which are integrally connected to each other, are formed by a method similar to that described with reference to FIGS. 19A and 19B by etching the preliminary source/drain contacts RCA in the resultant structure of FIG. 23C using the mask patterns MP as etch masks. The lower recess LR exposing the top surface of the conductive barrier film 154 may be formed on the top surface of the second segment S2 of each of the source/drain contact patterns CAP, which is between the metal plug 156 and the contact insulating spacer 150.

Thereafter, the integrated circuit device 100 illustrated in FIGS. 1 through 2D may be manufactured by performing the processes described with reference to FIGS. 20A through 22B.

Figure 24A:
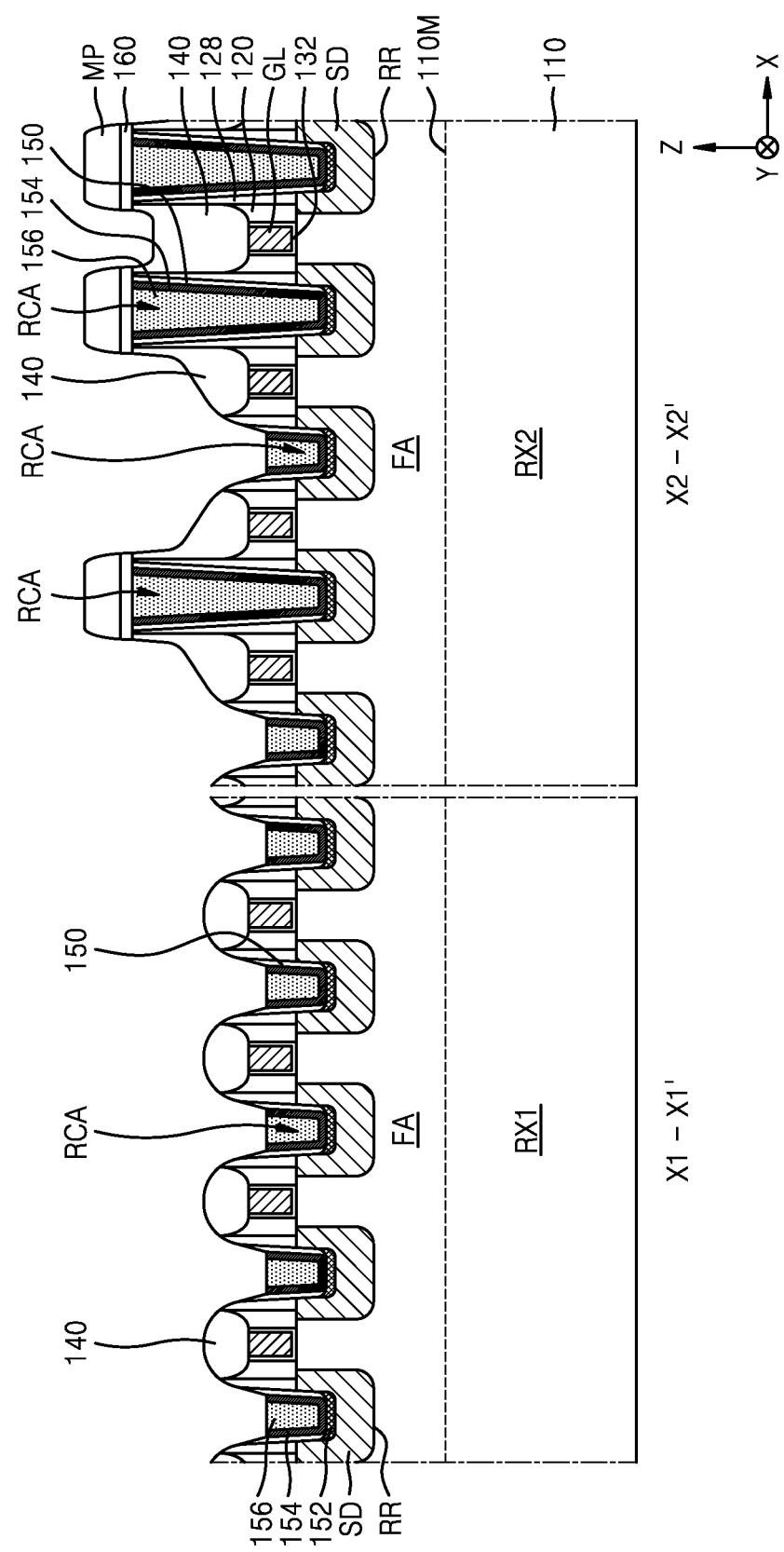
FIGS. 24A and 24B are cross-sectional views illustrating a method of manufacturing an integrated circuit device, according to some embodiments of the present inventive concept.
Figure 24B:
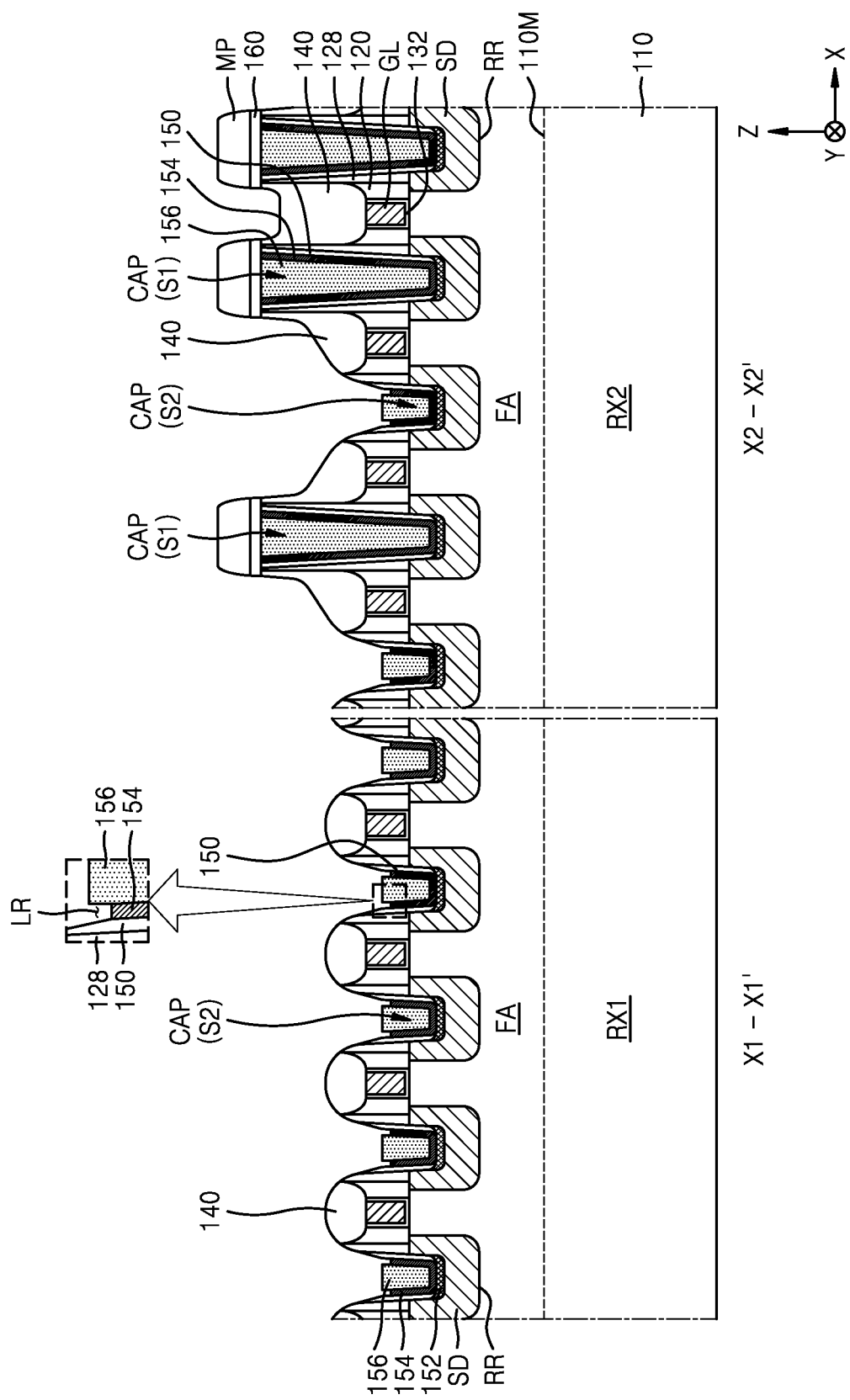

FIGS. 24A and 24B are cross-sectional views illustrating a method of manufacturing an integrated circuit device, according to some embodiments of the present inventive concept. FIGS. 24A and 24B show cross-sectional views of portions respectively corresponding to the cross-sections, respectively taken along the lines X1-X1' and X2-X2' in FIG. 1, in the sequential stages. Still another example of a method of manufacturing the integrated circuit device 100 illustrated in FIGS. 1 through 2D will be described with reference to FIGS. 24A and 24B below.

Referring to FIG. 24A, after the etch stop film 160 and the mask patterns MP are formed on a resultant structure including the preliminary source/drain contacts RCA formed by the method described with reference to FIGS. 23A and 23B, and the preliminary source/drain contacts RCA are etched, using the mask patterns MP as etch mask, by a method similar to that described with reference to FIG. 23D so that the height of a portion corresponding to the second segment S2 of each of the source/drain contact patterns CAP illustrated in FIGS. 2A and 2B is lowered.

While the heights of some of the preliminary source/drain contacts RCA are being lowered by etching exposed portions of the preliminary source/drain contacts RCA using the mask patterns MP as etch masks, the profile of the top surface of each of the preliminary source/drain contacts RCA in FIG. 23B may be transferred downwards. As a result, in a portion in which the height of each of the preliminary source/drain contacts RCA is lowered, the top surface of the conductive barrier film 154 may be substantially at the same level as the top surface of the metal plug 156.

Referring to FIG. 24B, an etch-back process is performed on the resultant structure of FIG. 24A using the mask patterns MP as etch masks so that a portion of the conductive barrier film 154 in each exposed one among the preliminary source/drain contacts RCA is selectively removed by a method similar to the method described with reference to FIGS. 17A and 17B, thereby lowering the height of the top surface of the conductive barrier film 154 and forming a lower recess LR. As a result, a plurality of source/drain contact patterns CAP each including a first segment S1 and a second segment S2, which are integrally connected to each other, may be formed.

In some embodiments, instead of performing the process described with reference to FIG. 24B, the resultant structure of FIG. 24B may be obtained from the resultant structure of FIG. 23B, using one-step etching of the preliminary source/drain contacts RCA, by applying an etching atmosphere, in which an etch selectivity of each of the conductive barrier film 154 and the metal plug 156 may be appropriately controlled, while the preliminary source/drain contacts RCA are being etched using the mask patterns MP as etch masks in the process described with reference to FIG. 24A. The structure shown in FIG. 24B may be formed by performing a single etch process on the structure shown in FIG. 23B using the mask patterns MP as etch masks.

Thereafter, the integrated circuit device 100 illustrated in FIGS. 1 through 2D may be manufactured by performing the processes described with reference to FIGS. 20A through 22B.

Although examples of a method of manufacturing the integrated circuit device 100 illustrated in FIGS. 1 through 2D have been described with reference to FIGS. 11A through 22B, FIGS. 23A through 23D, and FIGS. 24A and 24B, it will be understood by those skilled in the art that the integrated circuit devices 100A through 100H illustrated in FIGS. 3A through 3H, the integrated circuit device 200 illustrated in FIGS. 4A and 4B, the integrated circuit device 300 illustrated in FIGS. 5A and 5B, the integrated circuit device 400 illustrated in FIGS. 6A and 6B, the integrated circuit device 500 illustrated in FIGS. 7A and 7B, the integrated circuit device 600 illustrated in FIGS. 8A and 8B, the integrated circuit device 700 illustrated in FIG. 9, the integrated circuit device 900 illustrated in FIGS. 10A through 10C, and other integrated circuit devices having various structures modified and changed therefrom may be manufactured by making various modifications and changes to the methods described with reference to FIGS. 11A through 22B, FIGS. 23A through 23D, and FIGS. 24A and 24B, without departing from the scope of the present inventive concept.

In example embodiments, the processes of manufacturing the integrated circuit device 100, which are described with reference to FIGS. 11A through 22B, may be used to manufacture the integrated circuit device 200 illustrated in FIGS. 4A and 4B. However, after the source/drain via contacts CAV and the gate contacts CB are formed in the stage described with reference to FIGS. 22A and 22B, a process of forming a plurality of conductive lines ML connected to the source/drain via contacts CAV and the gate contacts CB may be further performed.

In example embodiments, to manufacture the integrated circuit device 300 illustrated in FIGS. 5A and 5B and the integrated circuit device 400 illustrated in FIGS. 6A and 6B, the processes of manufacturing the integrated circuit device 100, which have been described with reference to FIGS. 11 through 22B, may be used. However, in the process of forming the upper recess UR, as described with reference to FIGS. 17A and 17B, and/or the process of forming the lower recess LR, as described with reference to FIGS. 19A and 19B, the etch selectivity of the conductive barrier film 154 with respect to the metal plug 156 may be controlled such that, instead of the metal plug 156, the metal plug 356, which has the rounded corner 356C in the outer edge of the protruding top portion 356P, as describe with reference to FIGS. 5A and 5B, or the metal plug 456, which has the top surface portion 456T and the rounded corner 456C in the protruding top portion 456P, as describe with reference to FIGS. 6A and 6B, may be formed in the final structure including the lower recess LR.

In example embodiments, to manufacture the integrated circuit device 500 illustrated in FIGS. 7A and 7B, the processes of manufacturing the integrated circuit device 100, which have been described with reference to FIGS. 11 through 22B, may be used. However, in the process of forming the metal plug 156, as described with reference to FIGS. 16A and 16B, the metal plug 156 may be formed to have a seam or a void at least in an inner portion thereof in the process of forming the upper recess UR, as described with reference to FIGS. 17A and 17B, and/or the process of forming the lower recess LR, as described with reference to FIGS. 19A and 19B, the etch selectivity of the conductive barrier film 154 with respect to the metal plug 156 may be controlled such that a portion of the metal plug 156, which is relatively weak because of the seam or the void in the metal plug 156, is also etched during an etching process for the formation of the upper recess UR or the lower recess LR, so as to form the metal plug 556, which has a double-humped protrusion in the protruding top portion 556P, instead of the metal plug 156, in the final structure including the lower recess LR.

FIGS. 25A through 31 are cross-sectional views illustrating a method of manufacturing an integrated circuit device, according to some embodiments of the present inventive concept, wherein FIGS. 25A, 26A, 27A, 28A, 29A, 30A, and 31 show a portion corresponding to the cross-section taken along the line X9-X9' in FIG. 10A, and FIGS. 25B, 26B, 27B, 28B, 29B, and 30B show a portion corresponding to the cross-section taken along the line Y9-Y9' in FIG. 10A. An example of a method of manufacturing the integrated circuit device 900 illustrated in FIGS. 10B through 10C will be described with reference to FIGS. 25A through 31 below. In FIGS. 1 through 10C and FIGS. 25A and 31, like reference numerals and characters denote like elements, and detailed descriptions thereof may be omitted.

Figure 25A:
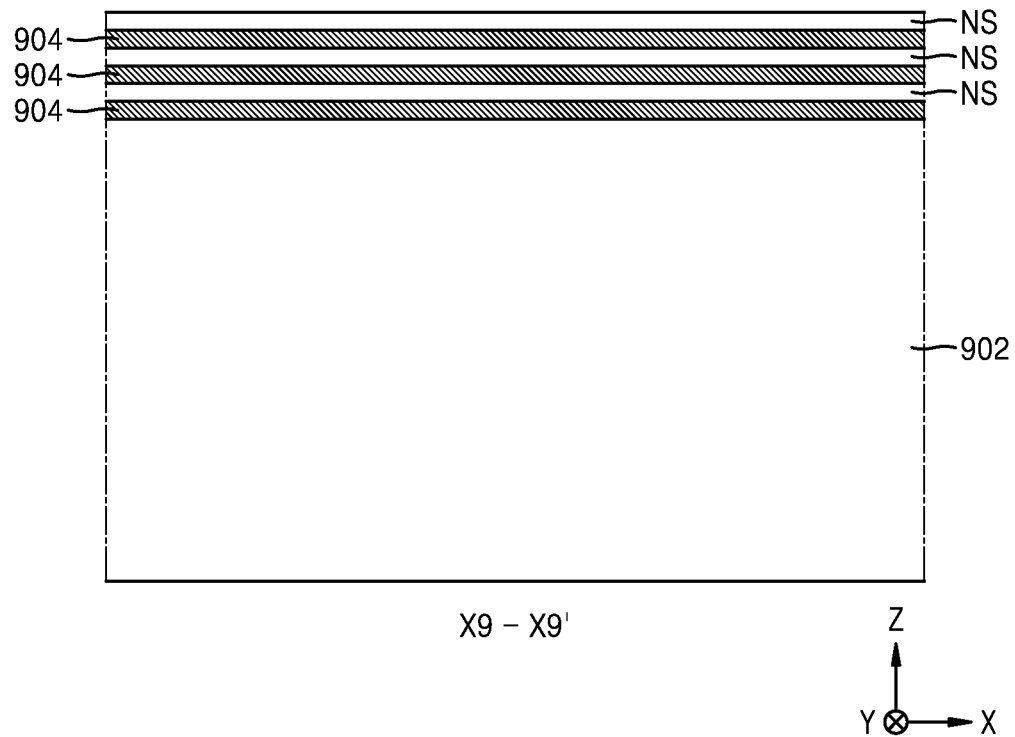
FIGS. 25A through 31 are cross-sectional views illustrating a method of manufacturing an integrated circuit device, according to some embodiments of the present inventive concept, wherein FIGS. 25A, 26A; 27A, 28A, 29A, 30A, and 31 show a portion corresponding to the cross-section taken along the line X9-X9' in FIG. 10A, and FIGS. 25B, 26B, 27B, 28B, 29B, and 30B show a portion corresponding to the cross-section taken along the line Y9-Y9' in FIG. 10A.
Figure 25B:
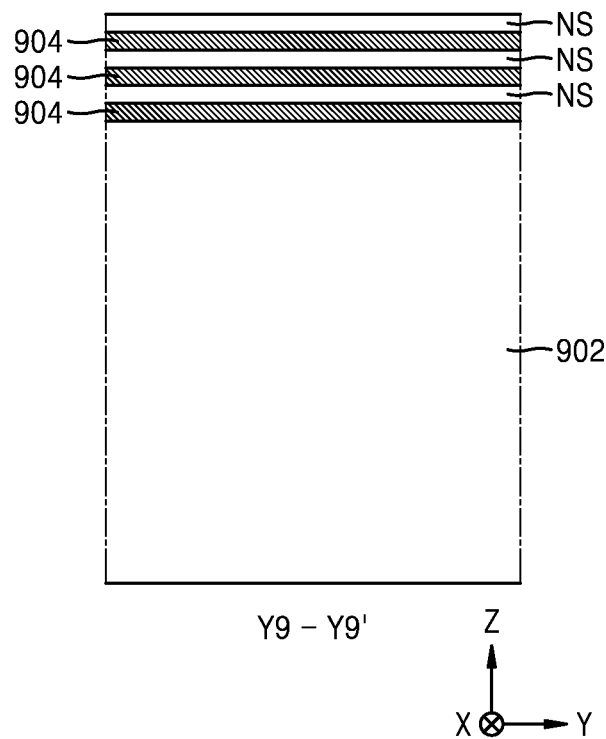

Referring to FIGS. 25A and 25B, a plurality of sacrificial semiconductor layers 904 and a plurality of nanosheet semiconductor layers NS are alternately stacked on the substrate 902. The sacrificial semiconductor layers 904 may include a different material than the nanosheet semiconductor layers NS. In example embodiments, the sacrificial semiconductor layers 904 may include, for example, SiGe, and the nanosheet semiconductor layers NS may include, for example, Si.

Figure 26A:
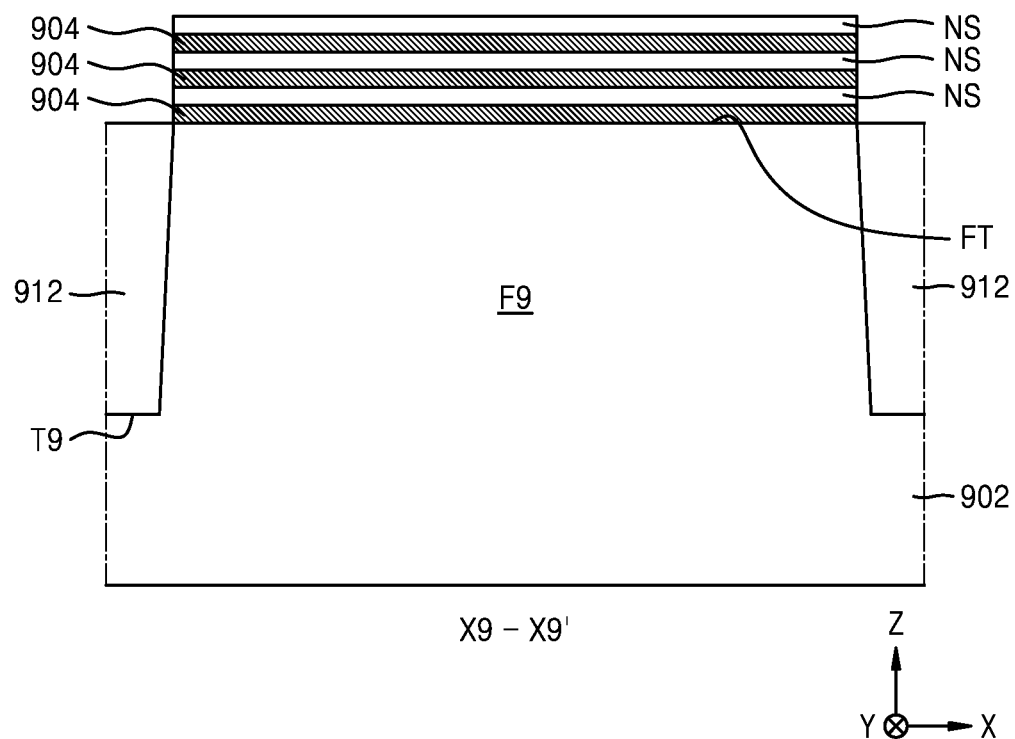
Figure 26B:
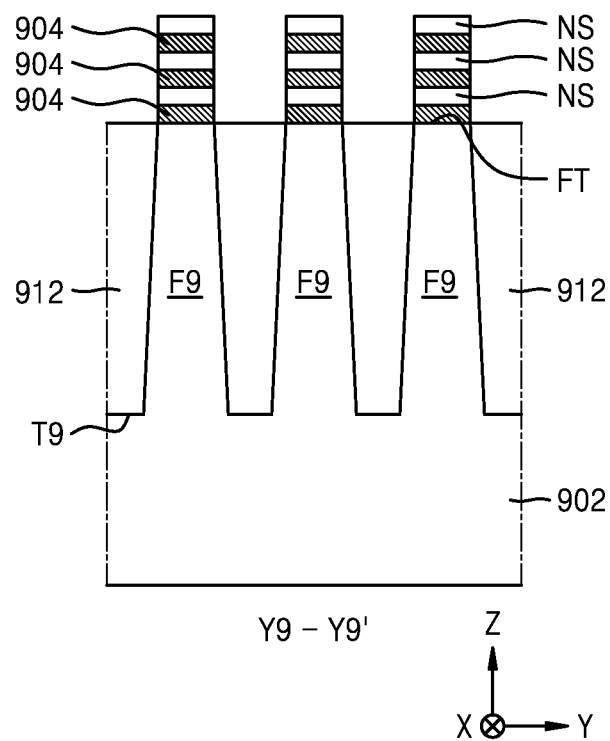

Referring to FIGS. 26A and 26B, a trench T9 is formed by partially etching the sacrificial semiconductor layers 904, the nanosheet semiconductor layers NS, and the substrate 902, and the isolation film 912 is formed in the trench T9. As a result, a fin-type active region F9 defined by the trench T9 may be formed. A stack structure of the sacrificial semiconductor layers 904 and the nanosheet semiconductor layers NS remains on the top surface FT of the fin-type active region F9.

Figure 27A:
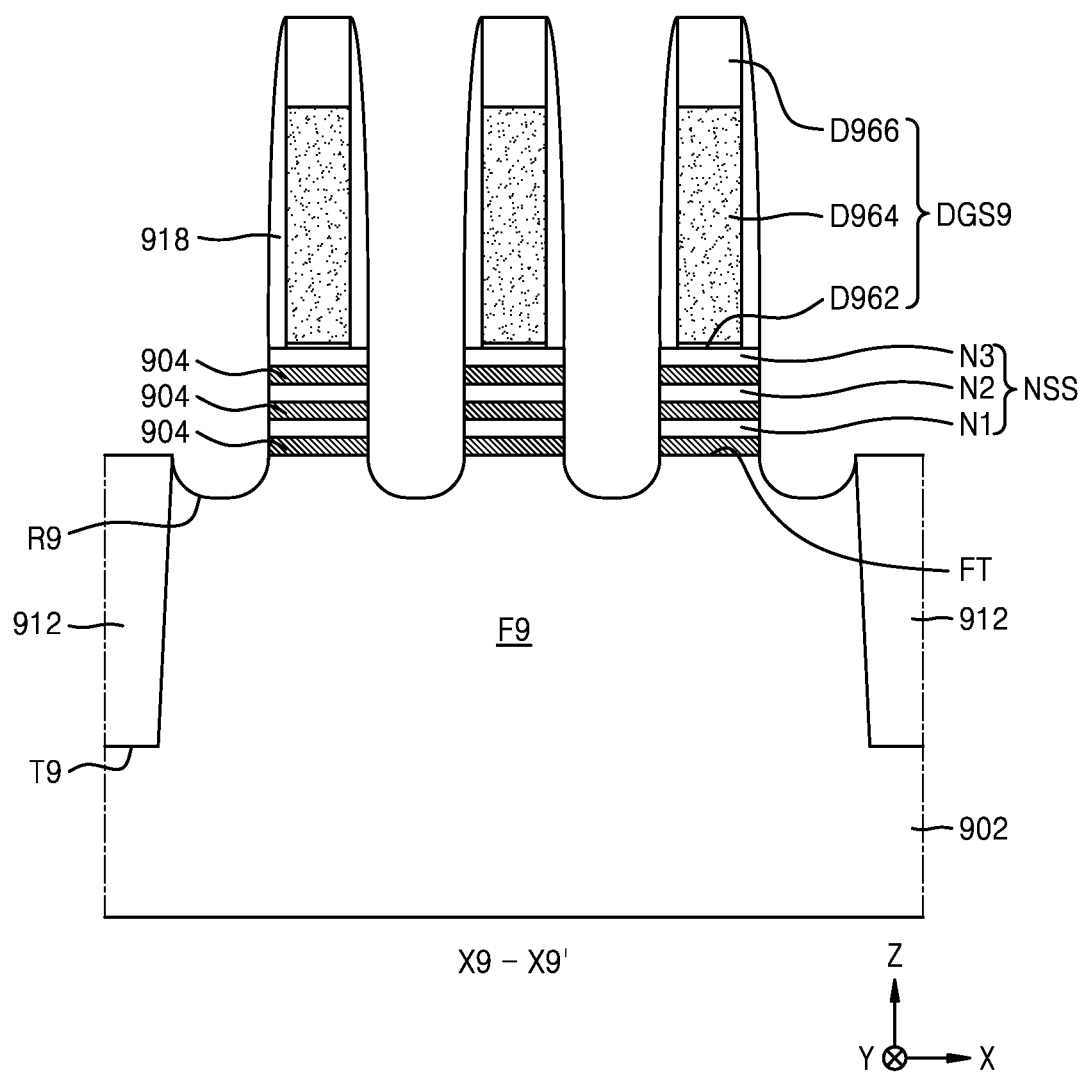
Figure 27B:
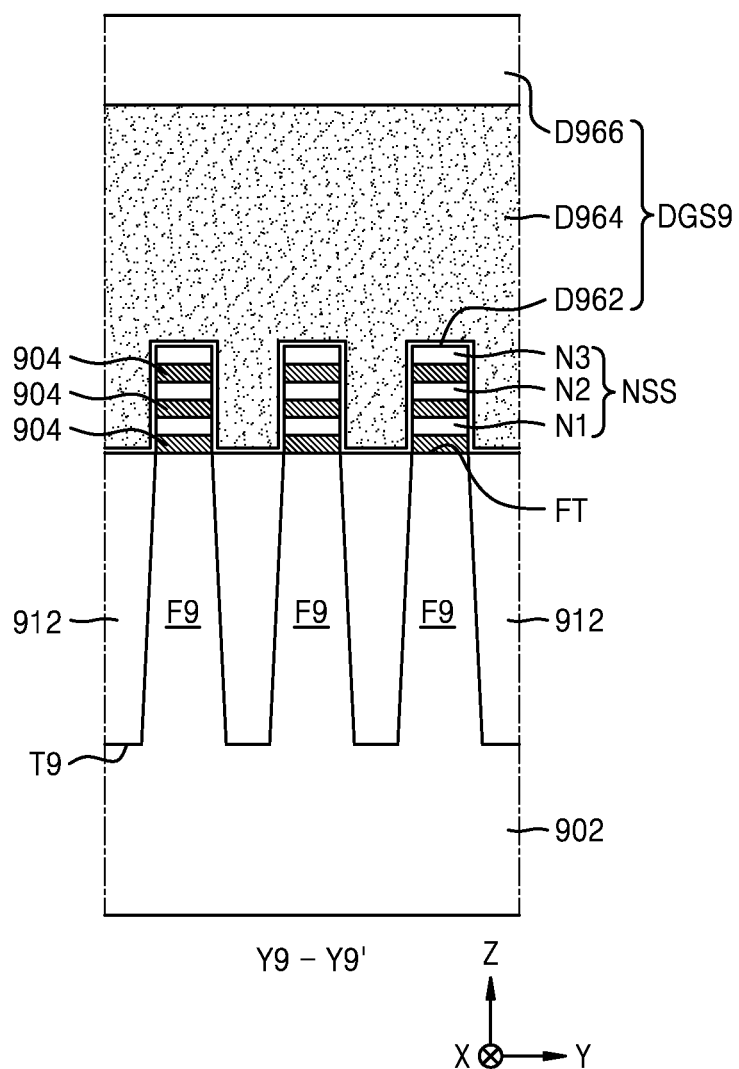

Referring to FIGS. 27A and 27B, a plurality of dummy gate structures DGS9 are formed on the stack structure of the sacrificial semiconductor layers 904 and the nanosheet semiconductor layers NS of the resultant structure of FIGS. 26A and 26B, and a plurality of outer insulating spacers 918 respectively covering both sidewalls of each of the dummy gate structures DGS9 are formed. Thereafter, the sacrificial semiconductor layers 904 and the nanosheet semiconductor layers NS are partially etched using the dummy gate structures DGS9 and the outer insulating spacers 918 as etch masks such that the nanosheet semiconductor layers NS are separated into a plurality of nanosheet stacks NSS including the first, second, and third nanosheets N1, N2, and N3. Thereafter, the fin-type active region F9 exposed among the nanosheet stacks NSS is etched, thereby forming a plurality of recess regions R9 in the upper portion of the fin-type active region F9.

Each of the dummy gate structures DGS9 may extend (e.g., extend longitudinally) in the second horizontal direction (the Y direction). Each of the dummy gate structures DGS9 may have a structure, in which an insulating layer D962, a dummy gate layer D964, and a capping layer D966 are sequentially stacked. In example embodiments, the insulating layer D962 may include, for example, silicon oxide, the dummy gate layer D964 may include, for example, polysilicon, and the capping layer D966 may include, for example, silicon nitride.

Figure 28A:
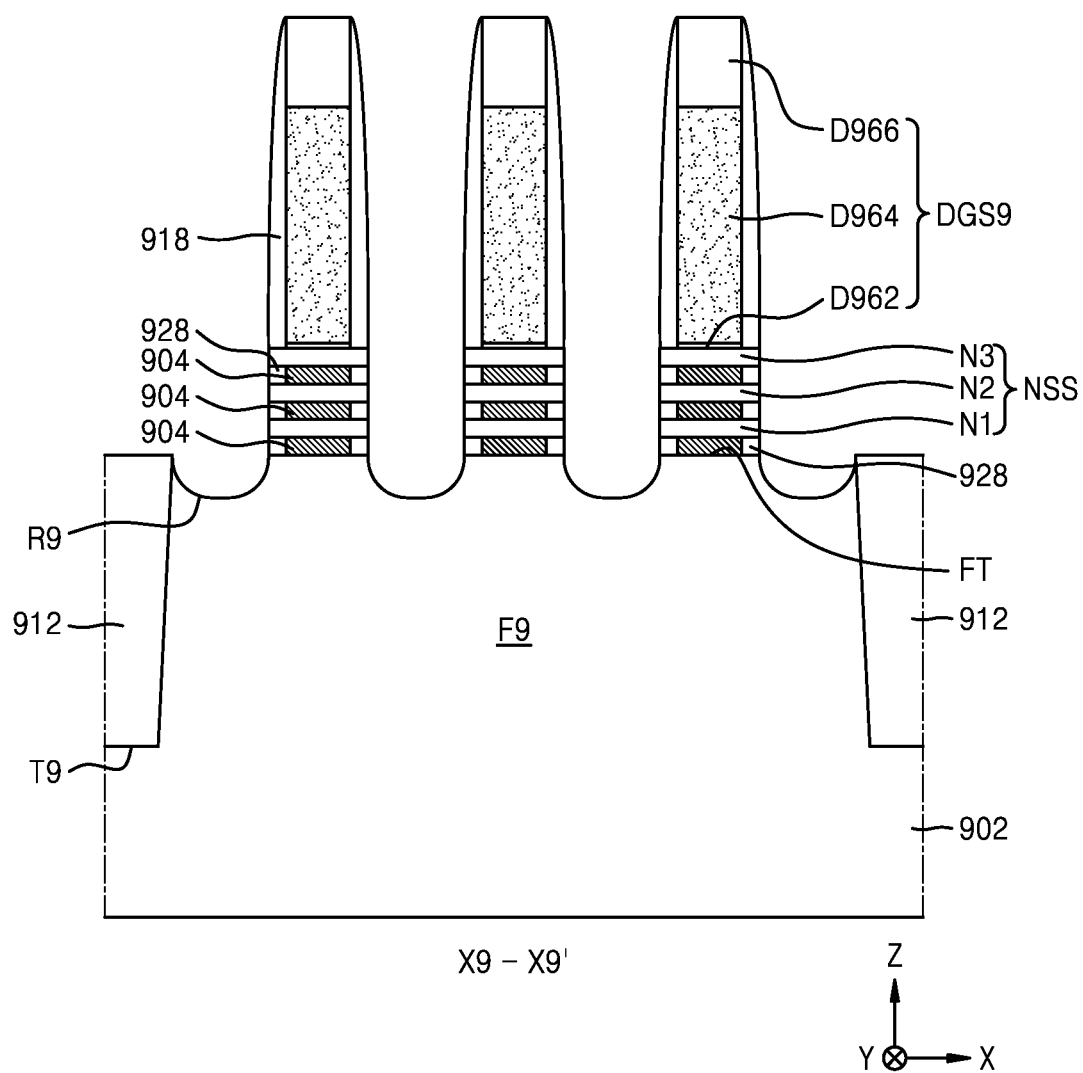
Figure 28B:
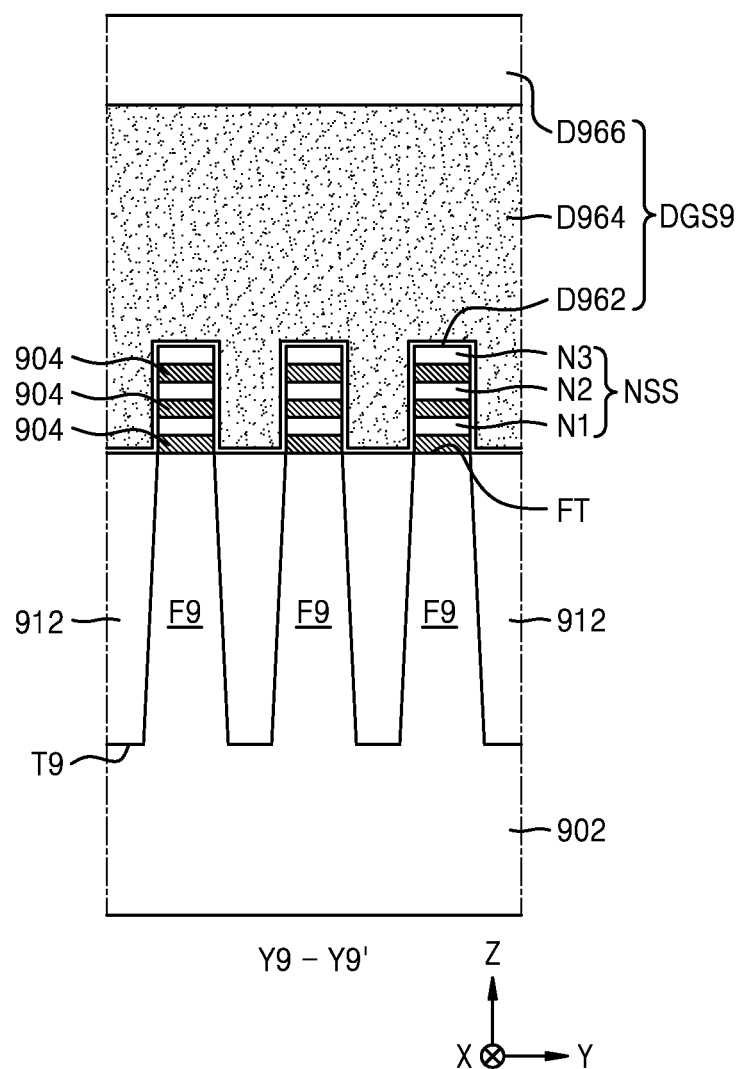

Referring to FIGS. 28A and 28B, a plurality of indents (e.g., openings) are formed among the first, second, and third nanosheets N1, N2, and N3 and the top surface FT by partially removing the sacrificial semiconductor layers 904 exposed around the recess regions R9 of the resultant structure of FIGS. 27A and 27B, and a plurality of inner insulating spacers 928 filling the indents are formed.

Figure 29A:
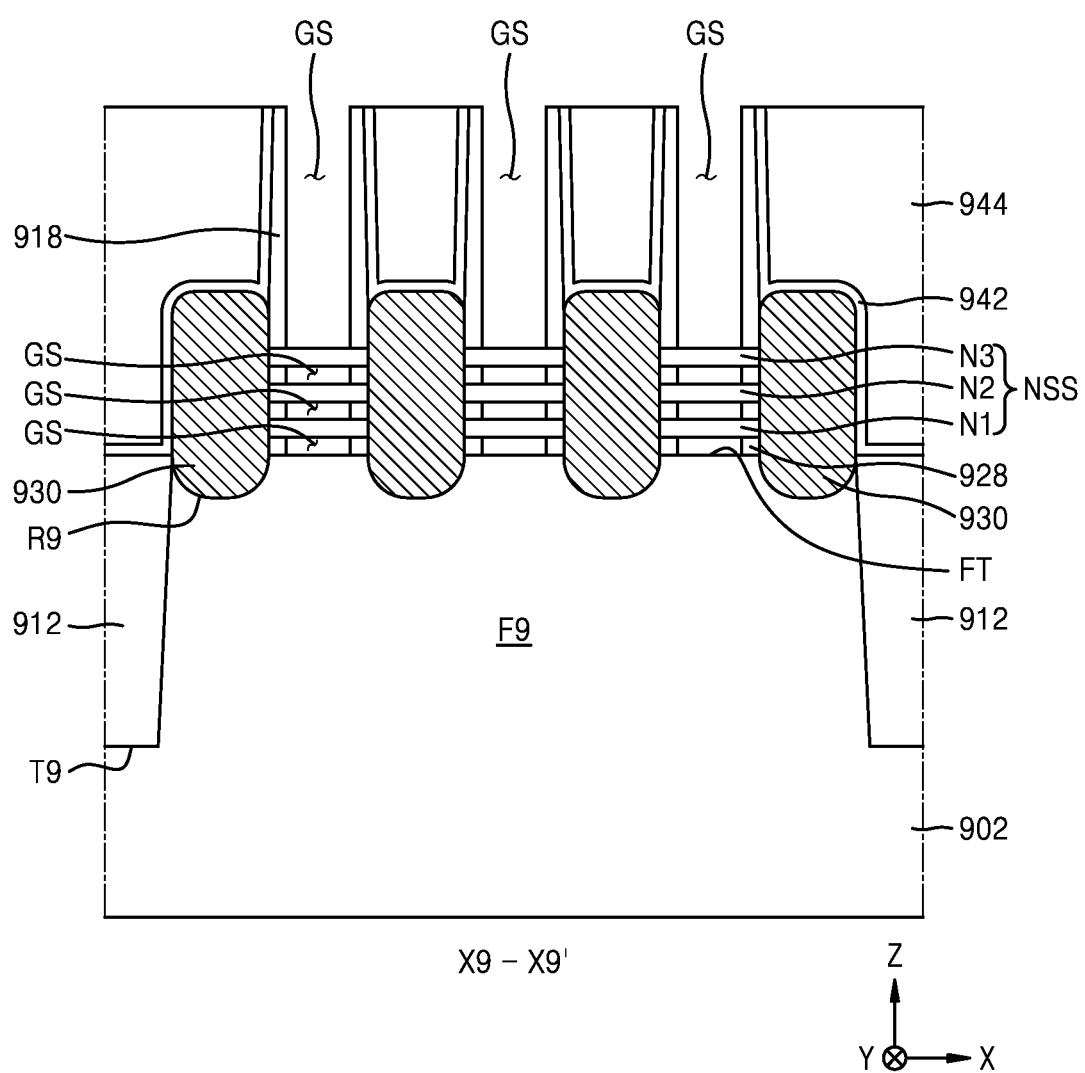
Figure 29B:
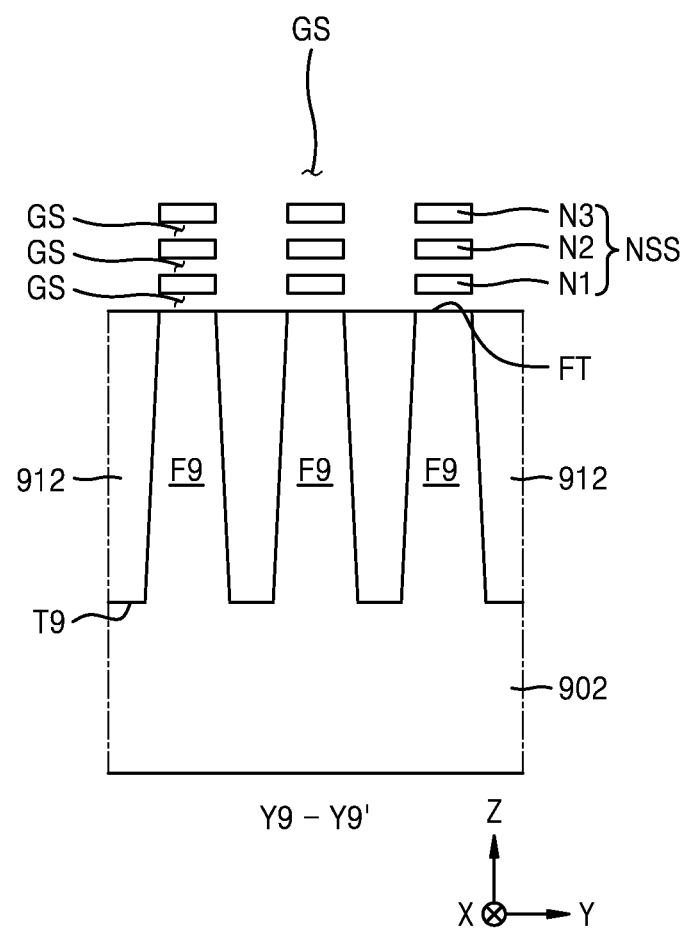

Referring to FIGS. 29A and 29B, a plurality of source/drain regions 930 are formed by epitaxially growing a semiconductor material from exposed surfaces of the recess regions R9 of the resultant structure of FIGS. 28A and 28B, an insulating liner 942 is formed to cover a resultant structure including the source/drain regions 930, an intergate insulating film 944 is formed on the insulating liner 942, and the top surface of the capping layer D966 is exposed by planarizing the top surface of each of the insulating liner 942 and the intergate insulating film 944. Thereafter, a gate space GS is provided by removing the dummy gate structures DGS9, and the sacrificial semiconductor layers 904 are removed through the gate space GS such that the gate space GS extends to spaces among the first, second, and third nanosheets N1, N2, and N3 and the top surface FT.

Figure 30A:
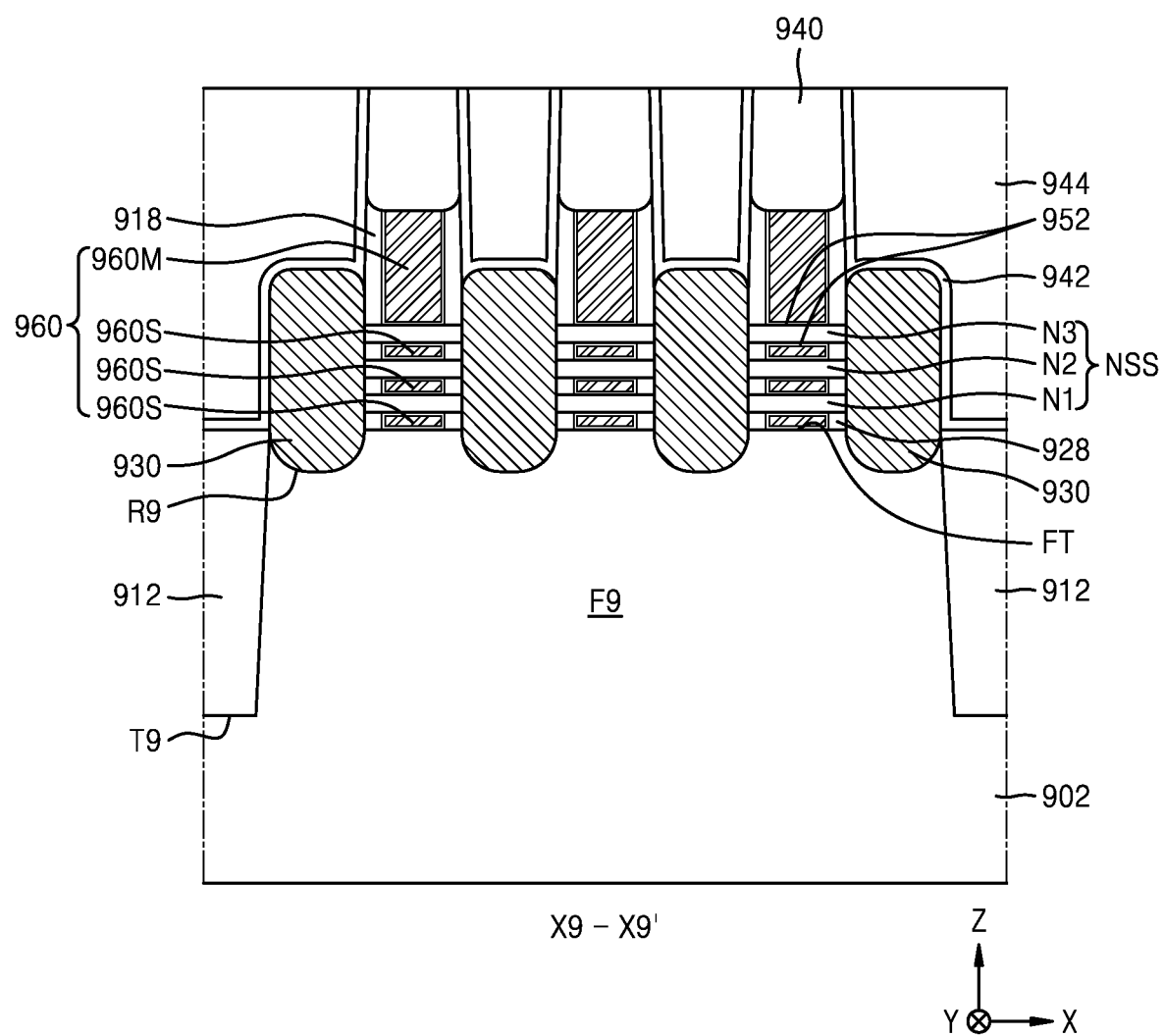
Figure 30B:
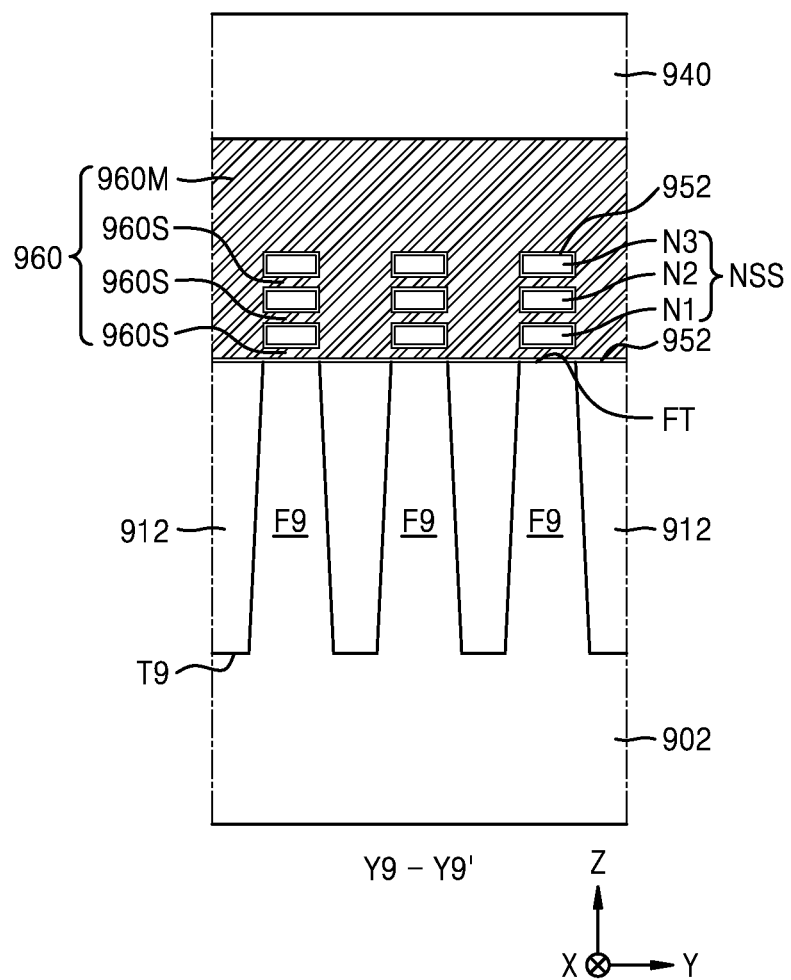

Referring to FIGS. 30A and 30B, a gate insulating film 952 is formed to cover an exposed surface of each of the first, second, and third nanosheets N1, N2, and N3 and the fin-type active region F9, a plurality of gate lines 960 are formed on the gate insulating film 952 to fill a plurality of gate spaces GS, and an upper portion of each of the gate lines 960 and an upper portion of each of the gate insulating film 952 and the outer insulating spacers 918, which are around the gate lines 960, are removed to empty the upper portion of each of the gate spaces GS. Thereafter, the upper portion of each of the gate spaces GS is filled with an insulating capping line 940. Because planarization is performed during the formation of the gate lines 960 and the insulating capping line 940, the height of each of the insulating liner 942 and the intergate insulating film 944 may be lowered.

Figure 31:
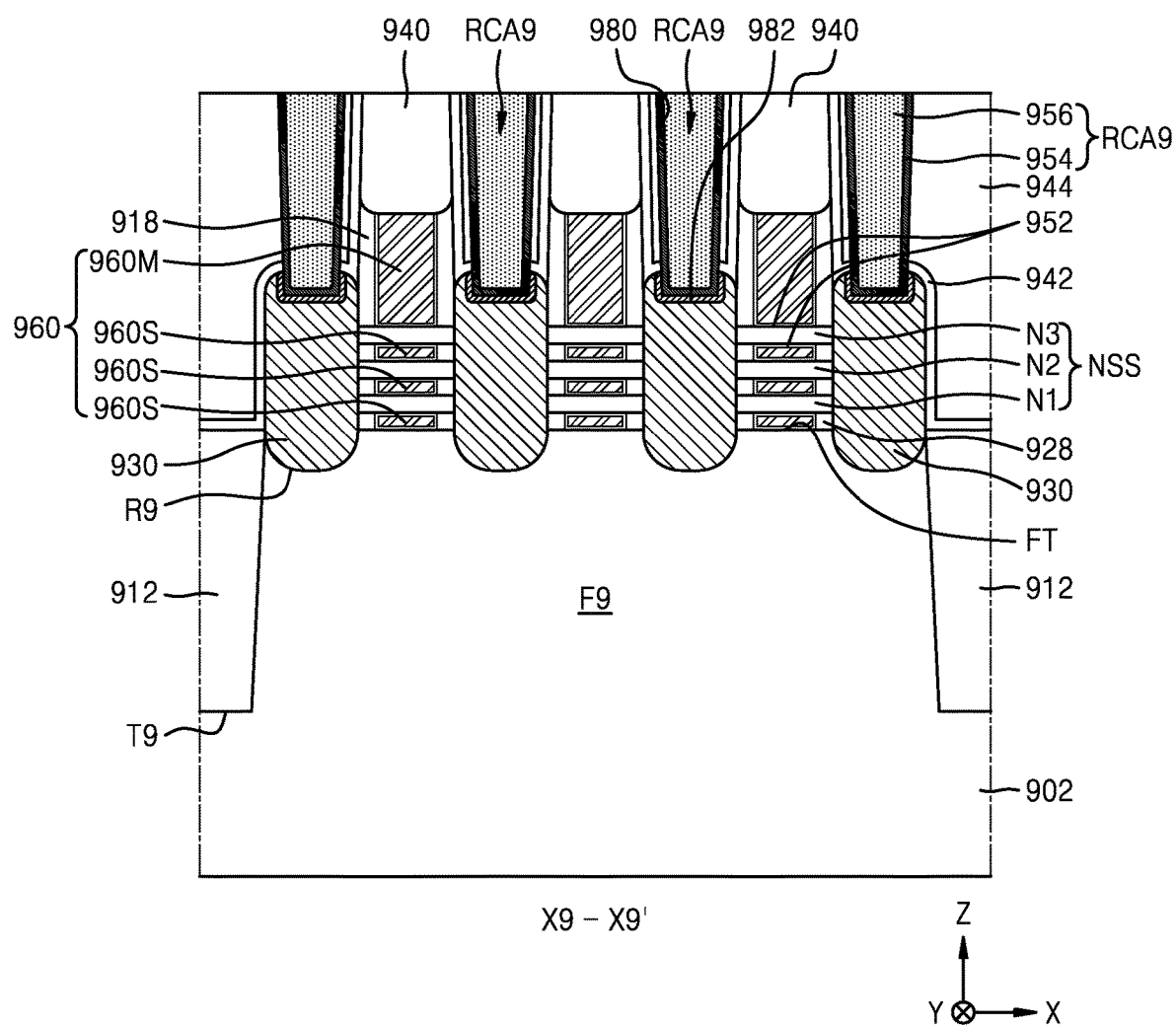

Referring to FIG. 31, a plurality of contact holes 980 exposing the source/drain regions 930 are formed by partially etching the intergate insulating film 944 and the insulating liner 942, and a metal silicide film 982 and a preliminary source/drain contact RCA9 are formed in each of the contact holes 980.

In example embodiments, the method of forming the metal silicide film 152 and the preliminary source/drain contact RCA, which has been described with reference to FIGS. 16A and 16B, may be used to form the metal silicide film 982 and the preliminary source/drain contact RCA9.

Thereafter, processes similar to those described with reference to FIGS. 17A through 19B may be performed on the resultant structure of FIG. 31, thereby forming a plurality of source/drain contact patterns CAP9 (see FIG. 10B) from a plurality of source/drain contacts RCA9. At this time, the height of a portion of the insulating capping line 940 is lowered so that the insulating capping line 940 may have a variable thickness in the first horizontal direction (the X direction). Thereafter, the integrated circuit device 900 illustrated in FIGS. 10A through 10C may be manufactured by forming the buried insulating film 970 using the method of forming the buried insulating film 170, which has been described with reference to FIGS. 20A and 20B.

Although methods of manufacturing the integrated circuit device 900 illustrated in FIGS. 10A through 10C has been described, as an example, with reference to FIGS. 25A through 31, it will be understood by those skilled in the art that the integrated circuit devices 900A through 900H illustrated in FIGS. 10D through 10K and other integrated circuit devices having various structures modified and changed therefrom may be manufactured by making various modifications and changes to the methods described with reference to FIGS. 25A through 31, without departing from the scope of the present inventive concept.

In the drawing, two elements that are illustrated to contact each other without an intervening element may directly contact each other.

While the present inventive concept has been particularly shown and described with reference to some example embodiments thereof, it will be understood that various changes in form and details may be made therein without departing from the scope of the inventive concept. Thus, to the maximum extent allowed by law, the scope of the inventive concept is to be determined by the broadest permissible interpretation of following claims and their equivalents and shall not be restricted or limited by the foregoing detailed description.

What is claimed is:

1. An integrated circuit device comprising:
a fin-type active region extending on a substrate in a first horizontal direction;
a gate line extending on the fin-type active region in a second horizontal direction crossing the first horizontal direction;
a source/drain region on the fin-type active region and adjacent to the gate line;
an interlayer insulating film covering the source/drain region;
a source/drain contact hole penetrating the interlayer insulating film toward the source/drain region;
a metal plug in the source/drain contact hole and electrically connected to the source/drain region; and
a conductive barrier film covering a sidewall of the metal plug,
wherein the metal plug includes a lateral expansion portion in an upper portion of the source/drain contact hole and a through portion vertically extending from the lateral expansion portion toward the source/drain region,
wherein a width of the lateral expansion portion in the first horizontal direction is greater than a width of the through portion in the first horizontal direction, and
wherein a topmost surface of the conductive barrier film is closer than a topmost surface of the metal plug to the substrate.

2. The integrated circuit device of claim 1,
wherein a sidewall of the source/drain contact hole has a stepped shape, and the upper portion of the source/drain contact hole is wider than a lower portion of the source/drain contact hole.

3. The integrated circuit device of claim 1,
wherein a portion of the conductive barrier film is on a sidewall of the lateral expansion portion of the metal plug.

4. The integrated circuit device of claim 1,
wherein the topmost surface of the conductive barrier film is under the lateral expansion portion of the metal plug.

5. The integrated circuit device of claim 1, further comprising:
an etch stop film on the interlayer insulating film and on the topmost surface of the metal plug; and
a capping layer between the etch stop film and the topmost surface of the metal plug.

6. The integrated circuit device of claim 1,
wherein the lateral expansion portion of the metal plug includes a rounded corner.

7. The integrated circuit device of claim 1,
wherein the lateral expansion portion of the metal plug includes a double-humped protrusion that bulges in a direction away from the substrate.

8. The integrated circuit device of claim 1, further comprising:
a plurality of channel regions on the fin-type active region,
wherein the plurality of channel regions are spaced apart from each other in a vertical direction, are surrounded by the gate line and are in contact with the source/drain region.

9. The integrated circuit device of claim 1, further comprising:
a contact insulating spacer covering an inner sidewall of the source/drain contact hole.

10. The integrated circuit device of claim 1, further comprising:
a plurality of channel regions on the fin-type active region, wherein the plurality of channel regions are spaced apart from each other in a vertical direction and are in contact with the source/drain region,
wherein the gate line surrounds each of the plurality of channel regions, and wherein the gate line includes a main gate portion extending in the second horizontal direction on the plurality of channel regions, and a plurality of sub gate portions integrally connected to the main gate portion, and at least one of the plurality of sub gate portions is between two channel regions among the plurality of channel regions.

11. The integrated circuit device of claim 10, further comprising:
a plurality of gate insulating films, each of the plurality of gate insulating films extending between the gate line and a respective one of the plurality of channel regions,
wherein the at least one of the plurality of sub gate portions is surrounded by one of the plurality of gate insulating films.

12. An integrated circuit device comprising:
a fin-type active region extending on a substrate in a first horizontal direction;
a plurality of channel regions on the fin-type active region, the plurality of channel regions being spaced apart from each other in a vertical direction;
a gate line extending on the fin-type active region in a second horizontal direction crossing the first horizontal direction;
a gate insulating film between the gate line and the plurality of channel regions;
a source/drain region on the fin-type active region and adjacent to the gate line, the source/drain region being in contact with the plurality of channel regions;
an interlayer insulating film covering the source/drain region;
a source/drain contact hole penetrating the interlayer insulating film toward the source/drain region;
a metal plug vertically extending in the source/drain contact hole, the metal plug being electrically connected to the source/drain region and comprising a first topmost surface; and
a conductive barrier film covering a sidewall of the metal plug in the source/drain contact hole, the conductive barrier film comprising a second topmost surface closer than the first topmost surface to the substrate,
wherein the interlayer insulating film overlaps the source/drain region in the vertical direction.

13. The integrated circuit device of claim 12,
wherein the metal plug includes a lateral expansion portion having a first width in the first horizontal direction and a through portion vertically extending from the lateral expansion portion toward the source/drain region and having a second width smaller than the first width in the first horizontal direction.

14. The integrated circuit device of claim 12,
wherein a sidewall of the source/drain contact hole has a stepped shape, and an upper portion of the source/drain contact hole is wider than a lower portion of the source/drain contact hole.

15. The integrated circuit device of claim 12,
wherein the metal plug includes a lateral expansion portion having a first width in the first horizontal direction and a through portion vertically extending from the lateral expansion portion toward the source/drain region and having a second width smaller than the first width in the first horizontal direction, and
wherein a portion of the conductive barrier film is on a sidewall of the lateral expansion portion of the metal plug.

16. An integrated circuit device comprising:
a fin-type active region extending on a substrate in a first horizontal direction;
a plurality of channel regions on the fin-type active region, the plurality of channel regions being spaced apart from each other in a vertical direction;
a gate line extending on the fin-type active region in a second horizontal direction crossing the first horizontal direction;
a gate insulating film between the gate line and the plurality of channel regions;
a source/drain region on the fin-type active region and adjacent to the gate line, the source/drain region being in contact with the plurality of channel regions;
an interlayer insulating film covering the source/drain region;
a source/drain contact hole penetrating the interlayer insulating film toward the source/drain region;
a metal plug vertically extending in the source/drain contact hole, the metal plug being electrically connected to the source/drain region and comprising a first topmost surface; and
a conductive barrier film covering a sidewall of the metal plug in the source/drain contact hole, the conductive barrier film comprising a second topmost surface closer than the first topmost surface to the substrate,
wherein the metal plug includes a lateral expansion portion having a first width in the first horizontal direction and a through portion vertically extending from the lateral expansion portion toward the source/drain region and having a second width smaller than the first width in the first horizontal direction, and
wherein the second topmost surface of the conductive barrier film is under the lateral expansion portion of the metal plug.

17. The integrated circuit device of claim 12, further comprising:
an etch stop film on the interlayer insulating film and on the first topmost surface of the metal plug; and
a capping layer between the etch stop film and the first topmost surface of the metal plug.

18. The integrated circuit device of claim 12,
wherein the plurality of channel regions are surrounded by the gate line and are in contact with the source/drain region.

19. The integrated circuit device of claim 12, further comprising:
a contact insulating spacer covering an inner sidewall of the source/drain contact hole.

20. The integrated circuit device of claim 13,
wherein the lateral expansion portion of the metal plug includes a double-humped protrusion that bulges in a direction away from the substrate.

21. The integrated circuit device of claim 13,
wherein the lateral expansion portion of the metal plug includes a rounded corner.

22. The integrated circuit device of claim 21,
wherein the gate line includes a main gate portion extending in the second horizontal direction to cover a top surface of an uppermost one of the plurality of channel regions and a plurality of sub gate portions integrally connected to the main gate portion.

23. The integrated circuit device of claim 22,
wherein at least one of the plurality of sub gate portions is between two channel regions among the plurality of channel regions.

* * * * *